(12) United States Patent
Wu et al.

(10) Patent No.: US 11,546,711 B2
(45) Date of Patent: Jan. 3, 2023

(54) PROCESS OF FABRICATING LATERAL MODE CAPACITIVE MICROPHONE

(71) Applicants: Guanghua Wu, Dublin, CA (US); Xingshuo Lan, San Jose, CA (US)

(72) Inventors: Guanghua Wu, Dublin, CA (US); Xingshuo Lan, San Jose, CA (US)

(73) Assignee: GMEMS TECH SHENZHEN LIMITED, Shenzhen (CN)

(*) Notice: Subject to any disclaimer, the term of this patent is extended or adjusted under 35 U.S.C. 154(b) by 191 days.

(21) Appl. No.: 17/008,638

(22) Filed: Sep. 1, 2020

(65) Prior Publication Data
US 2021/0058727 A1 Feb. 25, 2021

Related U.S. Application Data

(60) Division of application No. 15/730,732, filed on Oct. 12, 2017, now Pat. No. 10,798,508, which is a continuation-in-part of application No. 15/623,339, filed on Jun. 14, 2017, now Pat. No. 10,244,330, which is a continuation-in-part of application No. 15/393,831, filed on Dec. 29, 2016, now Pat. No. 10,171,917.

(51) Int. Cl.
*H04R 31/00* (2006.01)
*B81B 3/00* (2006.01)
*H04R 19/00* (2006.01)
*H02N 2/02* (2006.01)
*B81C 1/00* (2006.01)
*H04R 19/04* (2006.01)

(52) U.S. Cl.
CPC ........... *H04R 31/00* (2013.01); *B81B 3/0021* (2013.01); *B81C 1/00158* (2013.01); *H02N 2/02* (2013.01); *H04R 19/005* (2013.01); *H04R 19/04* (2013.01); *H04R 2201/003* (2013.01); *H04R 2410/03* (2013.01)

(58) Field of Classification Search
CPC H04R 19/04; H04R 19/005; H04R 2201/003; H04R 2410/03; H04R 31/00; B81B 3/0021; B81C 1/00158; H02N 2/02
See application file for complete search history.

(56) References Cited

U.S. PATENT DOCUMENTS 4,403,163 A * 9/1983 Armerding .............. H02K 3/40
310/201
10,273,150 B2 * 4/2019 Sun ........................ H04R 31/00
(Continued)

*Primary Examiner* — S M Sohel Imtiaz
(74) *Attorney, Agent, or Firm* — George Guosheng Wang; Upstream Research and Patent LLC

(57) ABSTRACT

The present invention provides a process of fabricating a capacitive microphone such as a MEMS microphone. In the process, one electrically conductive layer is deposited on a removable layer, and then divided or cut into two divided layers, both of which remain in contact with the removable layer as they were. One of the two divided layers will become or include a movable or deflectable membrane/diaphragm that moves in a lateral manner relative to another layer, instead of moving toward/from another layer. A motional sensor is optionally fabricated within the microphone to estimate the noise introduced from acceleration or vibration of the microphone for the purpose of compensating the microphone output through a signal subtraction operation.

17 Claims, 70 Drawing Sheets

(56) References Cited

U.S. PATENT DOCUMENTS

| | | | | |
|---|---|---|---|---|
| 2003/0094047 A1* | 5/2003 | Torkkeli | ............... | G01L 9/0073 |
| | | | | 73/716 |
| 2007/0284682 A1* | 12/2007 | Laming | ............... | H04R 19/005 |
| | | | | 257/E21.526 |
| 2008/0226217 A1* | 9/2008 | Kilic | .................... | G01H 9/004 |
| | | | | 385/12 |
| 2008/0247573 A1* | 10/2008 | Pedersen | ............. | H04R 19/005 |
| | | | | 381/174 |
| 2012/0213400 A1* | 8/2012 | Kasai | .................... | H04R 19/04 |
| | | | | 381/369 |
| 2014/0264662 A1* | 9/2014 | Cheng | ..................... | B81B 7/02 |
| | | | | 257/419 |
| 2015/0274506 A1* | 10/2015 | Feyh | .................. | B81C 1/00301 |
| | | | | 257/416 |
| 2016/0037266 A1* | 2/2016 | Uchida | ................... | H04R 7/06 |
| | | | | 381/174 |
| 2016/0130137 A1* | 5/2016 | Huang | .................... | B81B 7/02 |
| | | | | 438/51 |
| 2016/0167946 A1* | 6/2016 | Jenkins | ............... | H04R 19/005 |
| | | | | 257/416 |
| 2017/0166437 A1* | 6/2017 | Klein | ................... | H04R 19/005 |
| 2017/0265009 A1* | 9/2017 | Sridharan | ................ | H04R 7/26 |
| 2018/0086624 A1* | 3/2018 | Cheng | ................... | B81B 3/007 |
| 2018/0359571 A1* | 12/2018 | Zhan | .................. | B81C 1/00158 |

* cited by examiner

Step 1, Top View along Z axis

Step 1, Cross Section View along Plane A1-A2

Step 2, Top View along Z axis

Step 2, Cross Section View along Plane A1-A2

Step 3, Top View along Z axis

Step 3, Cross Section View along Plane A1-A2

Step 4, Top View along Z axis

Step 4, Cross Section View along Plane A1-A2

Step 5, Top View along Z axis

Step 5, Cross Section View along Plane A1-A2

Step 6, Top View along Z axis

Step 6, Cross Section View along Plane A1-A2

Step 7, Top View along Z axis

Step 7, Cross Section View along Plane A1-A2

Step 8, Top View along Z axis

Step 8, Cross Section View along Plane A1-A2

Step 9, Top View along Z axis

Step 9, Cross Section View along Plane A1-A2

Step 10, Top View along Z axis

Step 10, Cross Section View along Planes B1-B2-B3

Step 10, Cross Section View along Plane A1-A2

Step 11, Top View along Z axis

Step 11, Cross Section View along Planes B1-B2-B3

Step 11, Cross Section View along Plane A1-A2

Step 12, Top View along Z axis

Step 12, Cross Section View along Planes B1-B2-B3

Step 12, Cross Section View along Plane A1-A2

Step 13, Top View along Z axis

Step 13, Cross Section View along Planes B1-B2-B3

Step 13, Cross Section View along Plane A1-A2

Step 14, Top View along Z axis

Step 14, Cross Section View along Planes B1-B2-B3

Step 14, Cross Section View along Plane A1-A2

Step 15, Top View along Z axis

Step 15, Cross Section View along Planes B1-B2-B3

Step 15, Cross Section View along Plane A1-A2

Step 16, Top View along Z axis

Step 16, Cross Section View along Planes B1-B2-B3

Step 16, Cross Section View along Plane A1-A2

Step 16b, Top View along Z axis

Step 16b, Cross Section View along Planes B1-B2-B3

Step 16b, Cross Section View along Plane A1-A2

Step 17, Top View along Z axis

Step 17, Cross Section View along Planes B1-B2-B3

Step 17, Cross Section View along Plane A1-A2

Step 17b, Top View along Z axis

Step 17b, Cross Section View along Planes B1-B2-B3

Step 17b, Cross Section View along Plane A1-A2

Step 18, Top View along Z axis

Step 18, Cross Section View along Planes B1-B2-B3

Step 18, Cross Section View along Plane A1-A2

Step 18b, Top View along Z axis

Step 18b, Cross Section View along Planes B1-B2-B3

Step 18b, Cross Section View along Plane A1-A2

Step 19, Top View along Z axis

Step 19, Cross Section View along Planes B1-B2-B3

Step 19, Cross Section View along Plane A1-A2

Step 19b, Top View along Z axis

Step 19b, Cross Section View along Planes B1-B2-B3

Step 19b, Cross Section View along Plane A1-A2

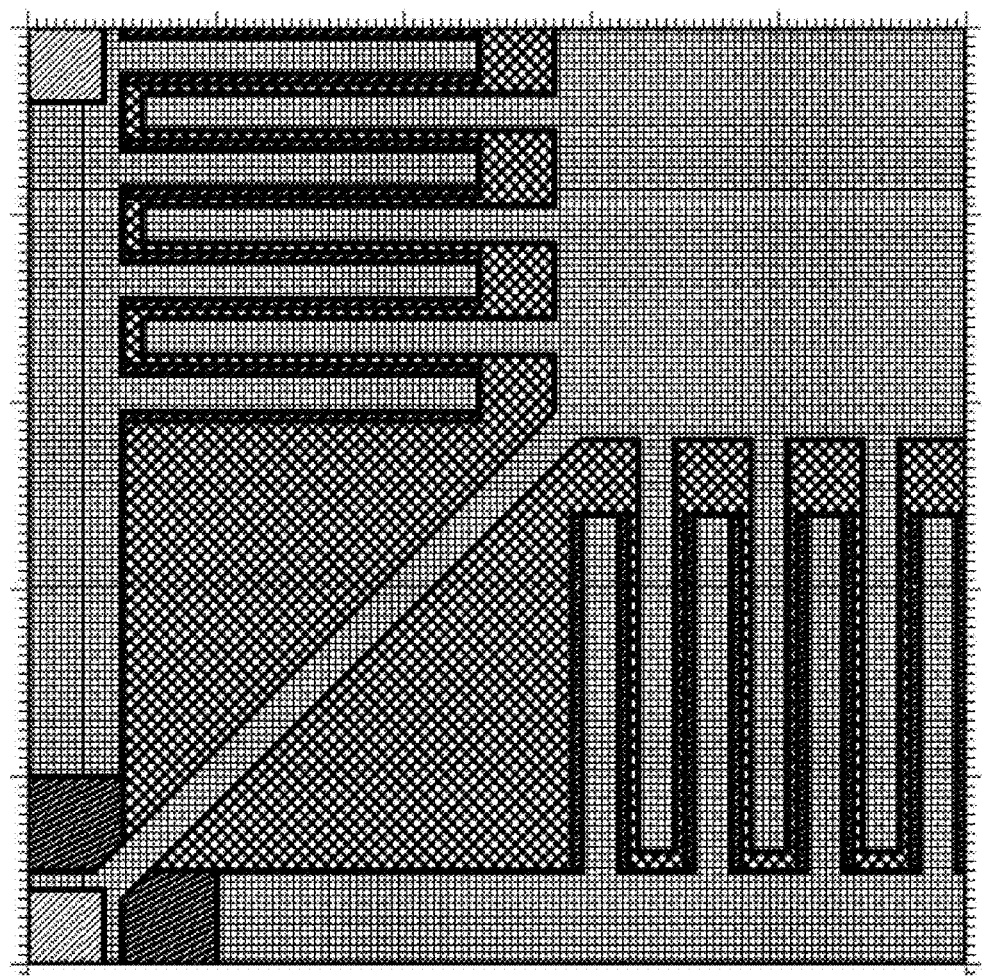
Step 20, Top View along Z axis
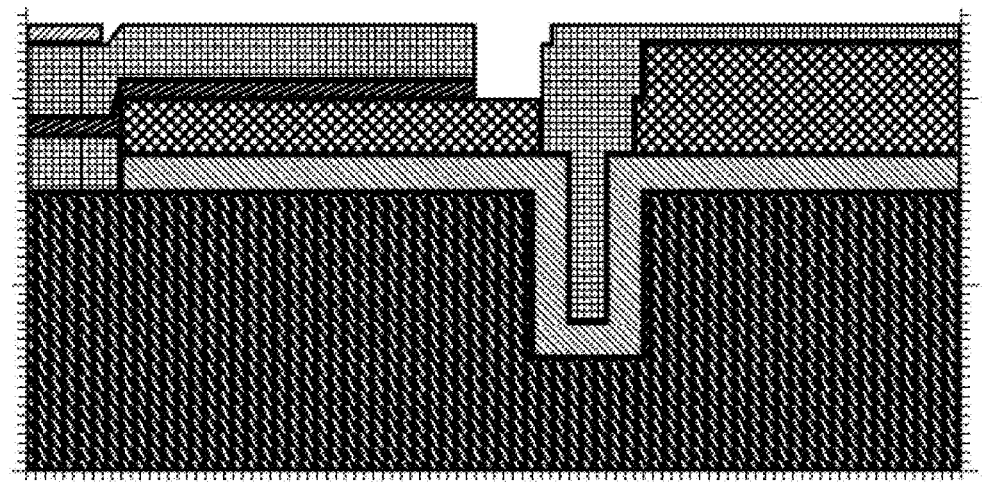
Step 20, Cross Section View along Plane A1-A2
Figure 33A1

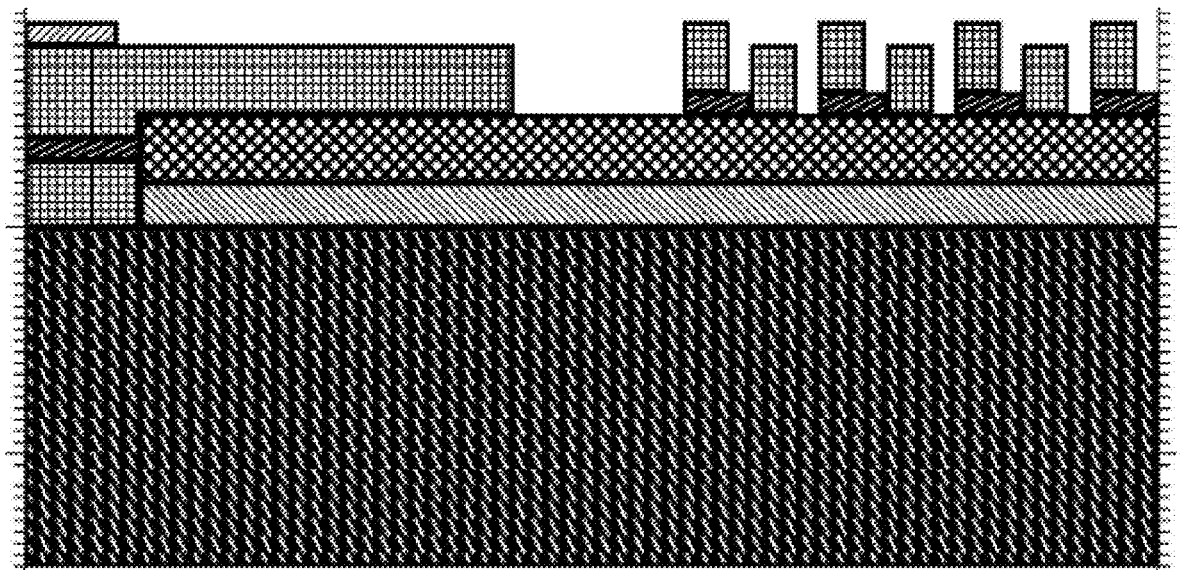
Step 20, Cross Section View along Planes B1-B2-B3
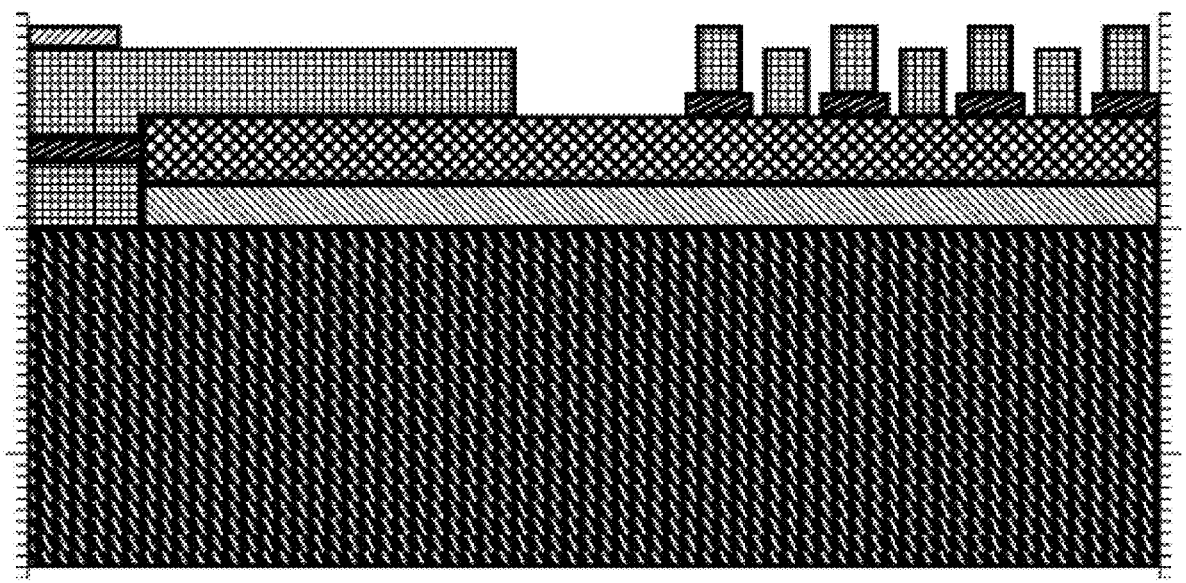
Step 20, Cross Section View along Planes B1-B2-B3
Figure 33A2

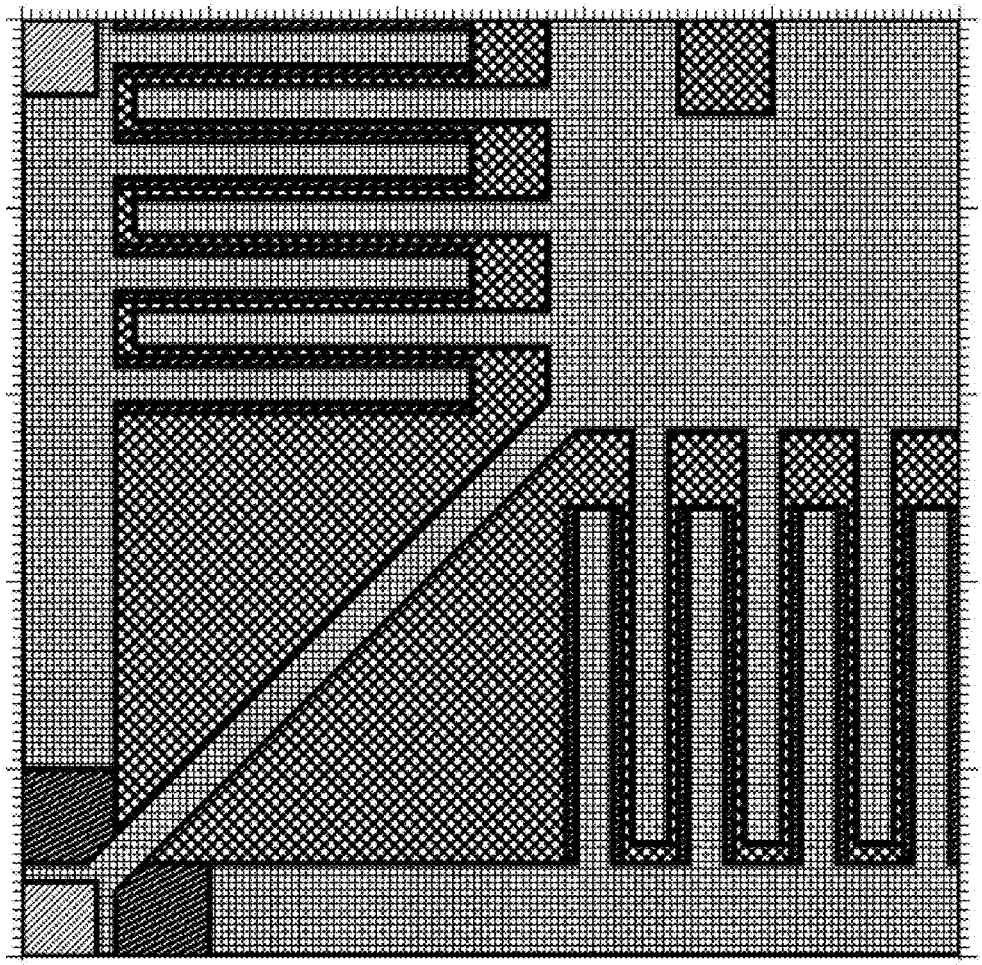
Step 20b, Top View along Z axis
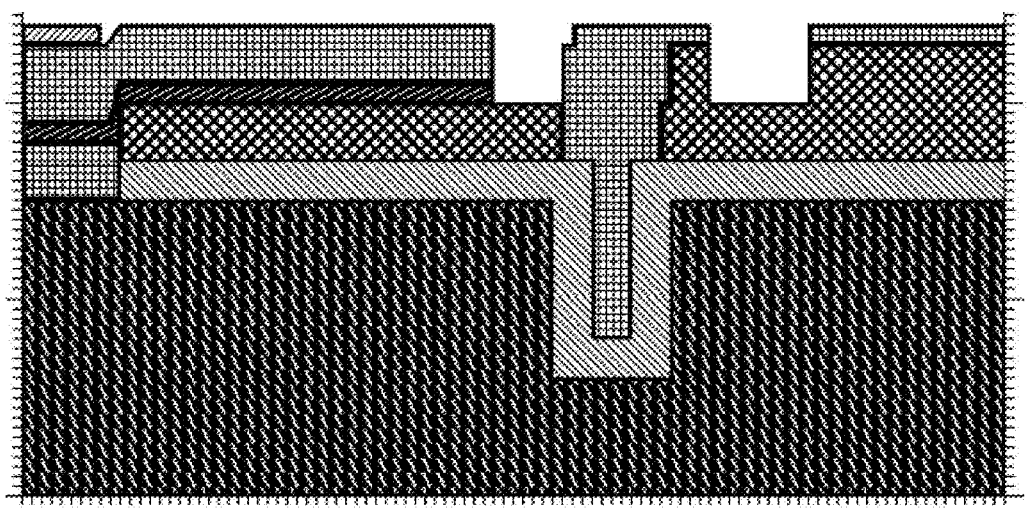
Step 20b, Cross Section View along Plane A1-A2
Figure 33B1

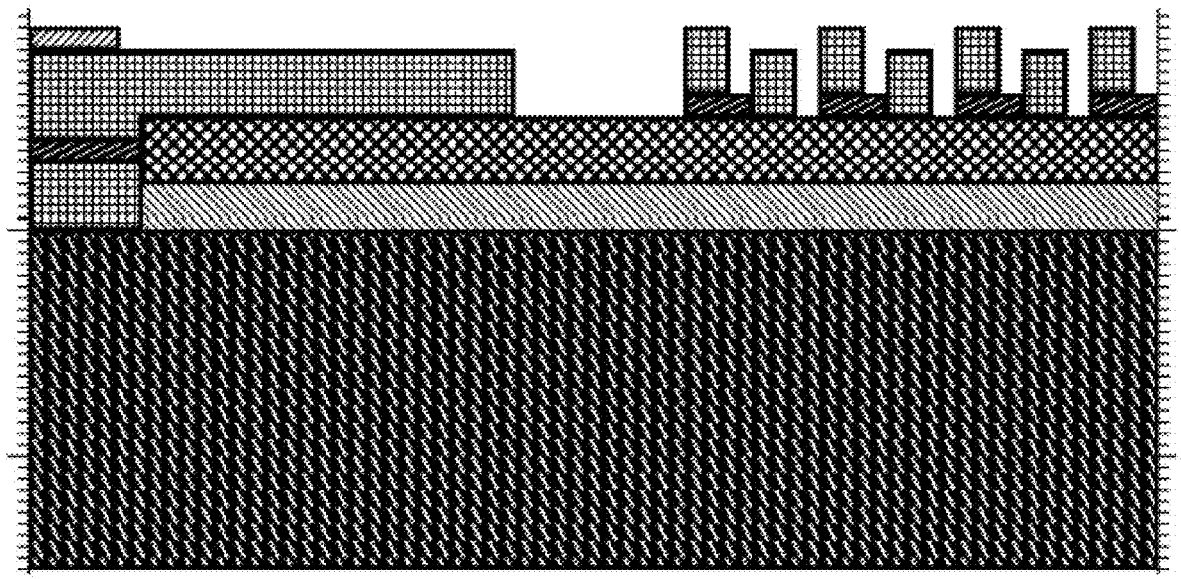
Step 20b, Cross Section View along Planes B1-B2-B3
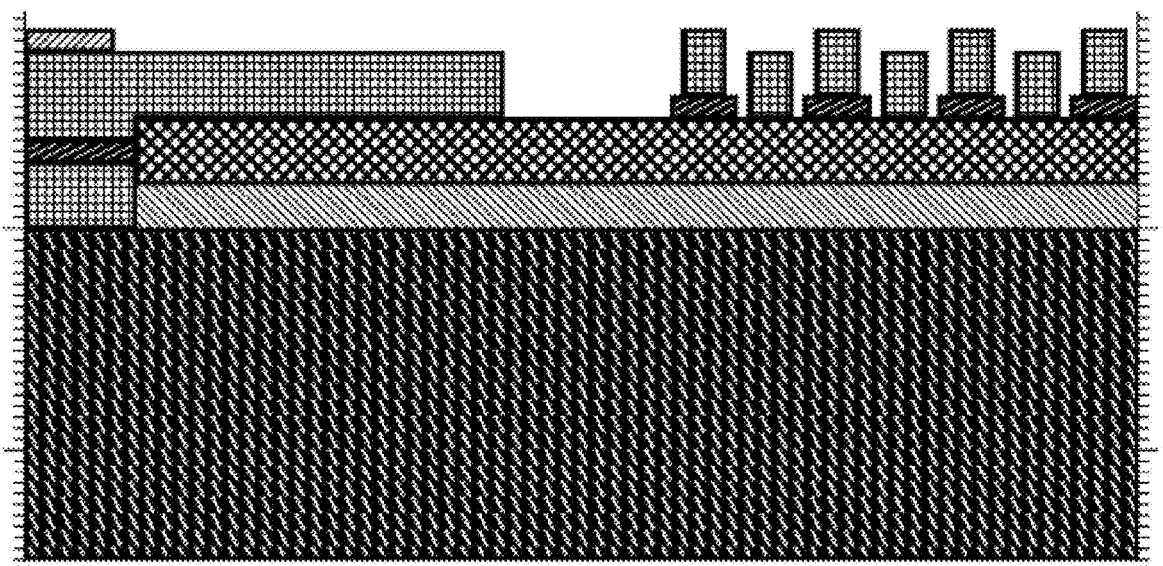
Step 20b, Cross Section View along Planes B1-B2-B3
Figure 33B2

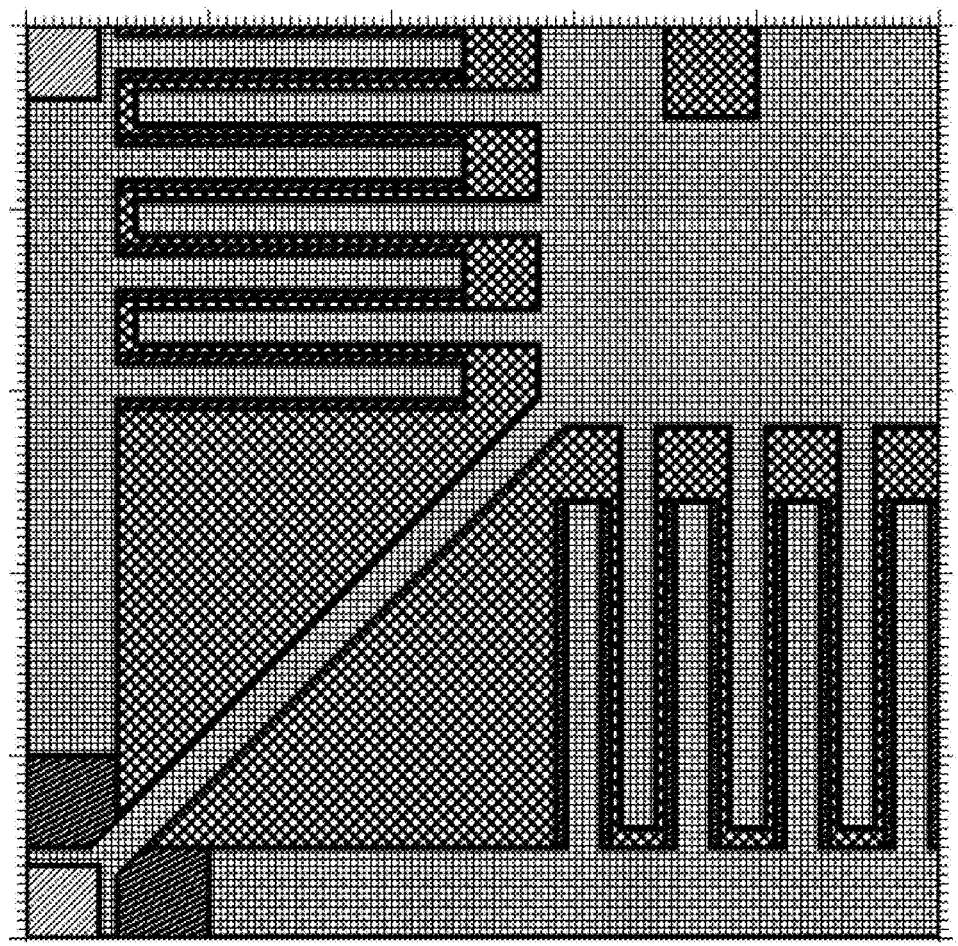
Step 20c, Top View along Z axis
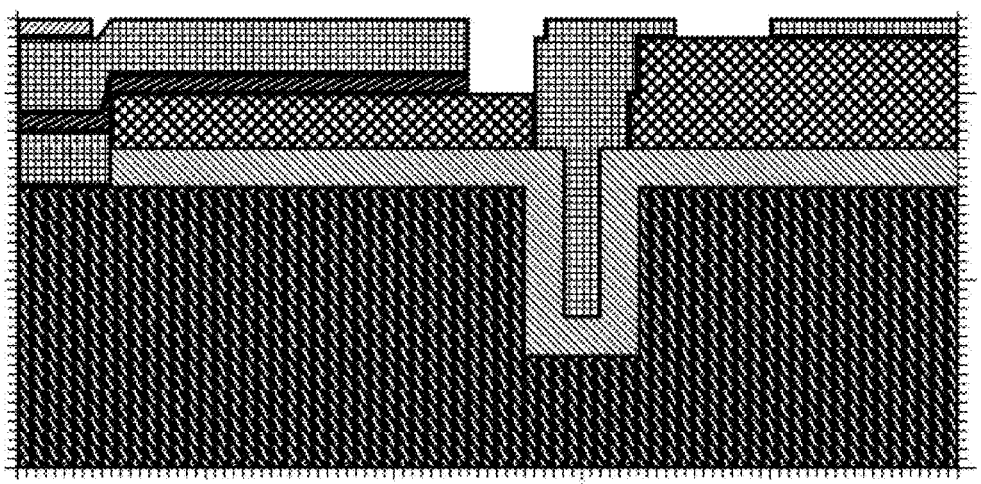
Step 20c, Cross Section View along Plane A1-A2
Figure 33C1

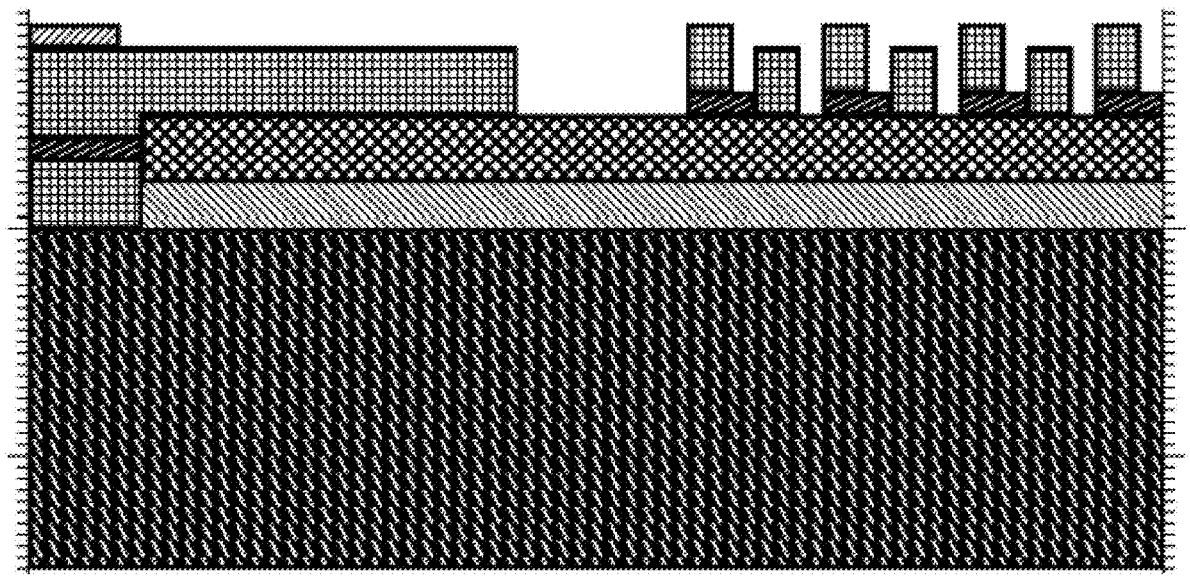
Step 20c, Cross Section View along Planes B1-B2-B3
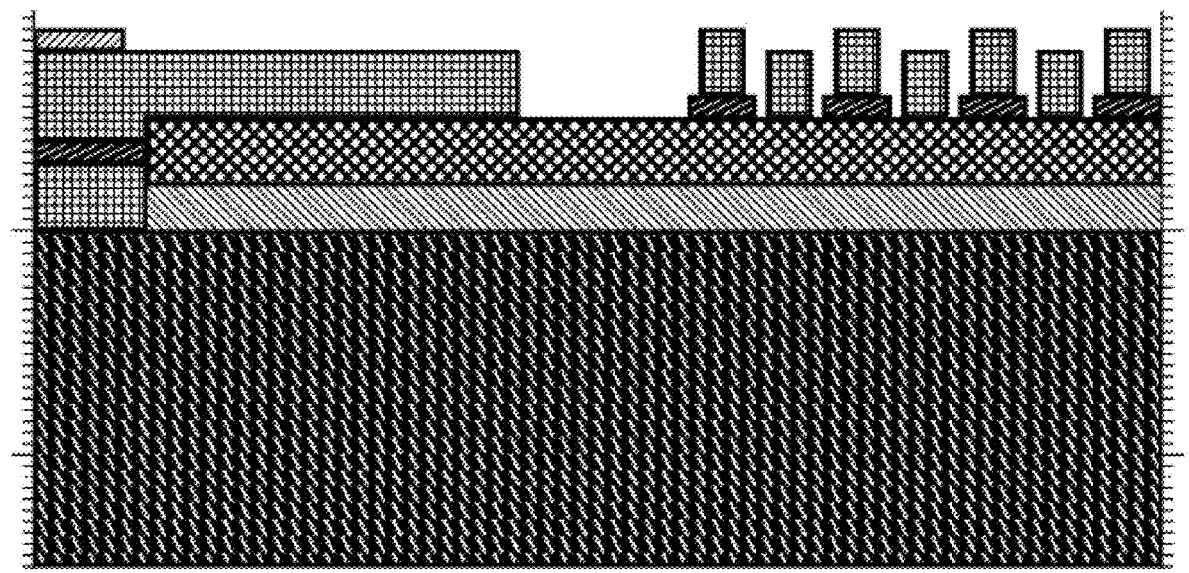
Step 20c, Cross Section View along Planes B1-B2-B3
Figure 33C2

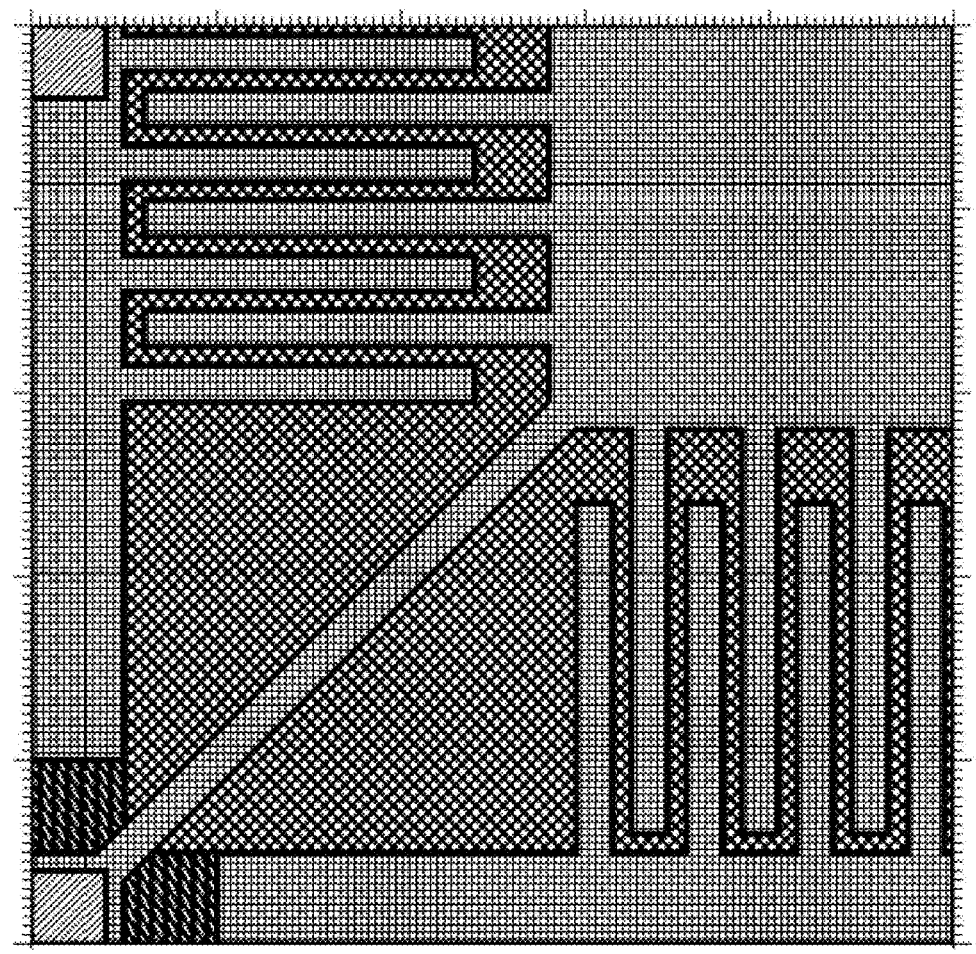
Step 21, Top View along Z axis
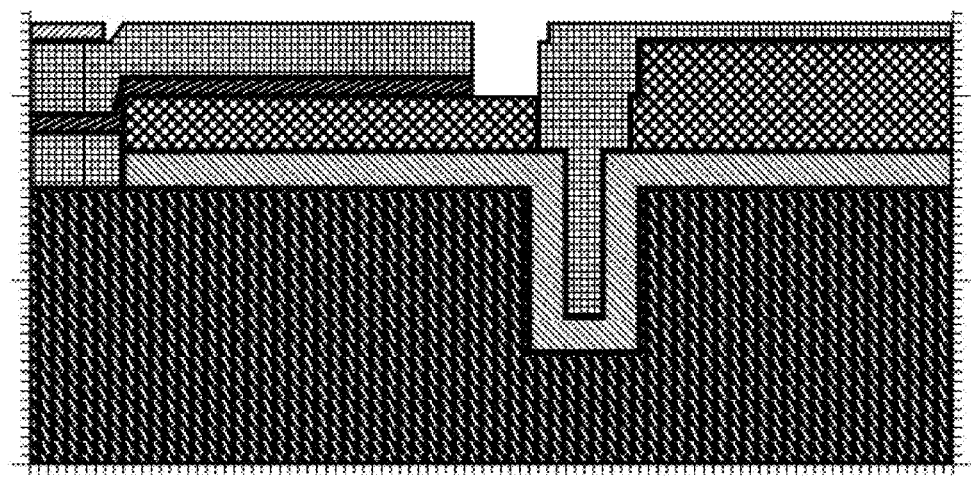
Step 21, Cross Section View along Plane A1-A2
Figure 34A1

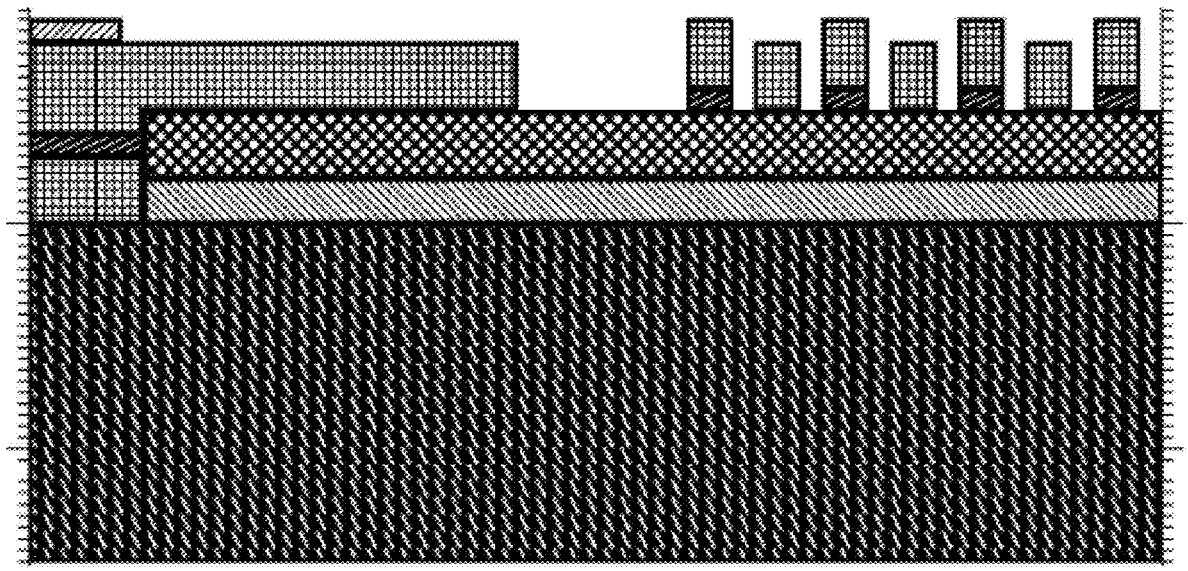
Step 21, Cross Section View along Planes B1-B2-B3
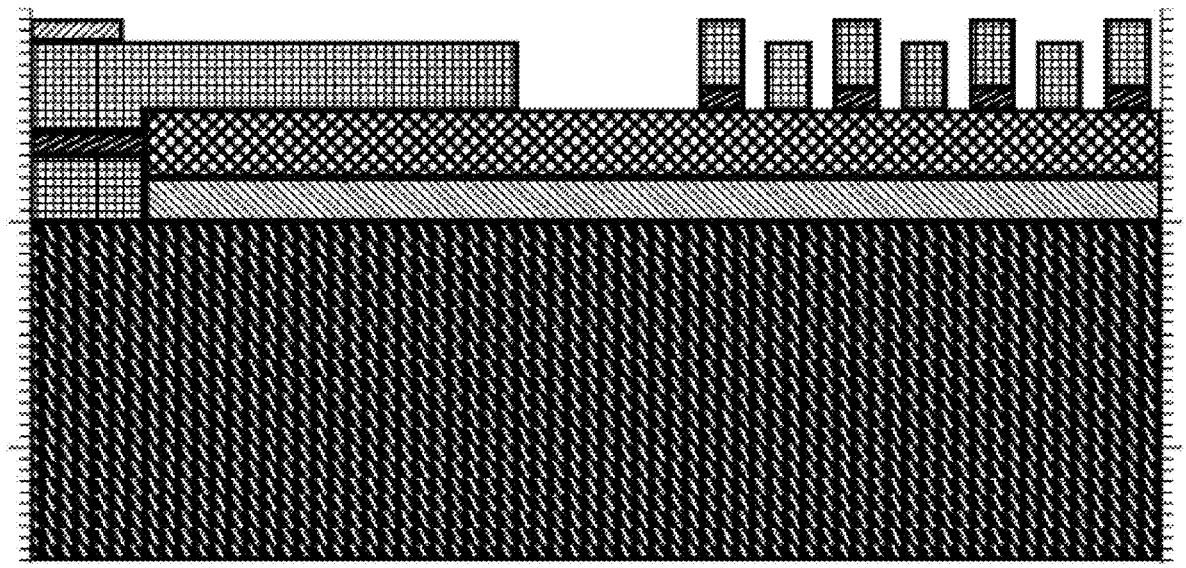
Step 21, Cross Section View along Planes B1-B2-B3
Figure 34A2

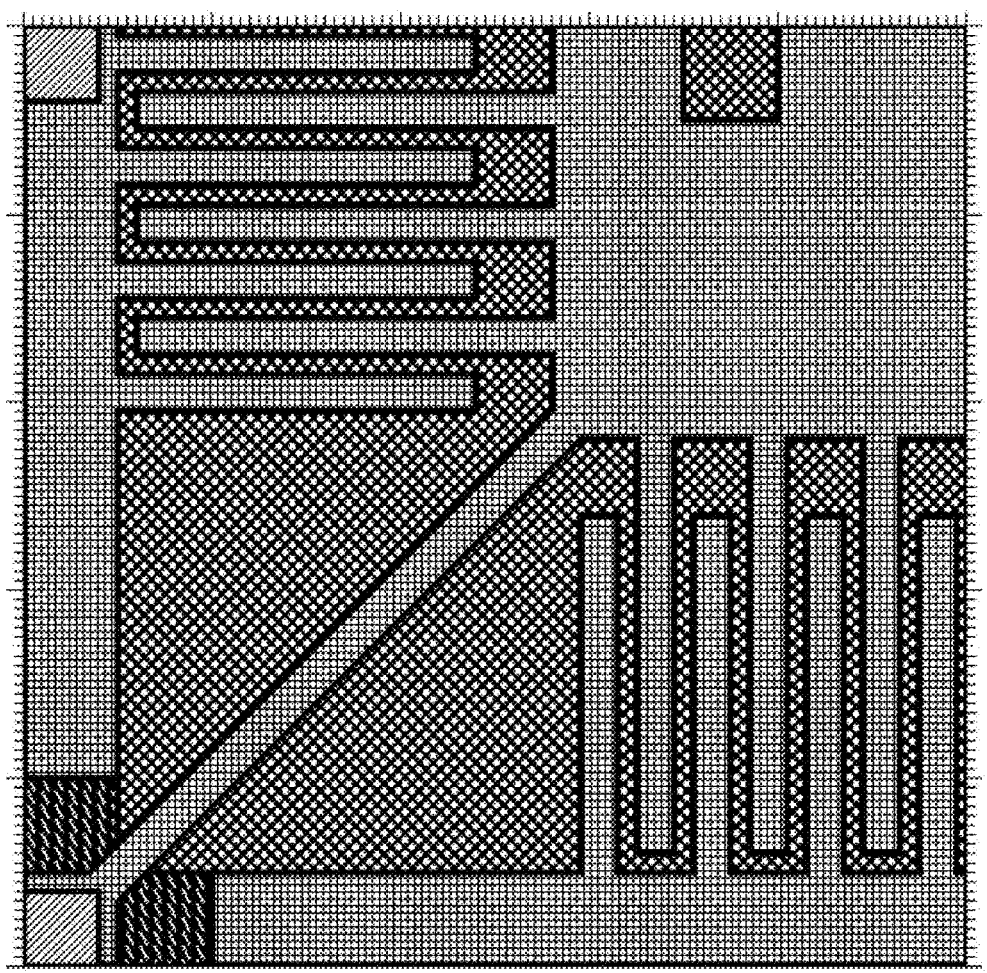
Step 21b, Top View along Z axis
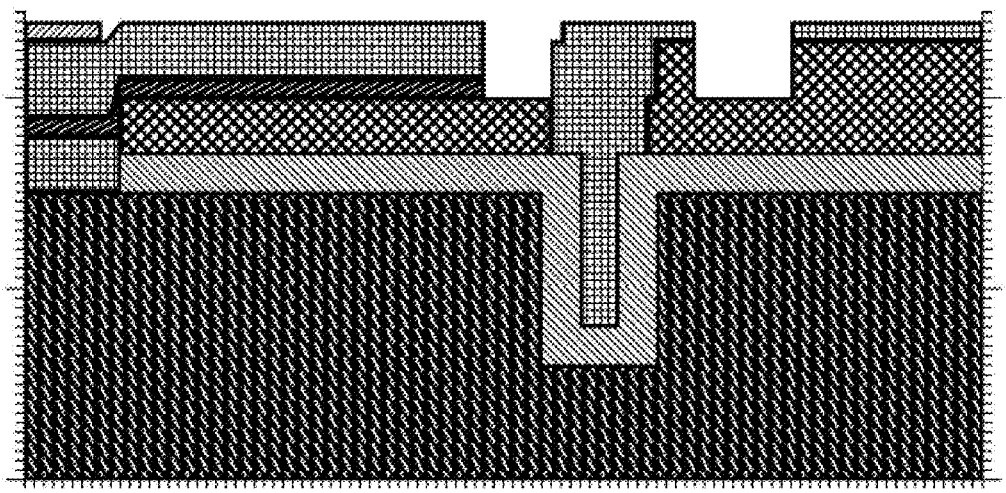
Step 21b, Cross Section View along Plane A1-A2
Figure 34B1

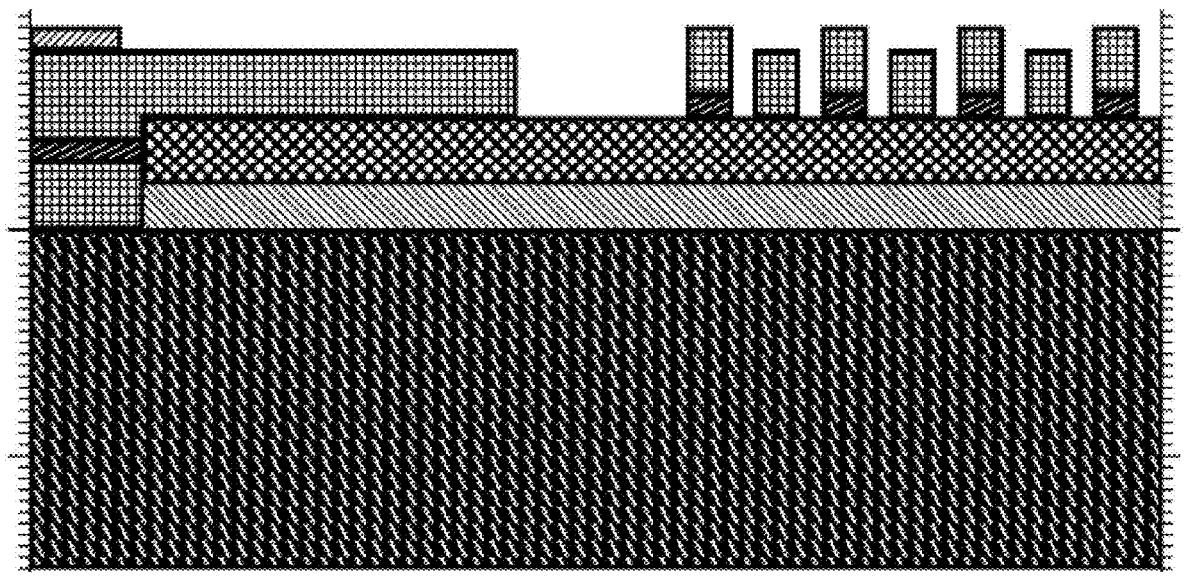
Step 21b, Cross Section View along Planes B1-B2-B3
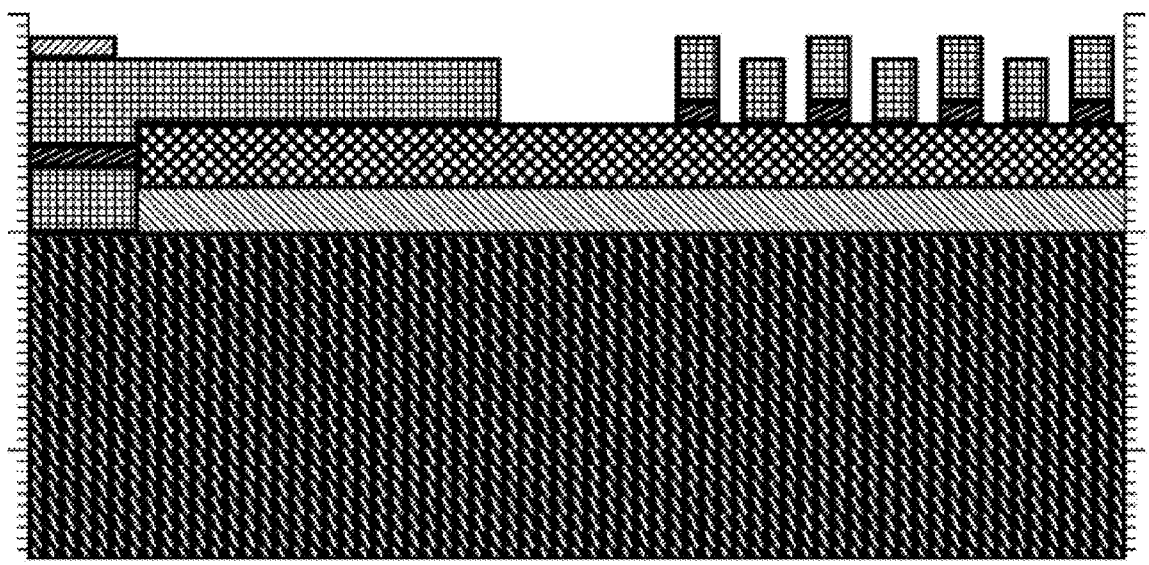
Step 21b, Cross Section View along Planes B1-B2-B3
Figure 34B2

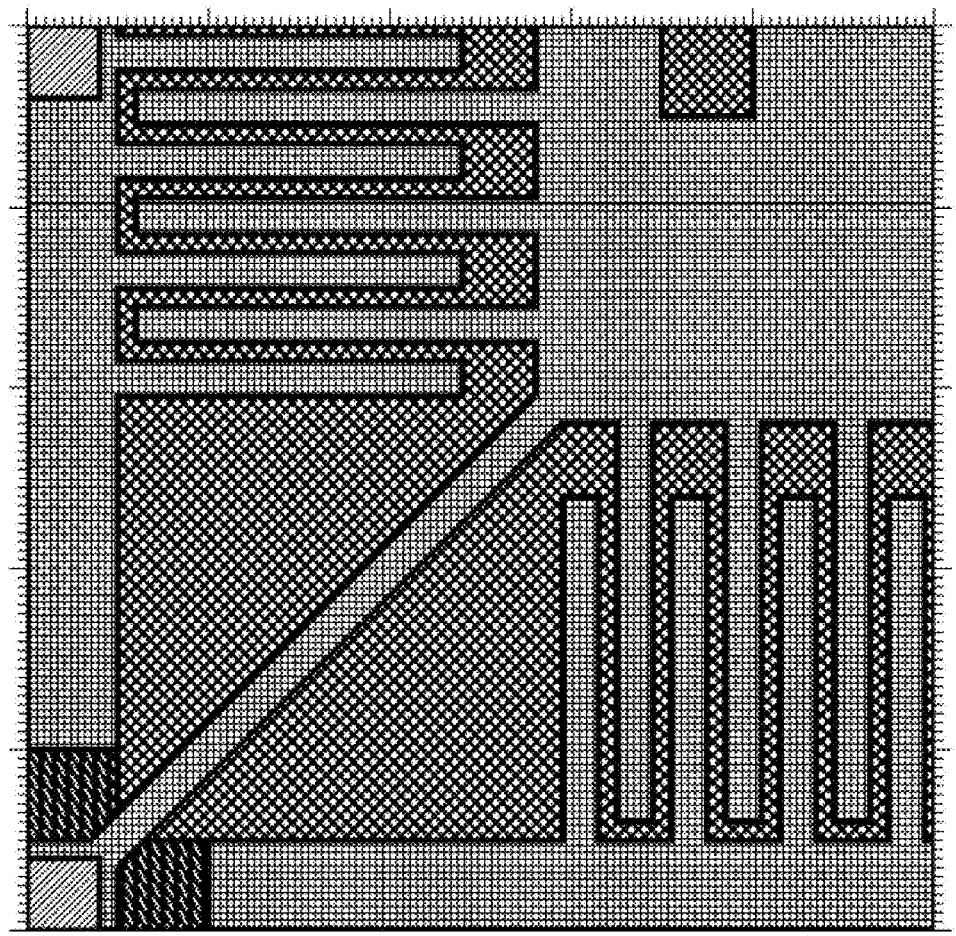
Step 21c, Top View along Z axis
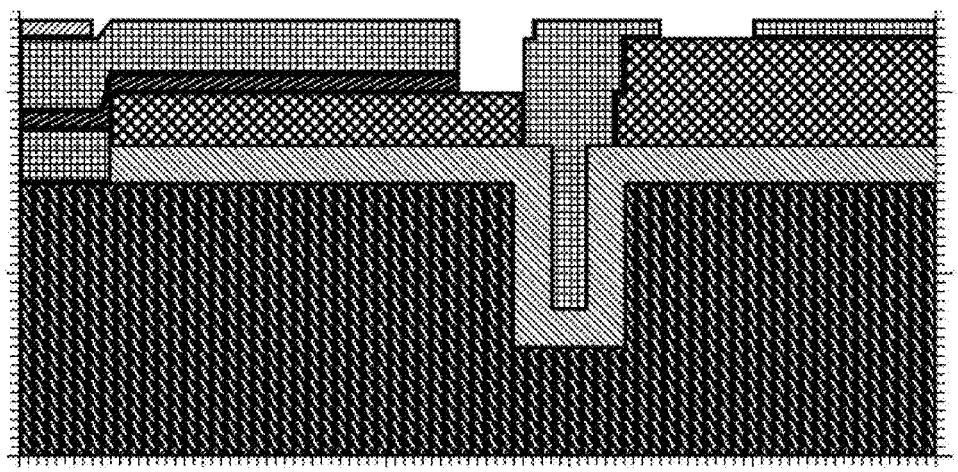
Step 21c, Cross Section View along Plane A1-A2
Figure 34C1

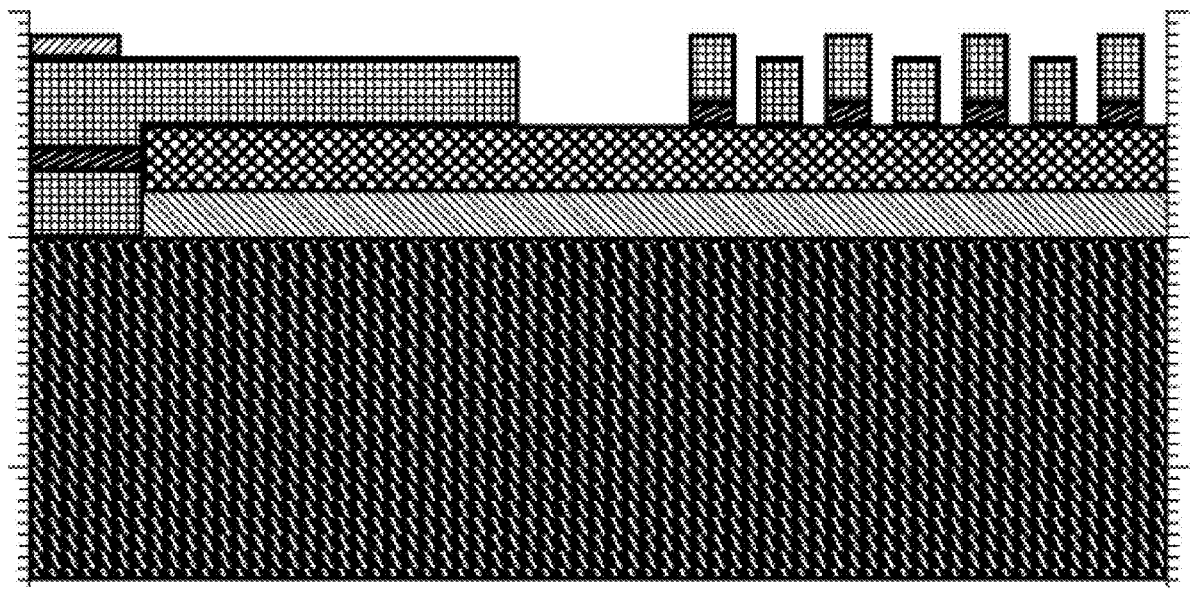
Step 21c, Cross Section View along Planes B1-B2-B3
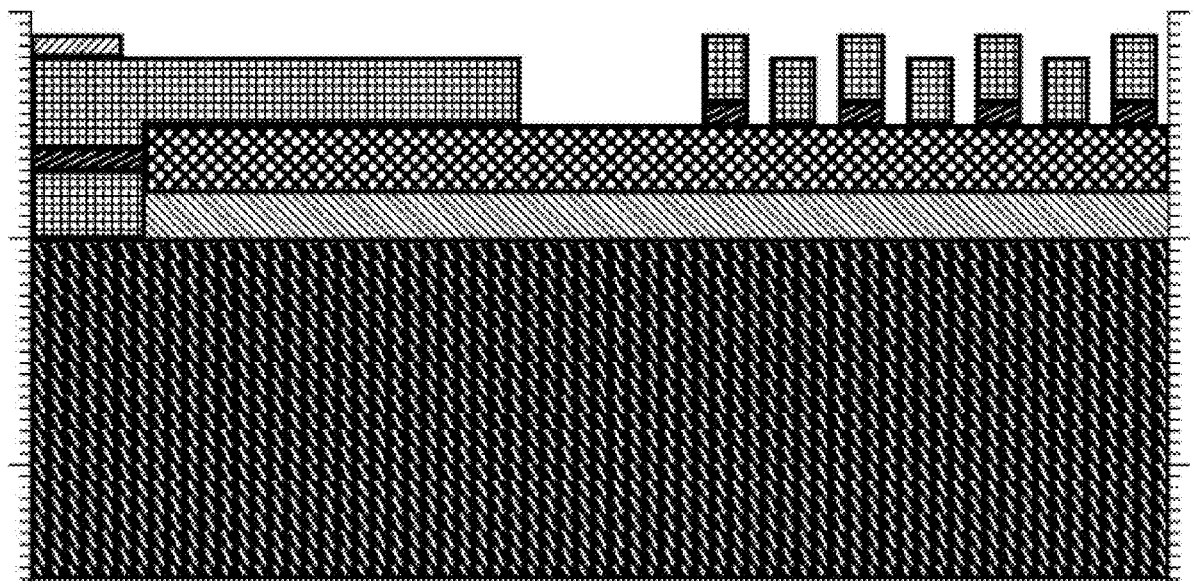
Step 21c, Cross Section View along Planes B1-B2-B3
Figure 34C2

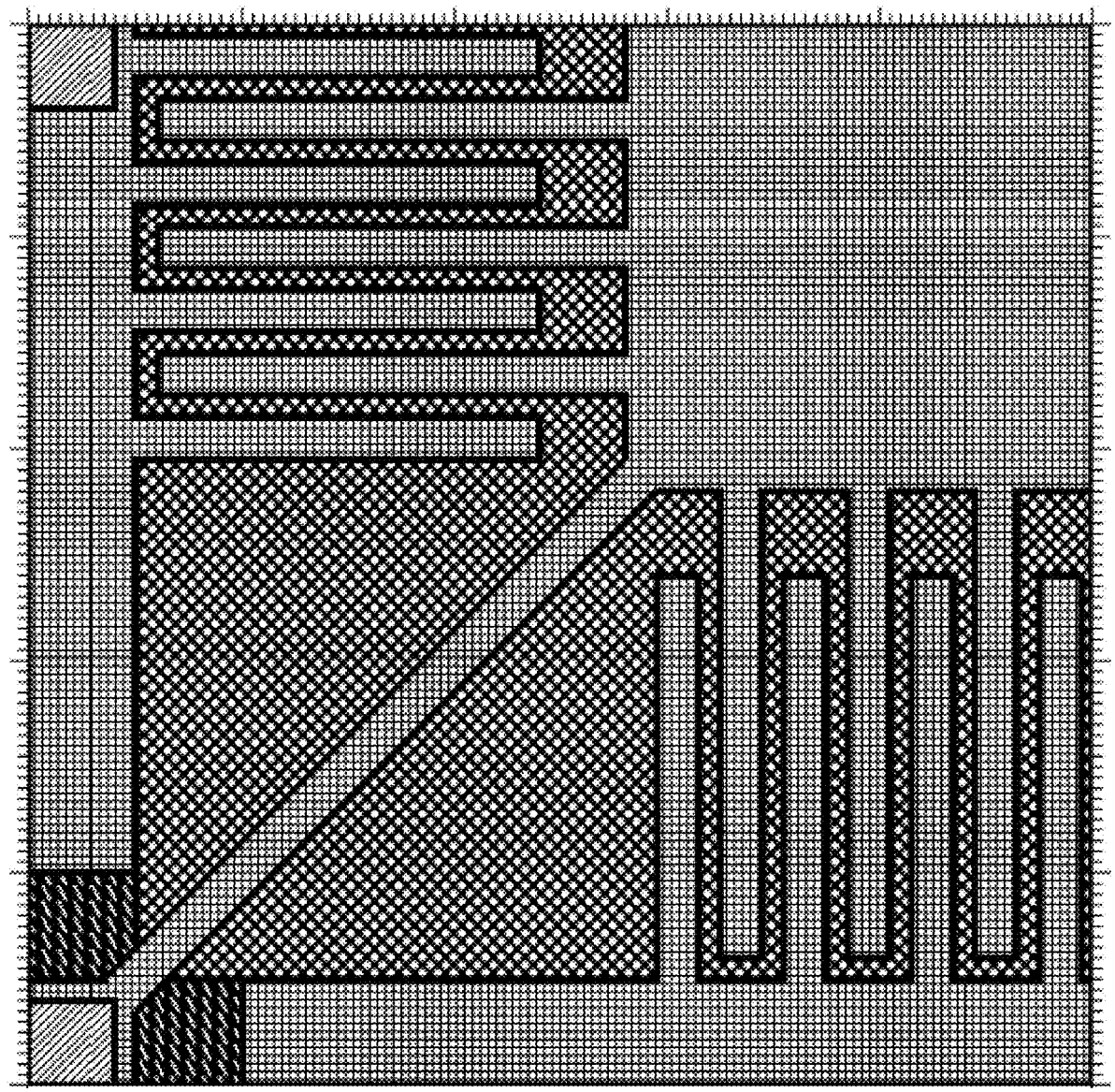
Step 22, Top View along Z axis
Figure 35A1

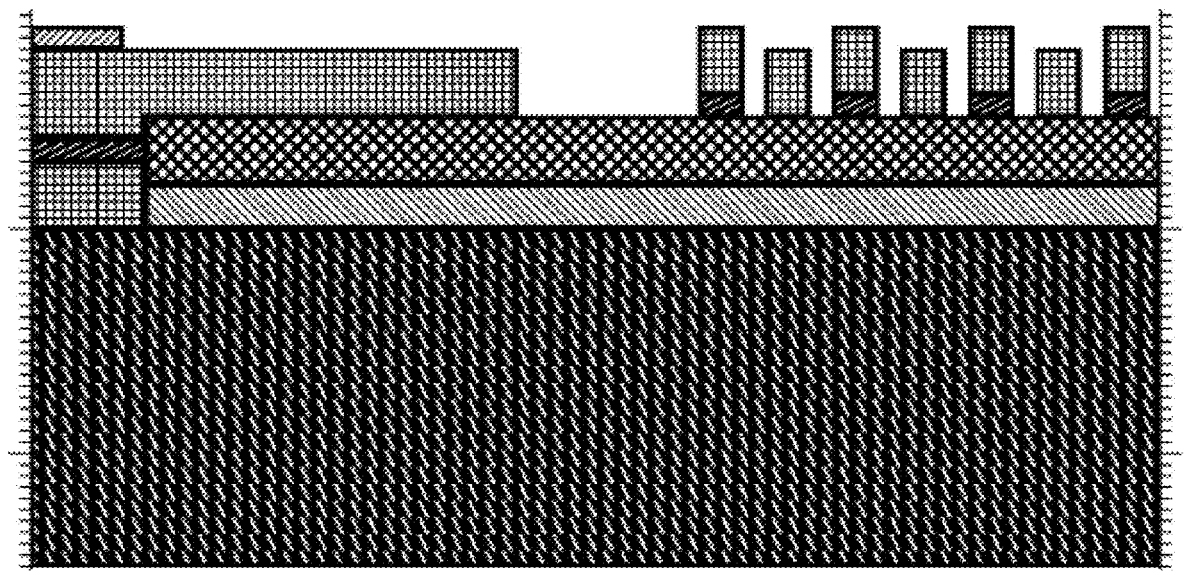
Step 22, Cross Section View along Planes B1-B2-B3
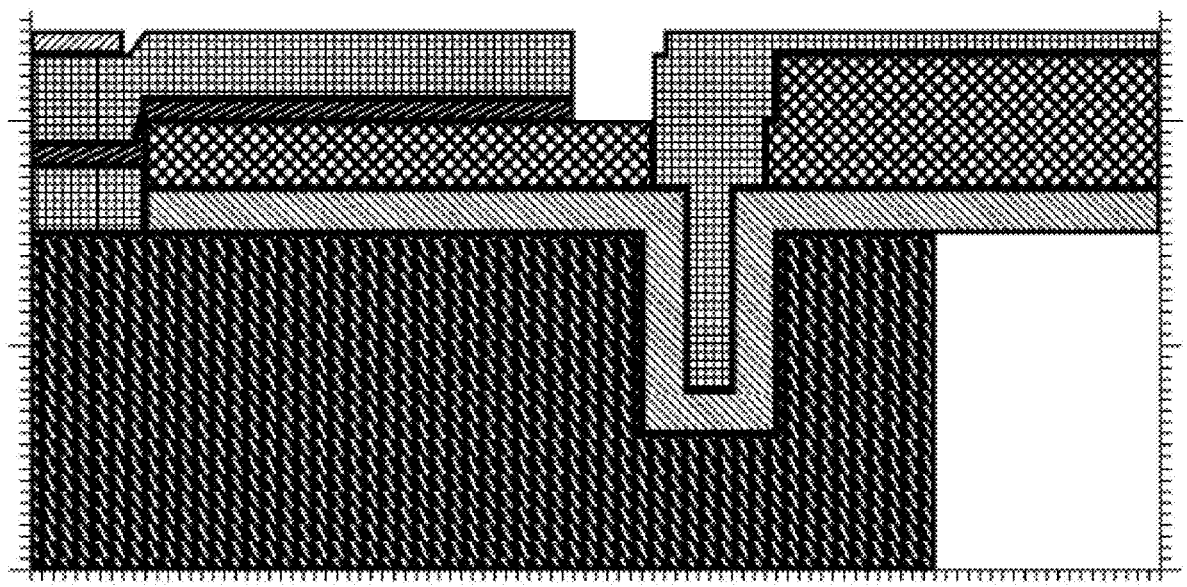
Step 22, Cross Section View along Plane A1-A2
Figure 35A2

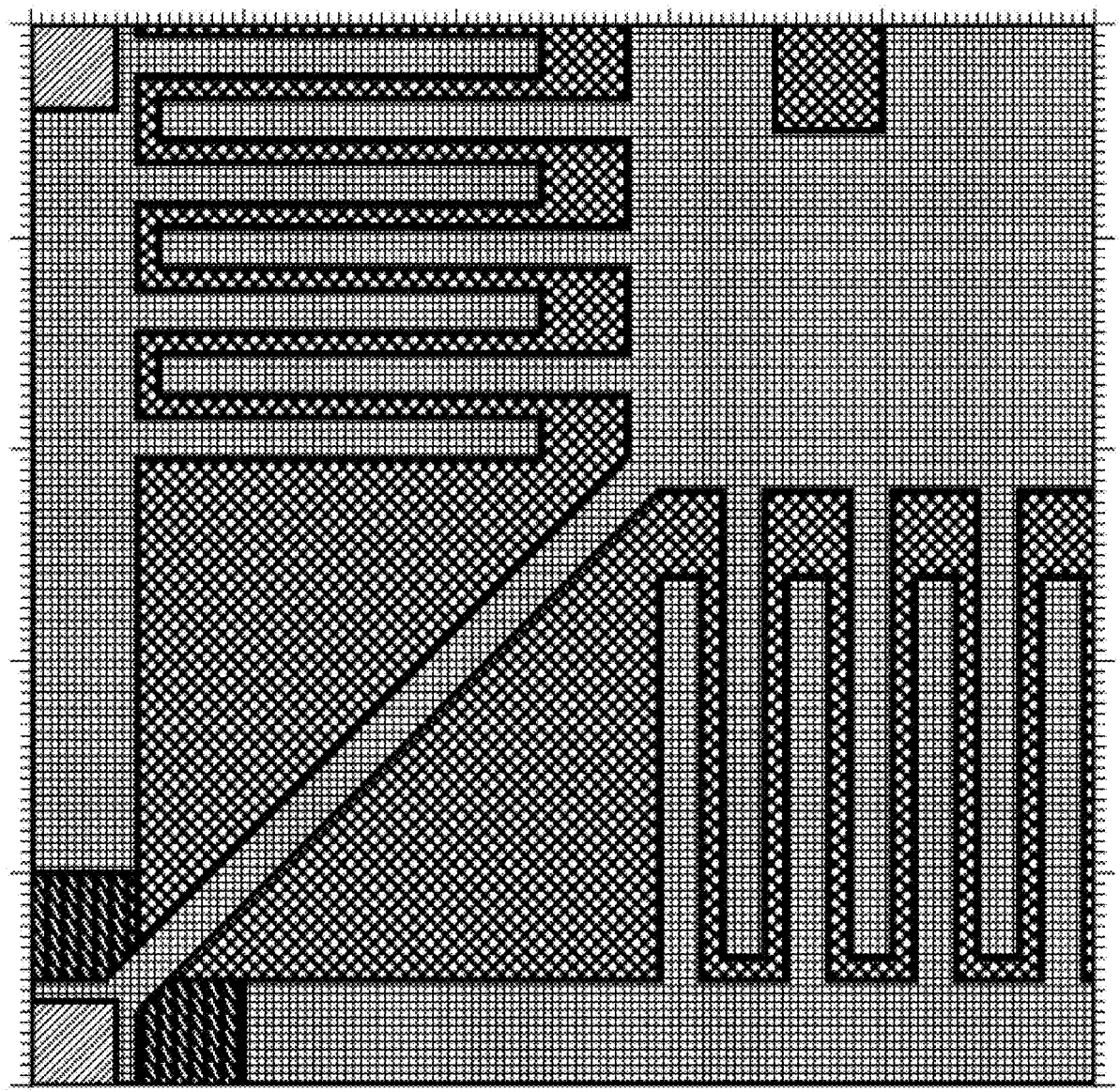
Step 22b, Top View along Z axis
Figure 35B1

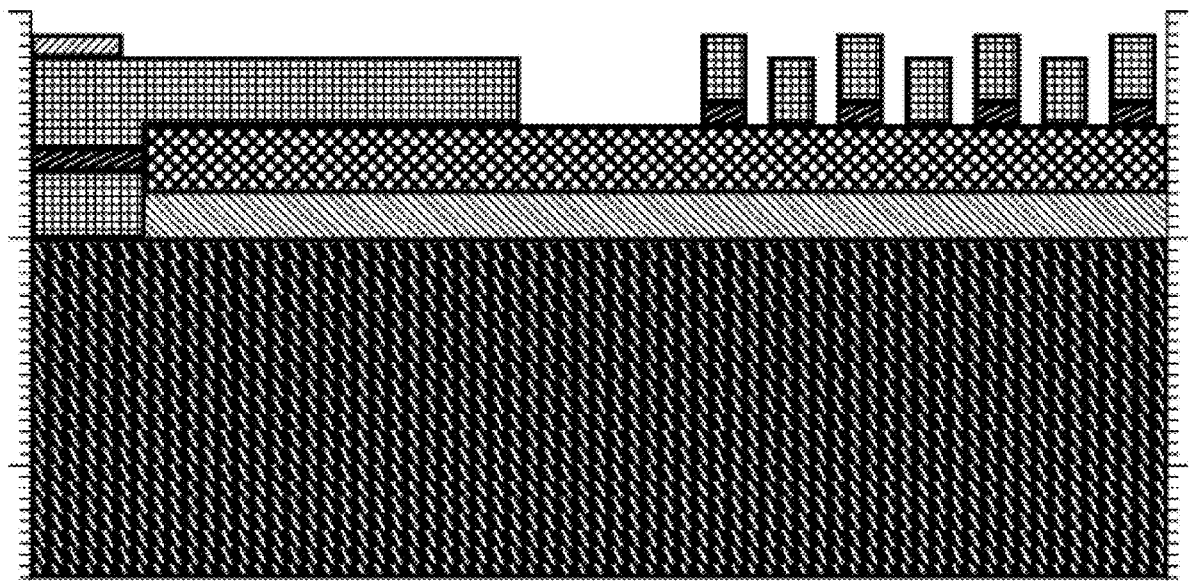
Step 22b, Cross Section View along Planes B1-B2-B3
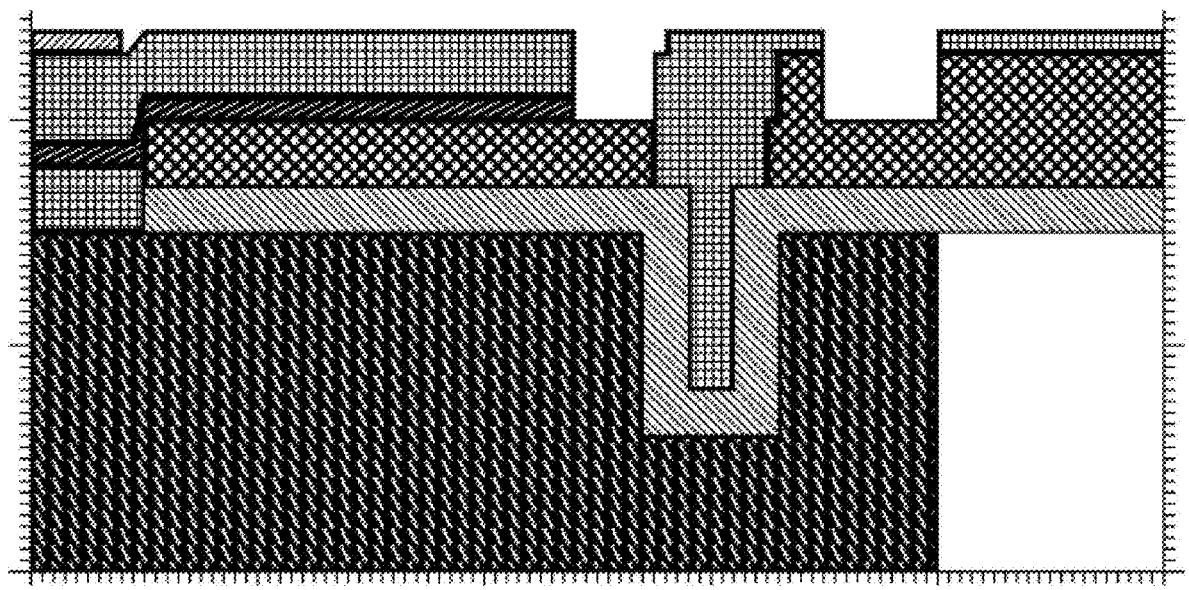
Step 22b, Cross Section View along Plane A1-A2
Figure 35B2

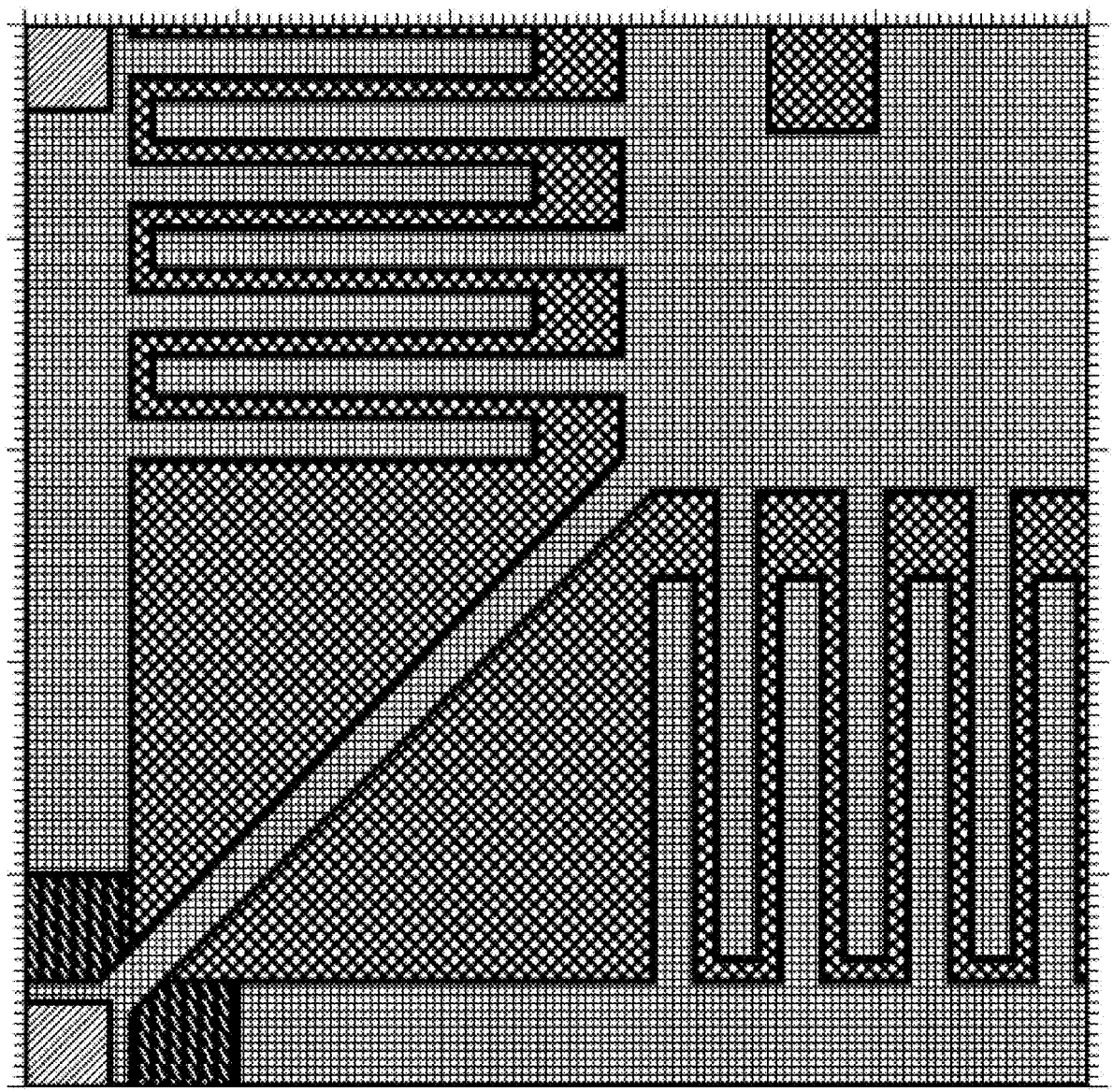
Step 22c, Top View along Z axis
Figure 35C1

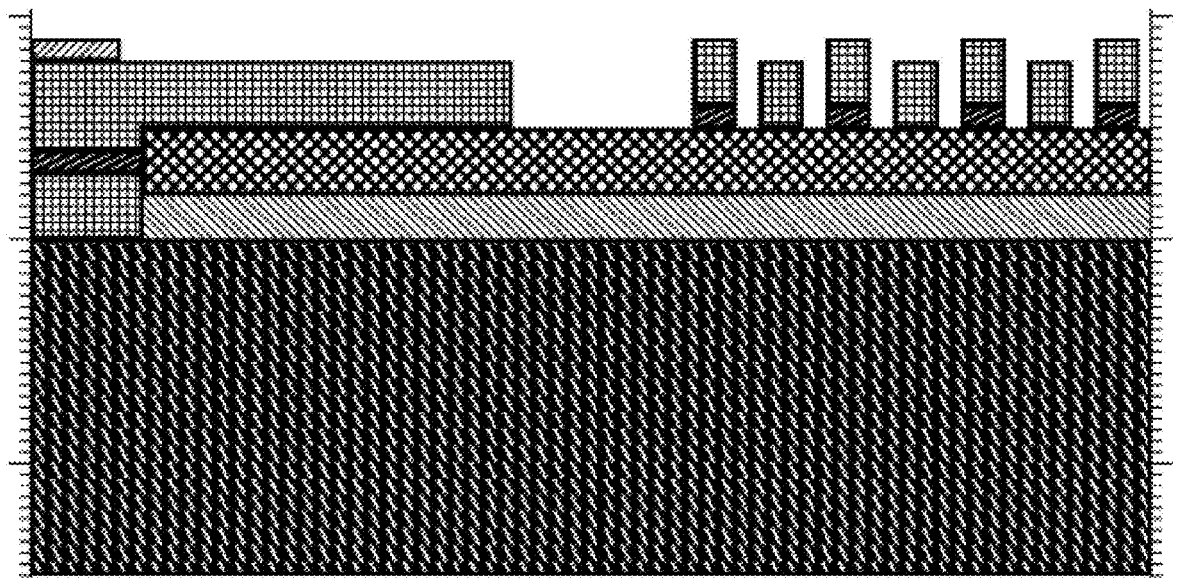
Step 22c, Cross Section View along Planes B1-B2-B3
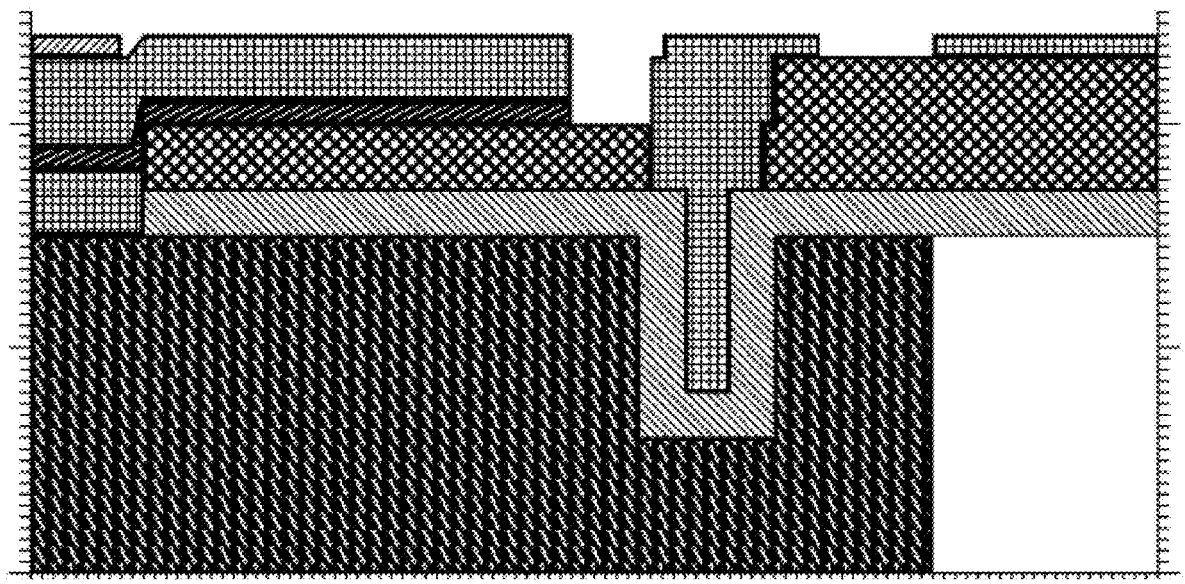
Step 22c, Cross Section View along Plane A1-A2
Figure 35C2

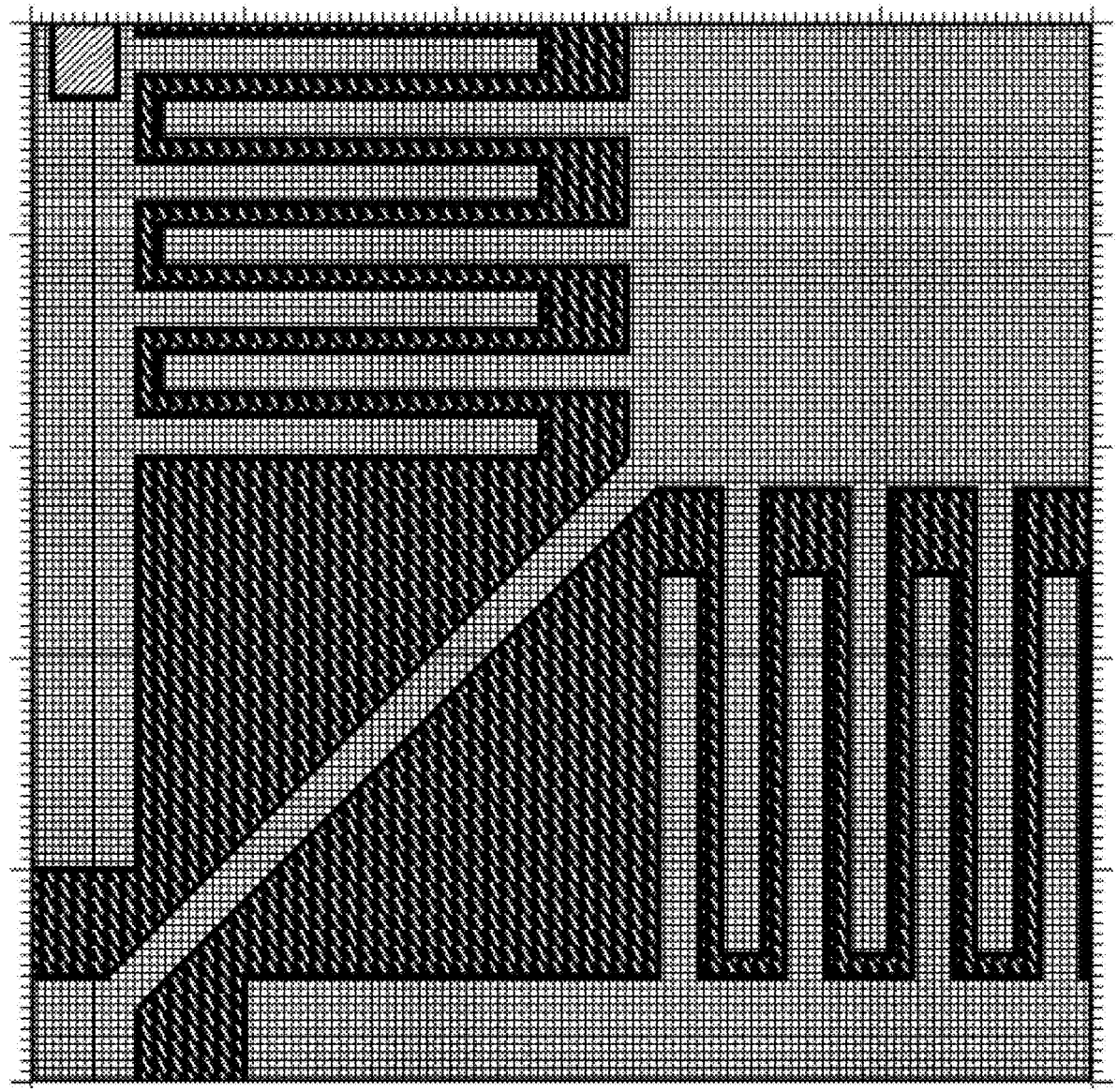
Step 23, Top View along Z axis
Figure 36A1

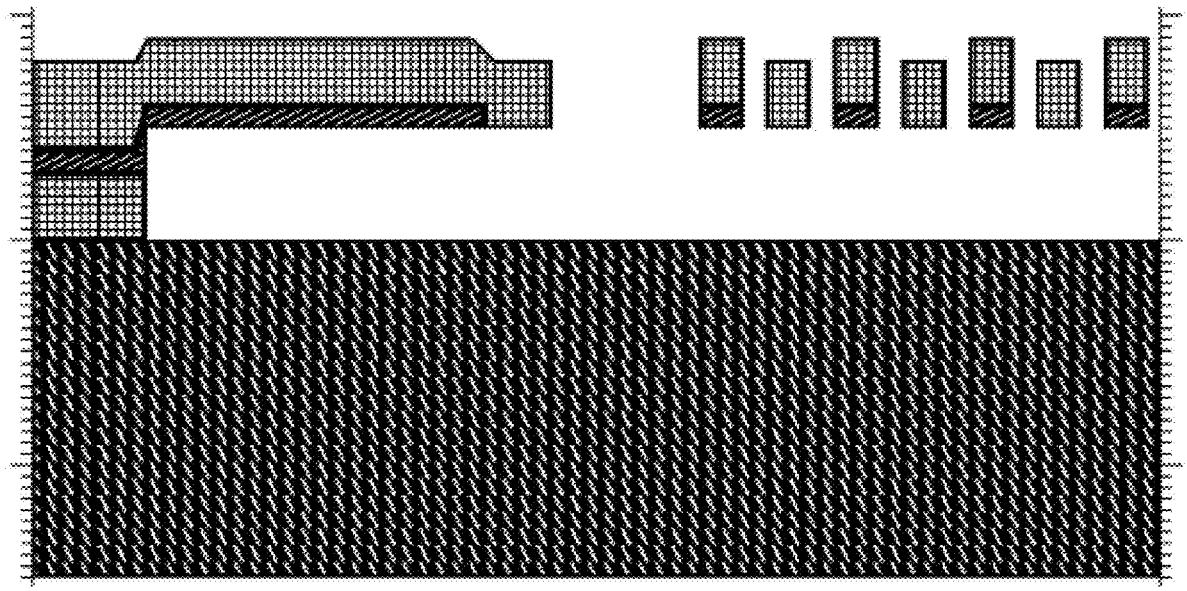
Step 23, Cross Section View along Planes B1-B2-B3
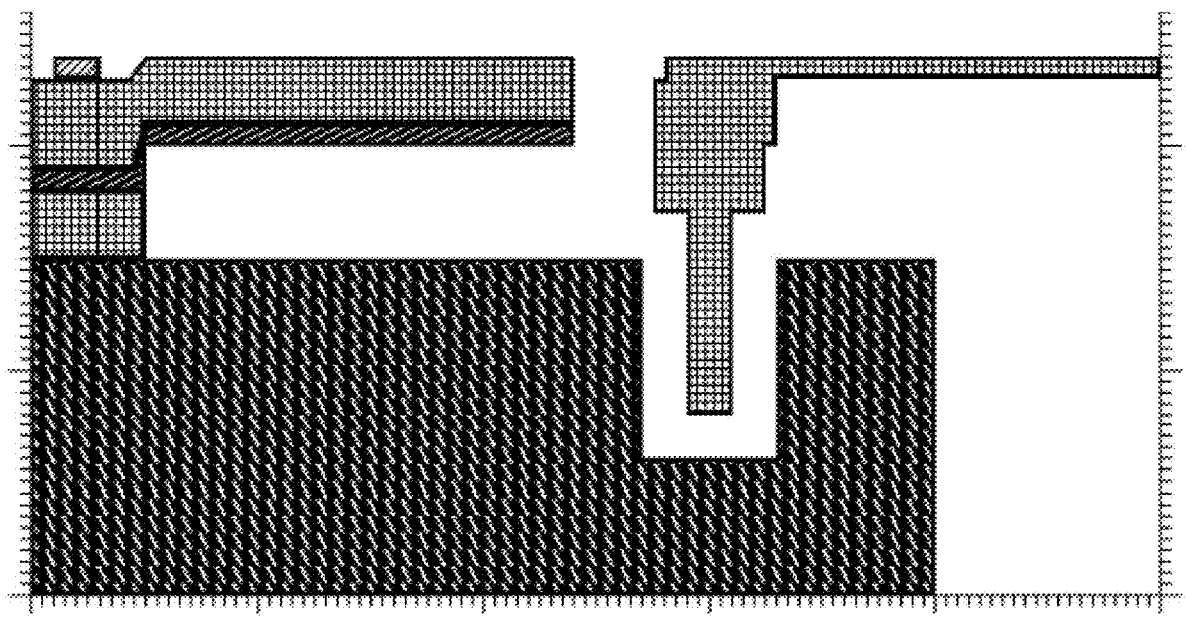
Step 23, Cross Section View along Plane A1-A2
Figure 36A2

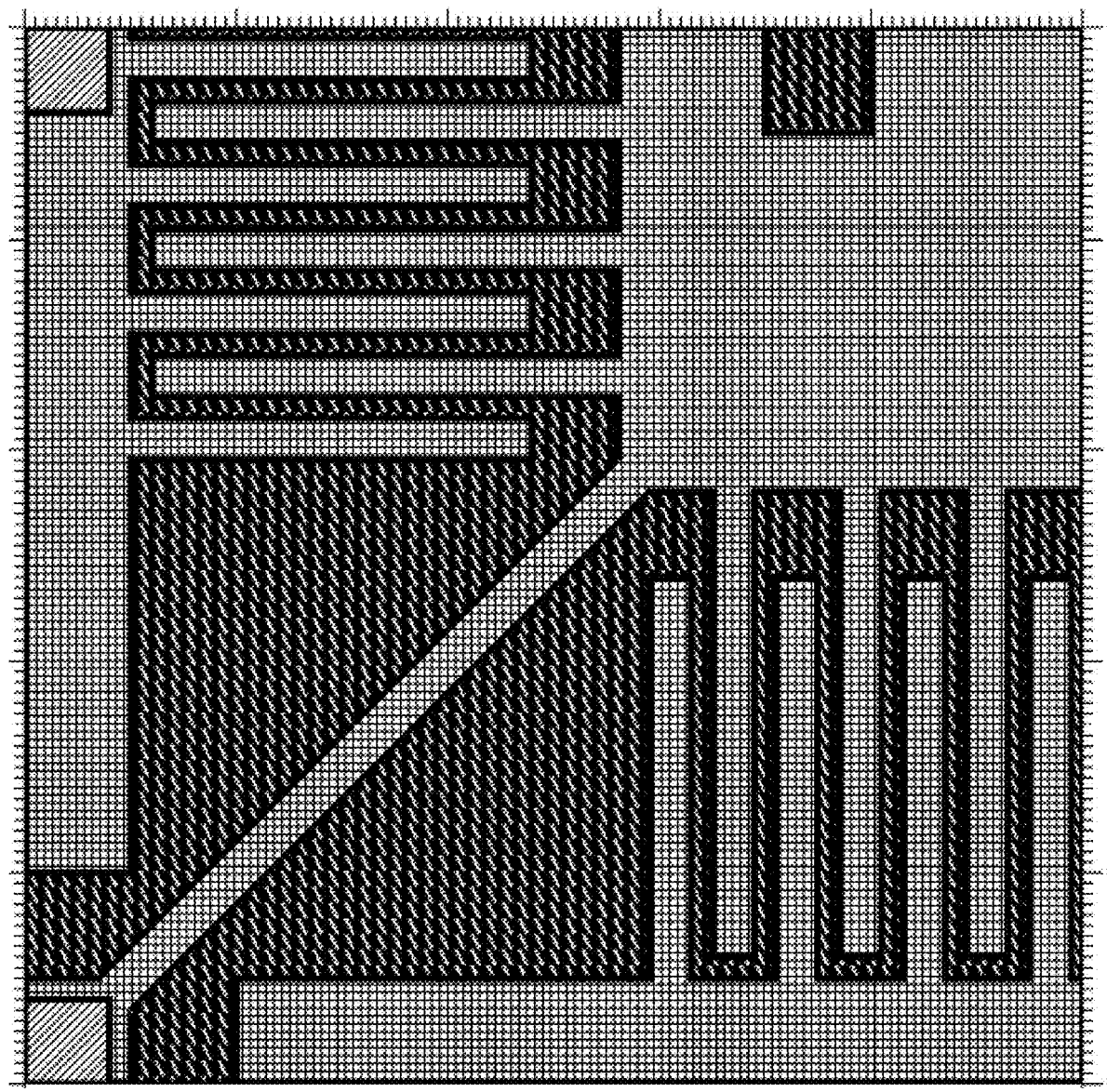
Step 23b, Top View along Z axis
Figure 36B1

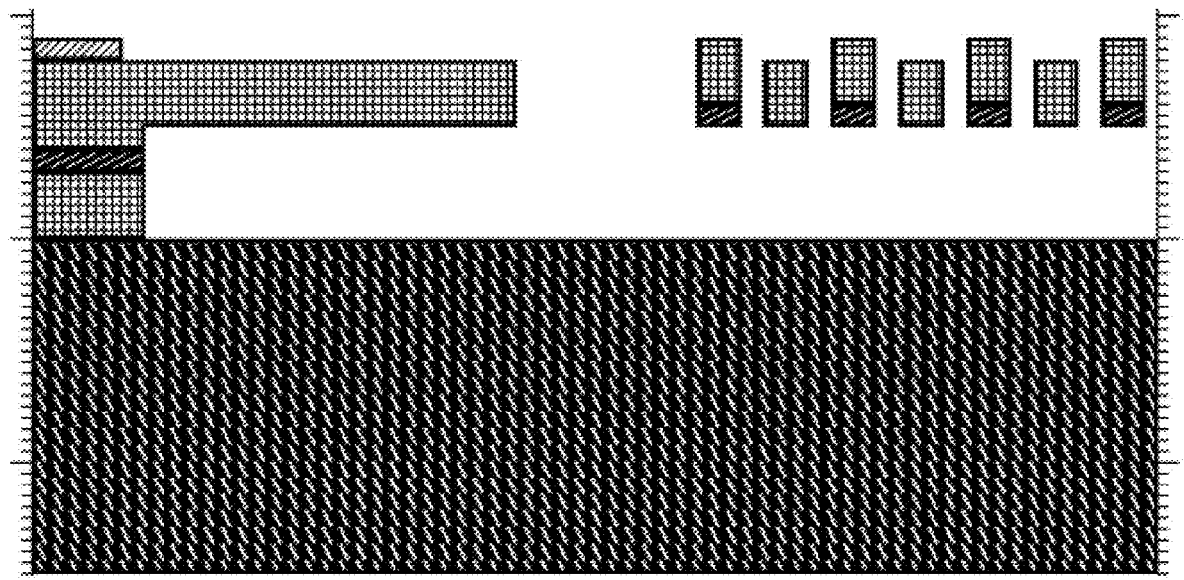
Step 23b, Cross Section View along Planes B1-B2-B3
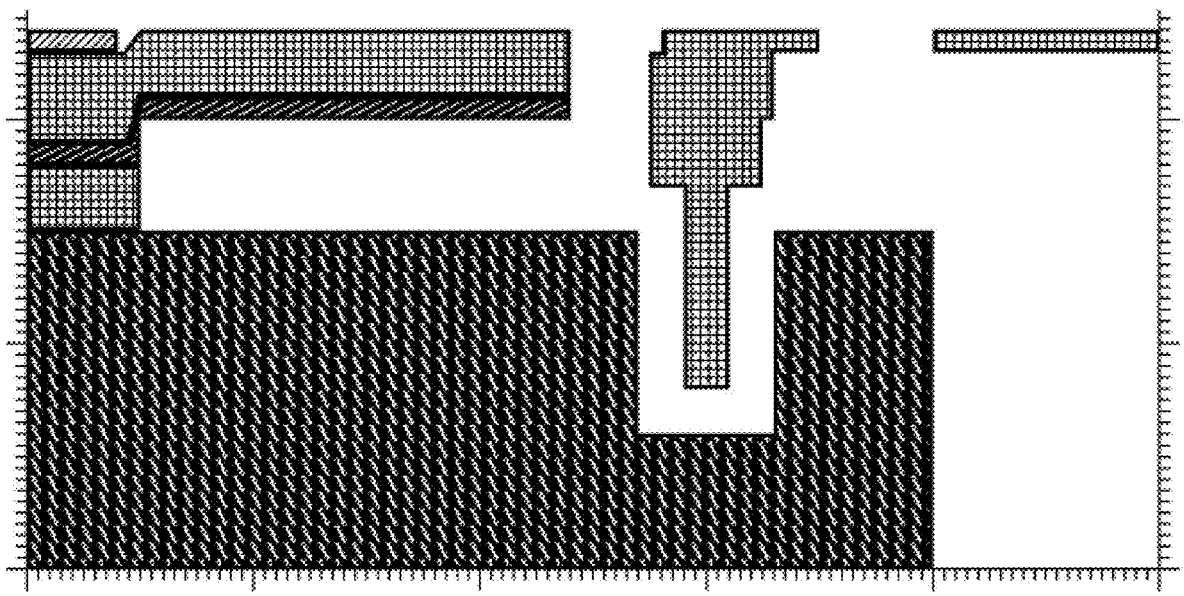
Step 23b, Cross Section View along Plane A1-A2
Figure 36B2

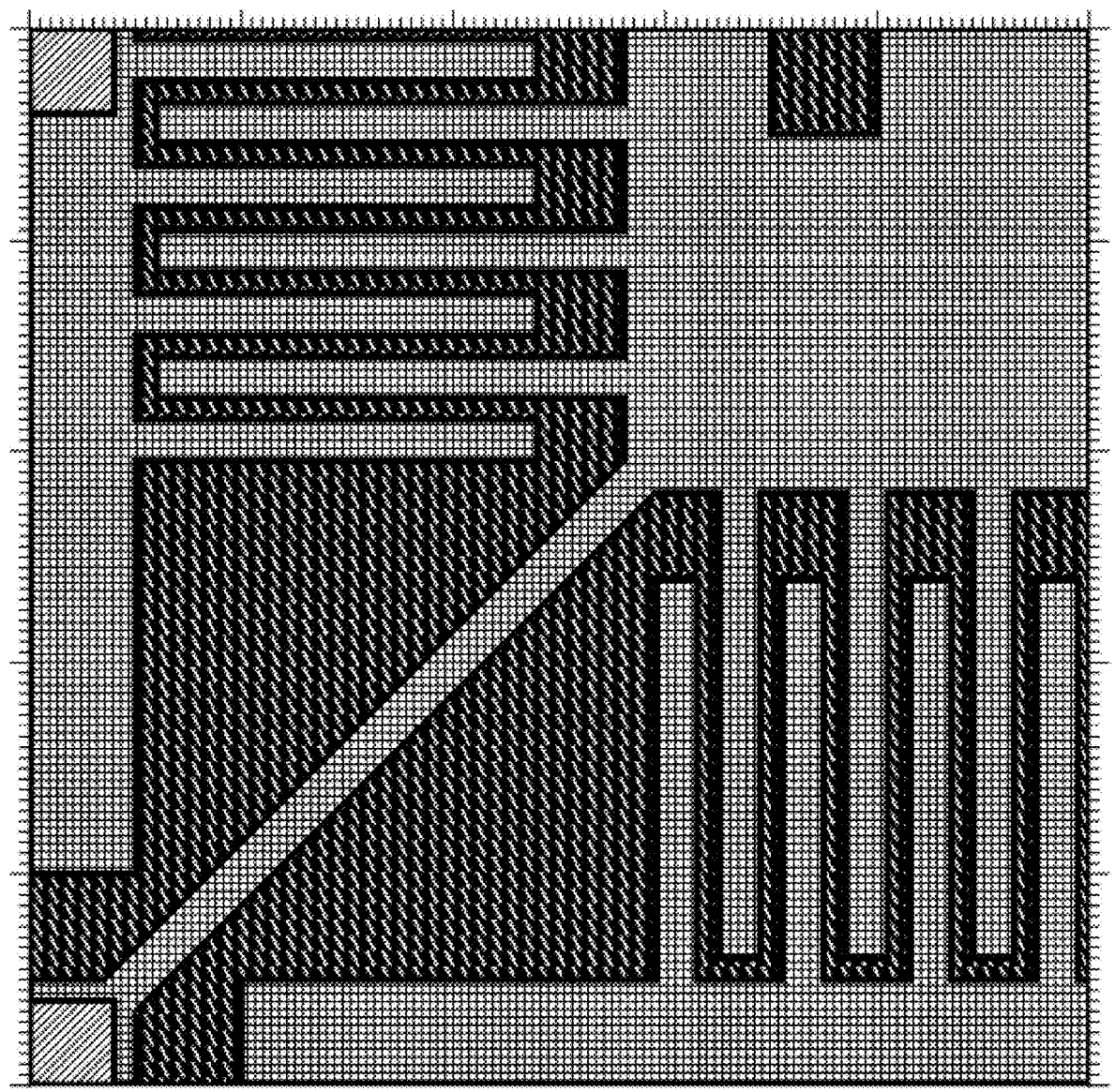
Step 23c, Top View along Z axis
Figure 36C1

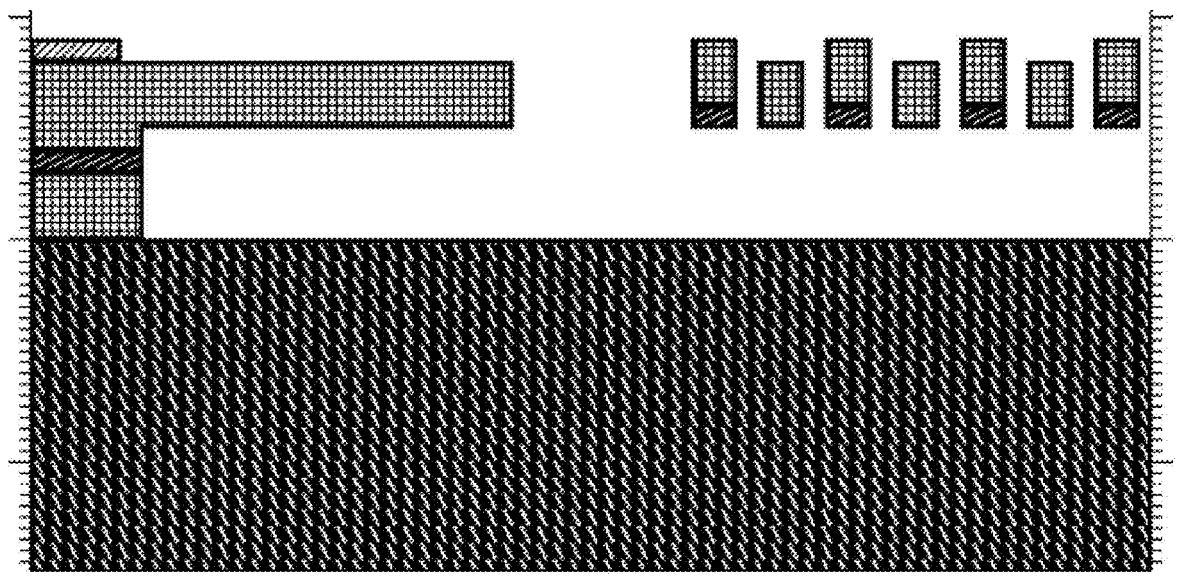
Step 23c, Cross Section View along Planes B1-B2-B3
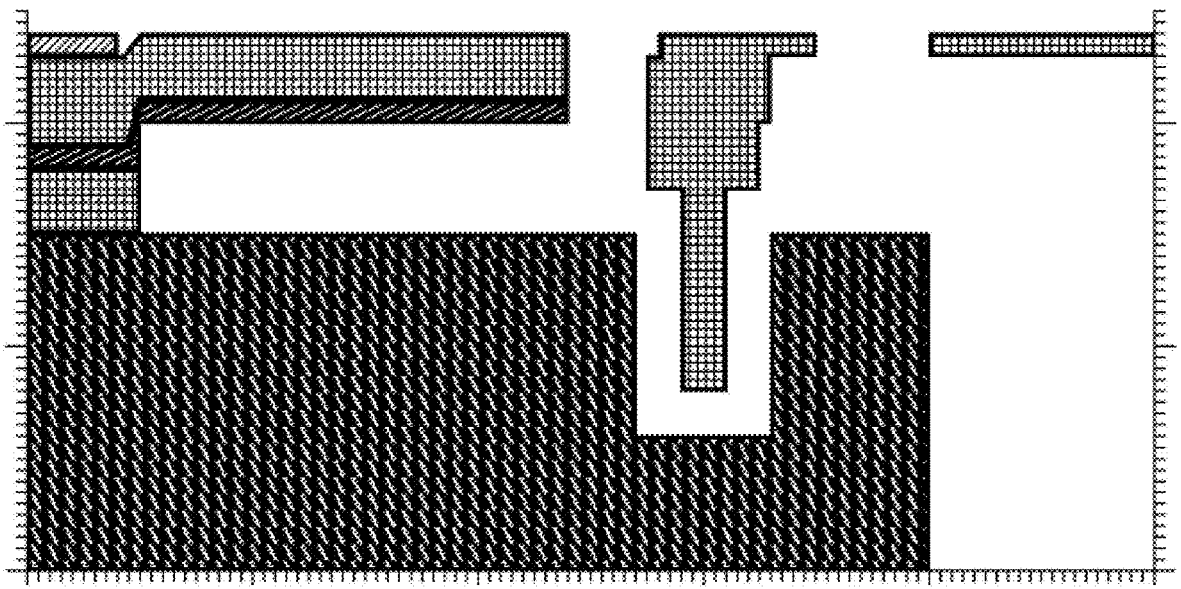
Step 23c, Cross Section View along Plane A1-A2
Figure 36C2

PROCESS OF FABRICATING LATERAL MODE CAPACITIVE MICROPHONE

CROSS-REFERENCE TO RELATED U.S. APPLICATIONS

This application is a divisional application of U.S. Ser. No. 15/730,732 filed on 12 Oct. 2017, which is a Continuation-in-Part of U.S. non-provisional application Ser. No. 15/623,339 filed on Jun. 14, 2017, which is Continuation-in-Part of U.S. non-provisional application Ser. No. 15/393,831 filed on Dec. 29, 2016, all of which are incorporated herein by reference in their entirety.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

FIELD OF THE INVENTION

The present invention generally relates to a process of fabricating a lateral mode capacitive microphone. The microphone of the invention may find applications in smart phones, telephones, hearing aids, public address systems for concert halls and public events, motion picture production, live and recorded audio engineering, two-way radios, megaphones, radio and television broadcasting, and in computers for recording voice, speech recognition, VoIP, and for non-acoustic purposes such as ultrasonic sensors or knock sensors, among others.

BACKGROUND OF THE INVENTION

FIG. 1A is a schematic diagram of parallel capacitive microphone in the prior art. Two thin layers 101 and 102 are placed closely in almost parallel. One of them is fixed backplate 101, and the other one is movable/deflectable membrane/diaphragm 102, which can be moved or driven by sound pressure. Diaphragm 102 acts as one plate of a capacitor, and the vibrations thereof produce changes in the distance between two layers 101 and 102, and changes in the mutual capacitance therebetween.

"Squeeze film" and "squeezed film" refer to a type of hydraulic or pneumatic damper for damping vibratory motion of a moving component with respect to a fixed component. Squeezed film damping occurs when the moving component is moving perpendicular and in close proximity to the surface of the fixed component (e.g., between approximately 2 and 50 micrometers). The squeezed film effect results from compressing and expanding the fluid (e.g., a gas or liquid) trapped in the space between the moving plate and the solid surface. The fluid has a high resistance, and damps the motion of the moving component as the fluid flows through the space between the moving plate and the solid surface.

In capacitive microphones as shown in FIG. 1A, squeeze film damping occurs when two layers 101 and 102 are in close proximity to each other with air disposed between them. The layers 101 and 102 are positioned so close together (e.g. within 5 μm) that air can be "squeezed" and "stretched" to slow movement of membrane/diaphragm 102. As the gap between layers 101 and 102 shrinks, air must flow out of that region. The flow viscosity of air, therefore, gives rise to a force that resists the motion of moving membrane/diaphragm 101. Squeeze film damping is significant when membrane/diaphragm 101 has a large surface area to gap length ratio. Such squeeze film damping between the two layers 101 and 102 becomes a mechanical noise source, which is the dominating factor among all noise sources in the entire microphone structure.

Co-pending U.S. application Ser. No. 15/393,831 to the same assignee, which is incorporated herein by reference, teaches a so-called lateral mode microphone in which the movable membrane/diaphragm does not move into the fixed backplate, and the squeeze film damping is substantially avoided. An embodiment of the lateral mode microphone is shown in FIG. 1B. First electrical conductor 201 is stationary, and has a function similar to the fixed backplate in the prior art. A large flat area of second electrical conductor 202, similar to movable/deflectable membrane/diaphragm 102 in FIG. 1A, receives acoustic pressure and moves up and down along the primary direction, which is perpendicular to the flat area. However, conductors 201 and 202 are configured in a side-by-side spatial relationship, not one above another. As one "plate" of the capacitor, conductor 202 does not move toward and from conductor 201. Instead, conductor 202 laterally moves over, or "glides" over, conductor 201, producing changes in the overlapped area between 201 and 202, and therefore varying the mutual capacitance therebetween. A capacitive microphone based on such a relative movement between conductors 201 and 202 is called lateral mode capacitive microphone.

An acceleration of the lateral mode capacitive microphone may affect the accuracy of sound detection. An acceleration of 1G on the direction that is normal to the flat area of conductor 202 (or membrane 202) causes a signal to be detected, whose value may be 13% of 1 Pa sound pressure. Signal to Acceleration Ratio (SAR) may be used to define this effect. For example, the SAR for a single slot design structure disclosed in the co-pending U.S. application Ser. No. 15/393,831 can be around 7.6, which is much smaller than the typical SAR 70-100 for a conventional MEMS microphone. A microphone with low SAR will suffer from inaccurate signal detection when the microphone vibrates at low frequency. For example, if the microphone, or a device using such a microphone (e.g. a cellphone), is being used in a running automobile, the shake or vibration of the device along the automobile is actually an acceleration applied on membrane 202 and may be "misread" as a sound signal.

Co-pending U.S. application Ser. No. 15/623,339 to the same assignee, which is incorporated herein by reference, teaches a motional sensor that is used in the microphone to estimate the noise introduced from acceleration or vibration of the microphone for the purpose of compensating the microphone output through a signal subtraction operation. In an embodiment, the motional sensor is identical to the lateral microphone, except that the movable membrane in the motional sensor has air ventilation holes for lowering the movable membrane's air resistance, and making the movable membrane responsive only to acceleration or vibration of the microphone. FIG. 1C illustrates a capacitive microphone 200 such as a MEMS microphone. Microphone 200 includes a functional device 290 (or a working capacitive microphone 290), and a motional sensor 300. In functional device 290, a first electrical working conductor 201 and a second electrical working conductor 202 are configured to have a relative spatial relationship therebetween so that a mutual capacitance can exist between them. The relative spatial relationship as well as the mutual capacitance can both be varied by an acoustic pressure impacting upon conductors 201 and/or 202.

FIG. 1D schematically illustrates an exemplary motional sensor 300 in the lateral mode capacitive microphone 200. Motional sensor 300 is almost identical to working capacitive microphone 290 as shown in FIG. 1C. By "almost identical", it means that the only difference between device 290 and sensor 300 is that the resistance $R_{fd}$ of conductor 201 and/or conductor 202 against an impacting acoustic pressure is much greater than the resistance $R_{ms}$ of the counterparts of conductor 201r and/or conductor 202r in motional sensor 300 against the same impacting acoustic pressure. Movable/deflectable membrane/diaphragm 202r, or reference conductor/membrane 202r, has less air resistance than the working membrane 202. For example, reference membrane 202r may have one or more openings 288 thereon for air ventilation and reducing air resistance, while working membrane 202 has no such opening(s) or has less opening(s). As a result, reference membrane 202r receives little acoustic pressure, and moves up and down mainly or entirely in response to the acceleration or vibration of the microphone 200.

In the present invention, a simple and effective process of fabricating a lateral microphone such as a MEMS microphone as described above is provided.

SUMMARY OF THE INVENTION

In various embodiments of the invention, the process fabricating the lateral microphone includes the following steps: (A10) providing a working substrate having a planar working surface, wherein a primary working direction is defined as a direction perpendicular to the planar working surface; (B10) depositing at least one removable layer such as a sacrificial layer on the planar working surface; (C10) depositing one electrically conductive working layer on said at least one removable layer; (D10) dividing the electrically conductive working layer into two divided working layers, both of which remain in contact with said at least one removable layer and are parallel with the planar working surface; and (E10) etching away said at least one removable layer to form a working capacitive microphone. As a result, the capacitive microphone includes at least a working capacitive microphone. In some embodiments the process further comprises fabricating a motional sensor having no or a minimal response to an acoustic pressure impacting the capacitive microphone. As a result, the capacitive microphone includes not only a working capacitive microphone, but also a motional sensor.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form in order to avoid unnecessarily obscuring the present invention. Other parts may be omitted or merely suggested.

Regarding FIGS. 14-28.

Regarding FIGS. 29A-32B.

Regarding FIGS. 33A1-33C2, FIG. 33A1 illustrates a step of patterning/etching polysilicon with no membrane hole. FIG. 33A2 illustrates a step of patterning/etching polysilicon with no membrane hole. FIG. 33B1 illustrates a step of patterning/etching polysilicon with a membrane hole. FIG. 33B2 illustrates a step of patterning/etching polysilicon with a membrane hole. FIG. 33C1 illustrates a step of patterning/etching polysilicon with a membrane hole. FIG. 33C2 illustrates a step of patterning/etching polysilicon with a membrane hole.

Regarding FIGS. 34A1-34C2, FIG. 34A1 illustrates a step of etching silicon nitride (with no membrane hole). FIG. 34A2 illustrates a step of etching silicon nitride (with no membrane hole). FIG. 34B1 illustrates a step of etching silicon nitride (with a membrane hole). FIG. 34B2 illustrates a step of etching silicon nitride (with a membrane hole). FIG. 34C1 illustrates a step of etching silicon nitride (with a membrane hole). FIG. 34C2 illustrates a step of etching silicon nitride (with a membrane hole).

Regarding FIGS. 35A1-35C2, FIG. 35A1 illustrates a step of etching back hole or cavity (with no membrane hole). FIG. 35A2 illustrates a step of etching back hole or cavity (with no membrane hole). FIG. 35B1 illustrates a step of etching back hole or cavity (with a membrane hole). FIG. 35B2 illustrates a step of etching back hole or cavity (with a membrane hole). FIG. 35C1 illustrates a step of etching back hole or cavity (with a membrane hole). FIG. 35C2 illustrates a step of etching back hole or cavity (with a membrane hole).

Regarding FIGS. 36A1-36C2, FIG. 36A1 illustrates a step of removing sacrificial materials (with no membrane hole). FIG. 36A2 illustrates a step of removing sacrificial materials (with no membrane hole). FIG. 36B1 illustrates a step of removing sacrificial materials (with a membrane hole). FIG. 36B2 illustrates a step of removing sacrificial materials (with a membrane hole). FIG. 36C1 illustrates a step of removing sacrificial materials (with a membrane hole). FIG. 36C2 illustrates a step of removing sacrificial materials (with a membrane hole).

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

Figure 2:
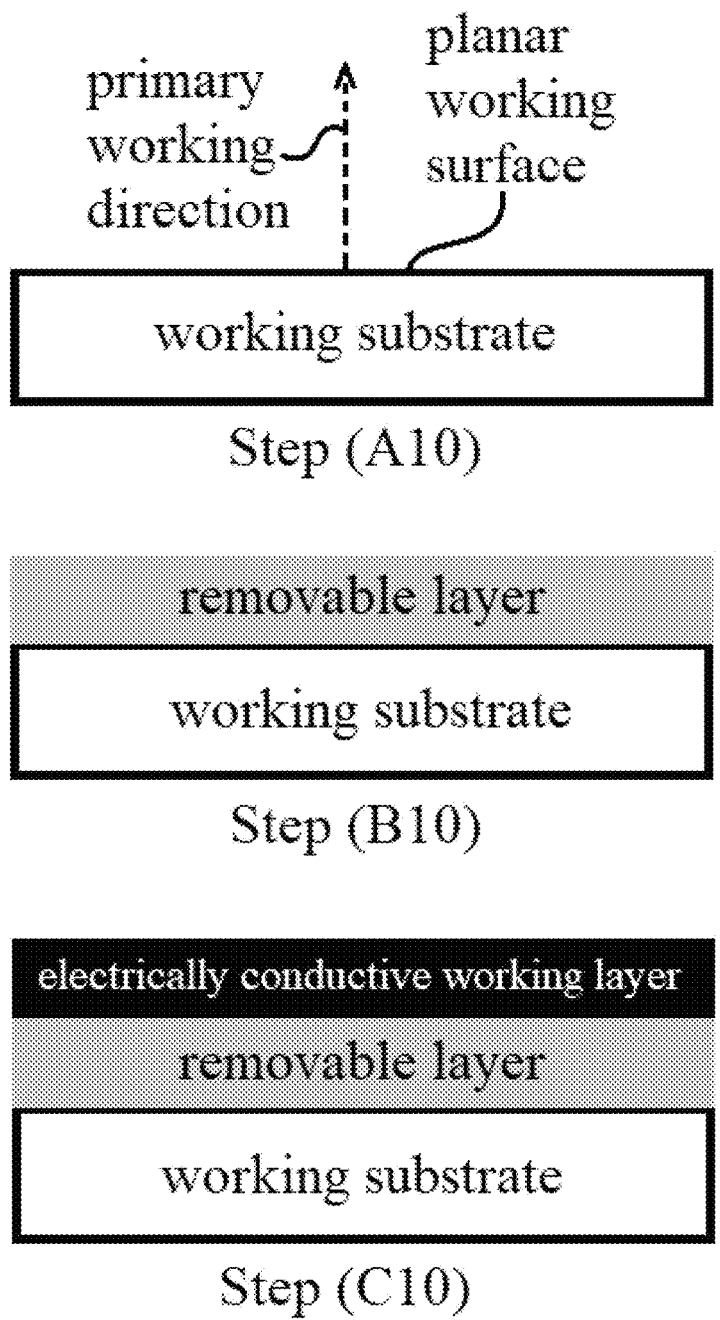
FIG. 2 schematically illustrates some steps in a process of fabricating a capacitive microphone such as a MEMS microphone in accordance with an exemplary embodiment of the present invention.
Figure 3:
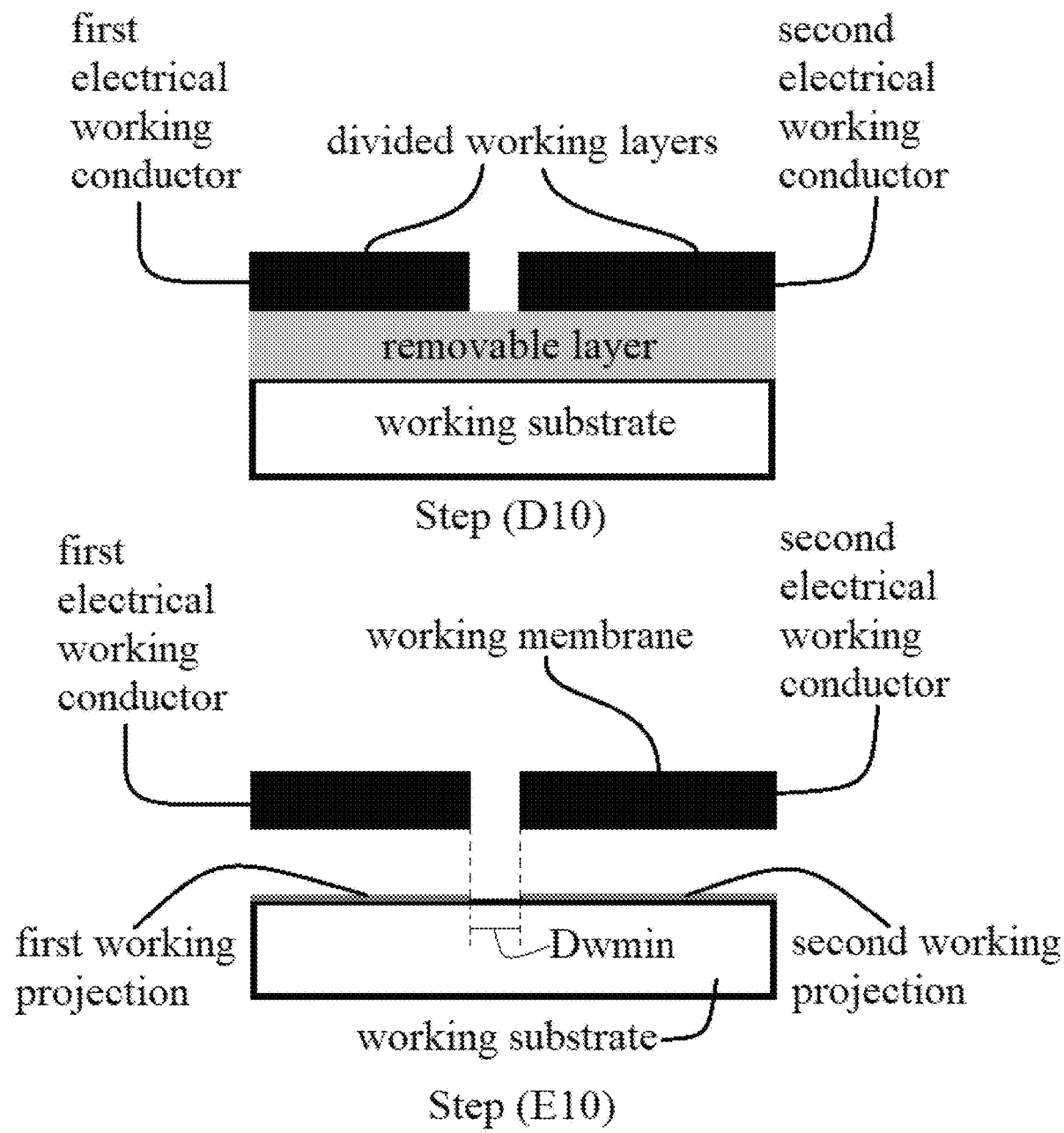
FIG. 3 schematically illustrates some steps in a process of fabricating a capacitive microphone such as a MEMS microphone in accordance with an exemplary embodiment of the present invention.

Steps (A10)-(E10) are schematically illustrated in FIG. 2 and FIG. 3. In step (A10), a working substrate having a planar working surface is provided. The working substrate may be made of silicon. A primary working direction is defined as a direction perpendicular to the planar working surface. In step (B10), at least one removable layer is deposited on the planar working surface. The removable layer may comprise PSG or thermal oxide such as oxides of Si. In step (C10), one electrically conductive working layer is deposited on the removable layer. The electrically conductive working layer may comprise polysilicon, silicon, gold, silver, nickel, aluminum, copper, chromium, titanium, tungsten, or platinum.

In step (D10) as shown in FIG. 3, the electrically conductive working layer is divided or cut (e.g. by pattering and etching) into two divided working layers, both of which remain in contact with said at least one removable layer. Both layers are substantially parallel to the planar working surface. In step (E10), the removable layer is removed or etched away to form a working capacitive microphone.

In steps (D10) and (E10), the two divided working layers become a first electrical working conductor and a second electrical working conductor in the working capacitive microphone, as shown in FIG. 3. A mutual capacitance exists between said two working conductors. The first electrical working conductor has a first working projection along said primary working direction on the planar working surface, and the second electrical working conductor has a second working projection along said primary working direction on the planar working surface. The first working projection and the second working projection have a shortest working distance Dwmin therebetween, and Dwmin remains greater than zero regardless of that one or two of said two working conductors is (are) impacted by an acoustic pressure along said primary working direction or not. In an embodiment, the electrically conductive working layer has a total area of A that is in contact with the removable layer after step (C10), but before step (D10). After step (D10), the first electrical working conductor has a total area of A1 in contact with the removable layer, and the second electrical working conductor has a total area of A2 in contact with the removable layer. However, the sum of A1 and A2 is smaller than A, because step (D10) dividing or cutting may be carried out by removing away a stripe of the electrically conductive working layer, and that stripe always has an area greater than zero. For example, (A1+A2) may be in the range of from 80% A to 99.99% A. There is no specific requirement for A1:A2 ratio, for example, A1:A2 ratio may range from 1:10 to 10:1.

Additional steps for fabricating a motional sensor may be introduced, or combined/merged with steps (A10)-(E10). The motional sensor has zero or a minimal response to an acoustic pressure impacting the capacitive microphone. In preferred embodiments, the process for fabricating the motional sensor is identical to the process for fabricating the working capacitive microphone, with an exception such as one or more openings 288 in FIG. 1D. The names of components in the working capacitive microphone and counterpart components in the motional sensor are listed in the following table for quick reference.

| Components in working capacitive microphone | Counterpart components in motional sensor (identical) |
| --- | --- |
| working substrate | reference substrate |
| planar working surface | planar reference surface |
| primary working direction | primary reference direction |
| electrically conductive working layer | electrically conductive reference layer |
| elevated working area | elevated reference area |
| two divided working layers | two divided reference layers |
| first electrical working conductor | first electrical reference conductor |
| second electrical working conductor | second electrical reference conductor |
| first working projection | first reference projection |
| second working projection | second reference projection |
| shortest working distance Dwmin | shortest reference distance Drmin |
| working suspensions | reference suspensions |
| working cantilevers | reference cantilevers |
| first set of working comb fingers | first set of reference comb fingers |
| second set of working comb fingers | second set of reference comb fingers |
| working trench | reference trench |
| working insert | reference insert |
| Components in working capacitive microphone | Counterpart components in motional sensor (not identical) |
| working membrane | reference membrane |

Specifically, the following additional steps (a10)-(e10) may be introduced, and/or combined with above steps (A10)-(E10). Step (a10) is providing a reference substrate having a planar reference surface, wherein a primary reference direction is defined as a direction perpendicular to the planar reference surface. Step (b10) is depositing at least one removable layer on the planar reference surface. Step (c10) is depositing one electrically conductive reference layer on said at least one removable layer. Step (d10) is dividing the electrically conductive reference layer into two divided reference layers, both of which remain in contact with said at least one removable layer and are in parallel with the planar reference surface. Step (e10) is removing or etching away said at least one removable layer to form a motional sensor.

Figure 4A:
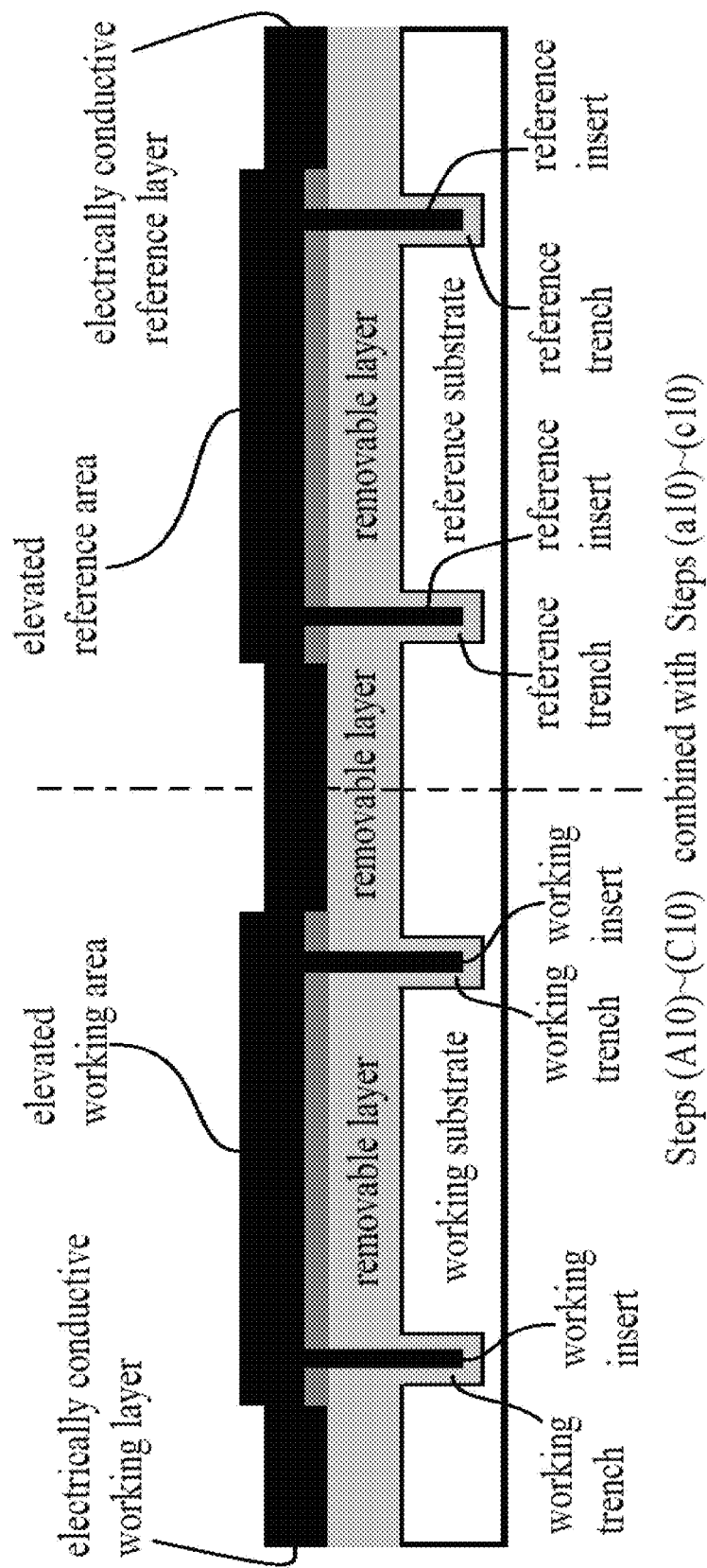
FIG. 4A schematically illustrates some steps in a process of fabricating a capacitive microphone in accordance with an exemplary embodiment of the present invention.
Figure 4B:
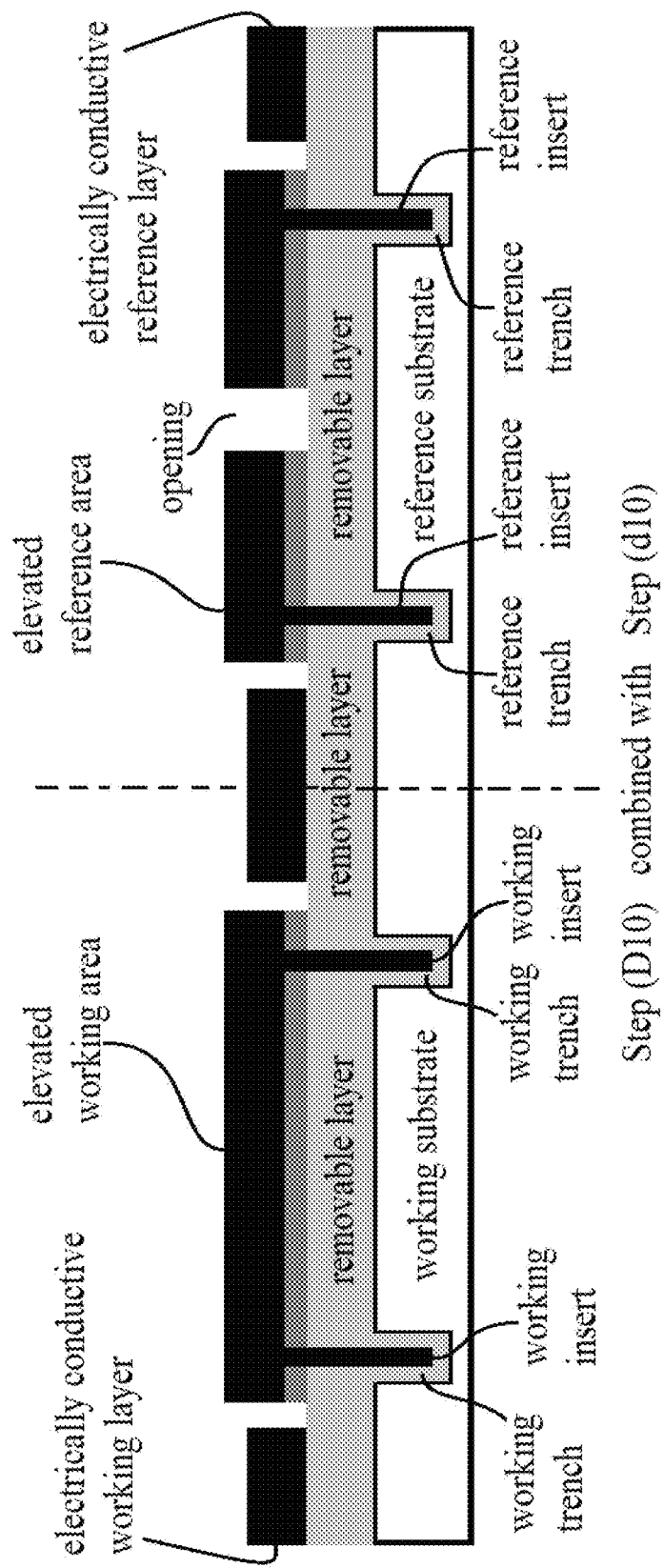
FIG. 4B schematically illustrates a step in a process of fabricating a capacitive microphone in accordance with an exemplary embodiment of the present invention.
Figure 4C:
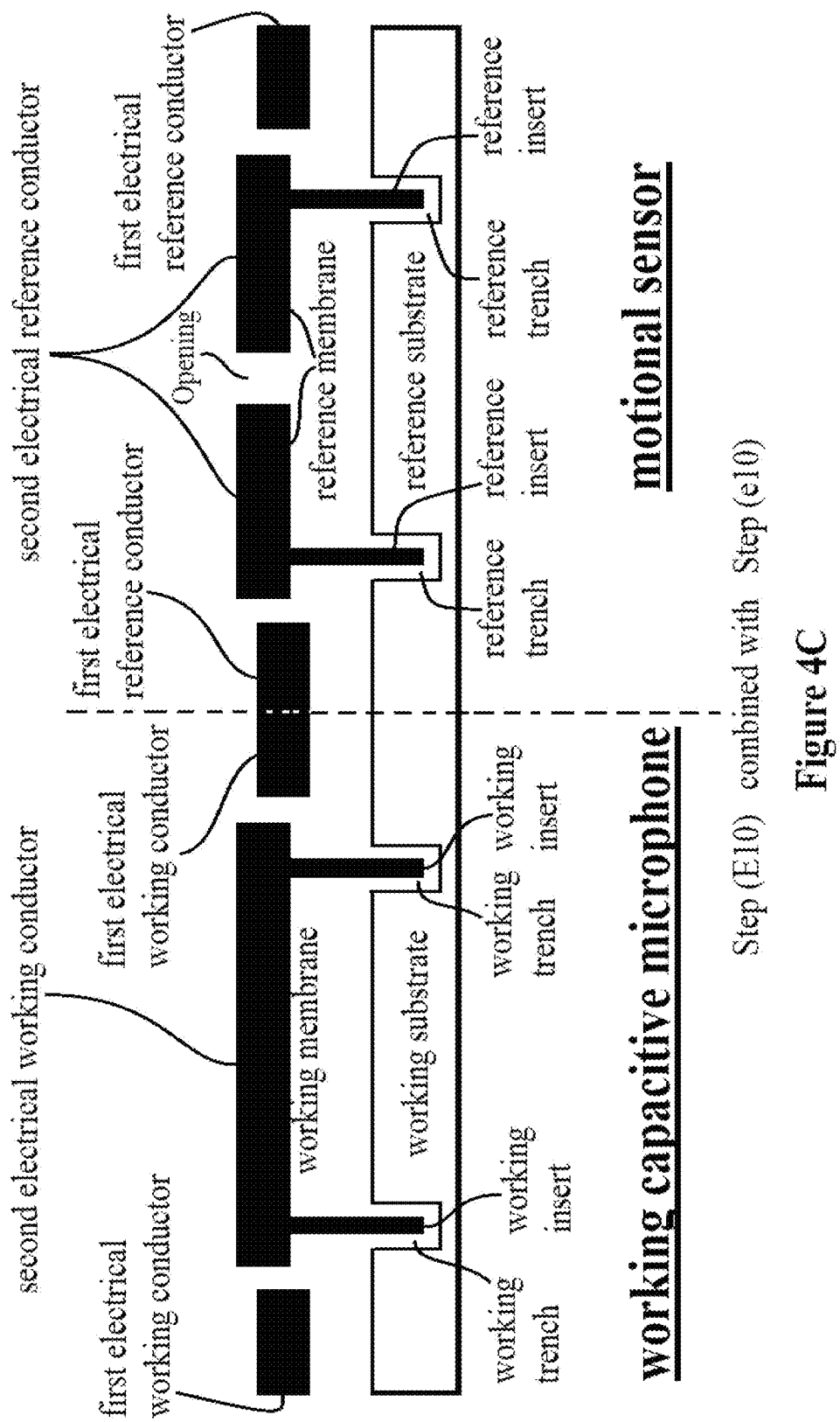
FIG. 4C schematically illustrates a step in a process of fabricating a capacitive microphone in accordance with an exemplary embodiment of the present invention.

In preferred embodiments as shown in FIG. 4A, FIG. 4B, and FIG. 4C, Step (A10) and Step (a10) are combined into a step of providing a common substrate for both the working capacitive microphone and the motional sensor. Step (B10) and Step (b10) are combined as a step of depositing at least one common removable layer for both the working capacitive microphone and the motional sensor. Step (C10) and Step (c10) are combined as a step of depositing a common electrically conductive layer on said at least one common removable layer for both the working capacitive microphone and the motional sensor. Step (D10) and Step (d10) are combined as a step of dividing the common electrically conductive layer into a first electrical working conductor, a second electrical working conductor, a first electrical reference conductor, and a second electrical reference conductor. Step (E10) and Step (e10) are combined as a step of etching away said at least one common removable layer for both the working capacitive microphone and the motional sensor.

However, it should be appreciated that steps (D10) dividing and (E10) etching in some embodiments can be carried out so that, in the formed working capacitive microphone, the first electrical working conductor is fixed relative to the working substrate, and the second electrical working conductor comprises a working membrane perpendicular to said primary working direction that is movable relative to the working substrate. Steps (d10) and (e10) may be carried out in a similar way for the motional sensor, mutatis mutandis. However, as compared to steps (A10)-(E10), one or more openings are cut on the reference membrane for air ventilation. This is an important difference, or even the only difference, between the working capacitive microphone and the motional sensor.

It should also be appreciated that the left half of FIGS. 4A-4C may be viewed as an illustration for Steps (A10)-(E10) alone, the right half of FIGS. 4A-4C may be viewed as an illustration for Steps (a10)-(e10) alone, and the entire FIGS. 4A-4C may be viewed as an illustration for fabricating an exemplary microphone of the invention, where Steps (A10)-(E10) and Steps (a10)-(e10) are combined, integrated, or merged.

Referring back to FIGS. 4A-4C, the process may be so carried out that, in the formed working capacitive microphone, the first electrical working conductor is fixed or stationary relative to the working substrate, and the second electrical working conductor comprises a working membrane, which is perpendicular to the primary working direction and movable relative to the working substrate (up and down). In specific embodiments, step (D10) dividing is carried out so that the movable working membrane is directly or indirectly attached to the substrate via three or more working suspensions (not shown) such as four working suspensions. The suspension is flexible, and allows the working membrane moves up and down. For example, each of the working suspensions may be configured to have folded and symmetrical working cantilevers. Step (d10) dividing and step (e10) etching may be carried out in a similar way, mutatis mutandis.

In preferred embodiments, step (D10) may include cutting a first set of working comb fingers (not shown) in the first electrical working conductor, and cutting a second set of working comb fingers (not shown) around a peripheral region of the movable working membrane. The two sets of working comb fingers are interleaved into each other, and the second set of working comb fingers are laterally movable relative to the first set of working comb fingers. In a specific embodiment, the first set of working comb fingers and the second set of working comb fingers have identical shape and dimension, but they may have a same or different distance as measured from the substrate (i.e. a vertical positional shift). Step (d10) dividing may be carried out in a similar way, mutatis mutandis.

For example, step (C10) may be depositing one electrically conductive working layer having an elevated working area, and step (D10) may be dividing or cutting the electrically conductive working layer along an edge or a borderline of the elevated area to form two divided layers, so that each working comb finger has a same working width measured along the primary working direction, and the first set of working comb fingers and the second set of working comb fingers have a vertical positional shift along the primary working direction. In one embodiment, the positional shift along the primary working direction is one third of the working/reference width. Step (c10) dividing and step (d10) etching may be carried out in a similar way, mutatis mutandis.

Step (D10) may be dividing or cutting the movable working membrane in square shape. Step (D10) may comprise dividing two or more movable working membranes such as four identical movable working membranes arranged in a 2×2 array configuration above the substrate. Step (d10) dividing may be carried out in a similar way, mutatis mutandis.

Figure 4D:
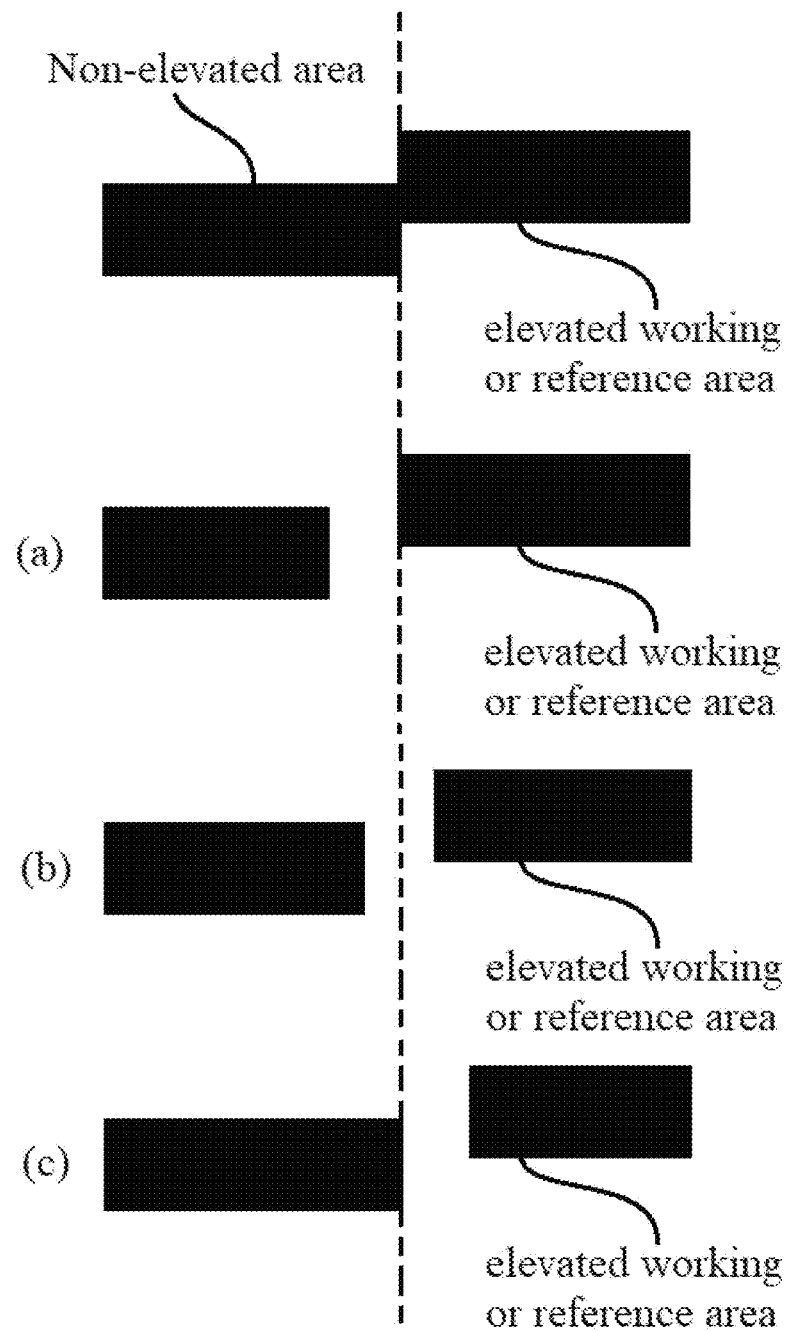
FIG. 4D schematically illustrates a step in a process of fabricating a capacitive microphone in accordance with an exemplary embodiment of the present invention.

There may be 3 different ways for dividing or cutting the electrically conductive working layer along an edge or a borderline of the elevated area to form two divided layers. As shown in FIG. 4D, a first way labeled as (a) may be completely cutting on the non-elevated side along the edge or borderline; a second way labeled as (b) may be cutting partially on the non-elevated side and partially on the elevated area, along the edge or borderline; and a third way labeled as (c) may be completely cutting on the elevated side along the edge or borderline.

It should be appreciated that steps (D10) and (d10) as combined may comprise cutting m working membrane(s) on said second electrical working conductor, and cutting n reference membrane(s) on said second electrical reference conductor, wherein m≥1, and n≥1. In preferred embodiments, the motional sensor may have a structure identical to the working capacitive microphone, except that one or more openings are cut through the reference membrane for air ventilation. For example, m and n can both be 2, and the two working membranes and the two reference membranes are arranged in a 2×2 array configuration above the common substrate (i.e. working substrate combined with reference substrate).

In some embodiments, a step of (A15) may be added, which is etching the planar working surface of the working substrate to form a working trench. Step (C10) depositing may include forming a working insert that is protruded from the working membrane downward into the working trench. The working insert and the working trench function as a working air flow restrictor that restricts the flow rate of air flowing in/out of the gap between the working membrane and the working substrate in the working capacitive microphone. Step (a15) may be added, and carried out in a similar way to Step (A15), mutatis mutandis. Step (c10) dividing may also be carried out in a similar way to Step (C10), mutatis mutandis.

In various embodiments, the first electrical working conductor and the first electrical reference conductor are electrically connected to form a common ground to simplify the circuit design.

In various embodiments, the present invention utilizes a reference moving membrane that can detect substantially only the acceleration signal. The measured acceleration signal can then be used to cancel out the component of actual acceleration signal in the total ("gross") signal as measured by the working capacitive microphone in real-time, through a signal subtraction operation.

Figure 5A:
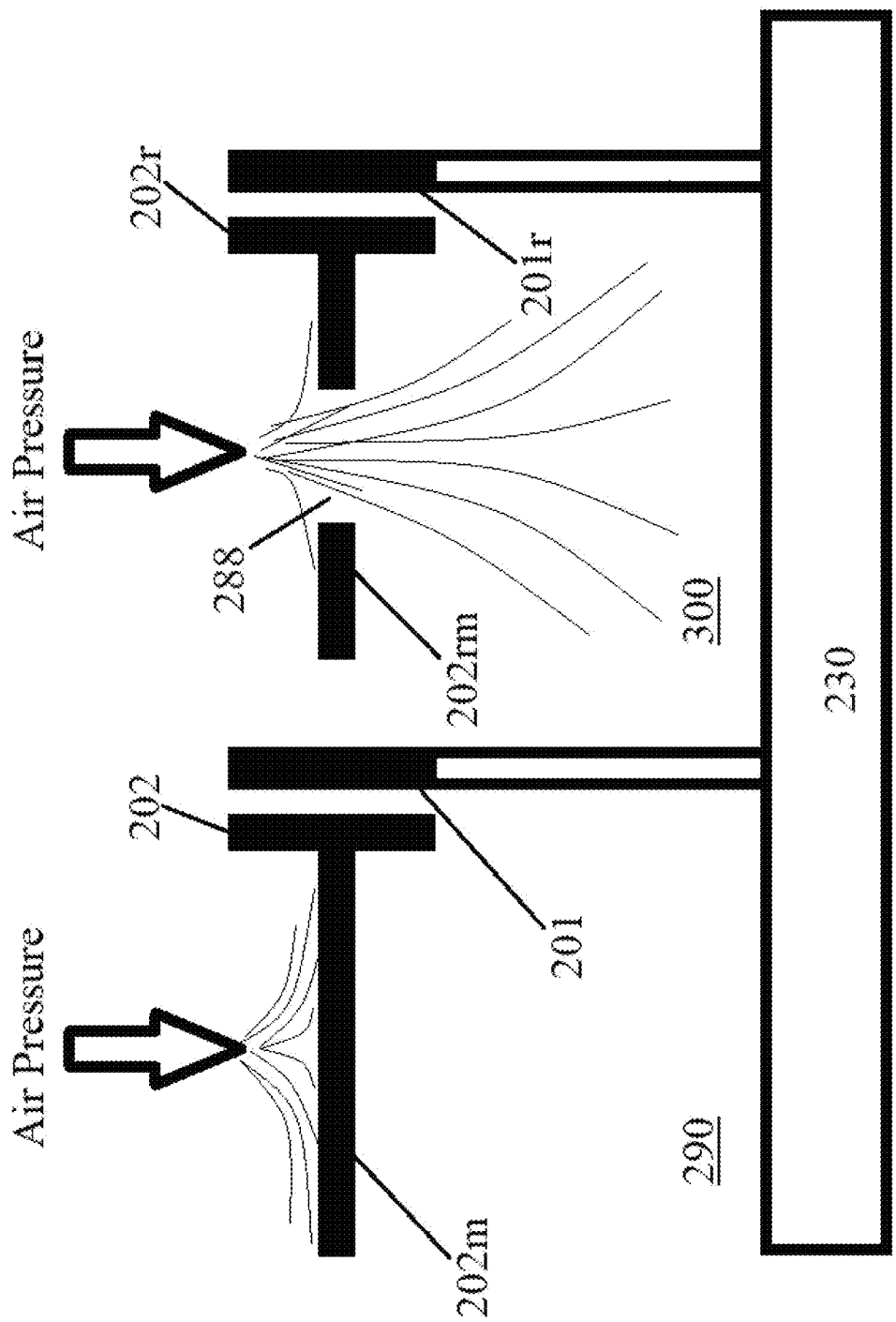
FIG. 5A schematically shows a MEMS capacitive microphone in accordance with an exemplary embodiment of the present invention.

FIG. 5A illustrates a more specific embodiment of a lateral microphone 200, in which identical conductors 201 and 201r are fixed relative to a common substrate 230. Conductor 202 comprises a working membrane 202m that is movable relative to the substrate 230, and the primary working direction is perpendicular to the working membrane 202m plane and the planar face plane of common substrate 230. Reference conductor 202r comprises a reference membrane 202rm that is also movable relative to the substrate 230, and the primary reference direction is perpendicular to the reference membrane 202rm plane and the planar face plane of common substrate 230. Working membrane 202m plane and reference membrane 202rm plane may be in parallel with each other. Conductors 202 and 202r are identical except that the reference membrane 202rm has less air resistance than the working membrane 202m. For example, reference membrane 202rm may have one or more openings 288 thereon for air ventilation, but the working membrane 202m has no opening.

In exemplary embodiments of the invention, the lateral microphone 200 may be a MEMS (Microelectromechanical System) microphone, AKA chip/silicon microphone. Typically, a pressure-sensitive diaphragm is etched directly into a silicon wafer by MEMS processing techniques, and is usually accompanied with integrated preamplifier. For a digital MEMS microphone, it may include built in analog-to-digital converter (ADC) circuits on the same CMOS chip making the chip a digital microphone and so more readily integrated with digital products.

Figure 5B:
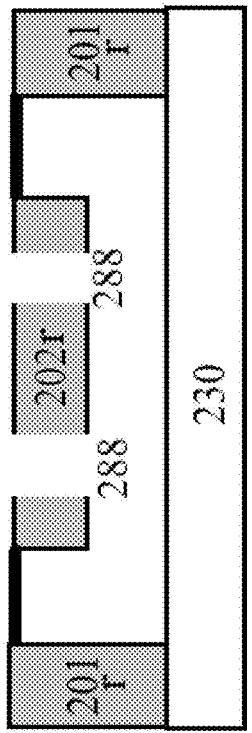
FIG. 5B schematically shows a MEMS capacitive microphone in accordance with an exemplary embodiment of the present invention.
Figure 5B:
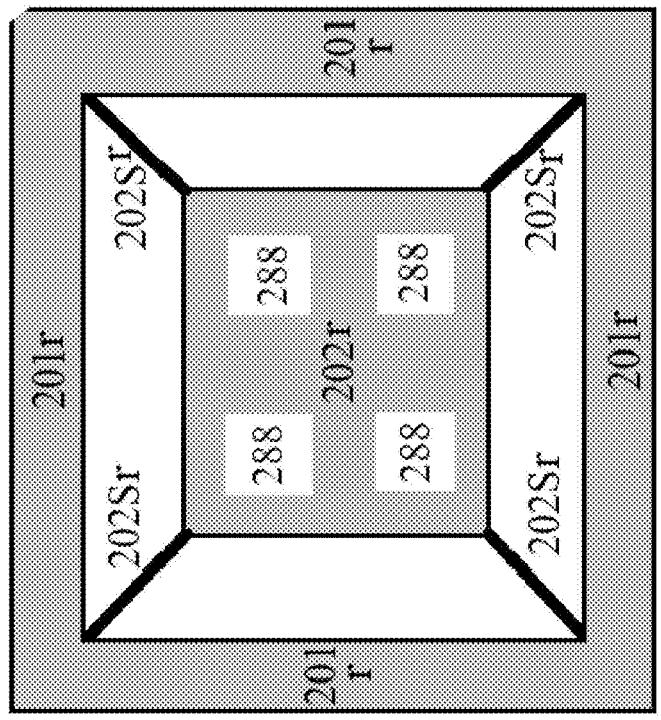
Figure 5B:
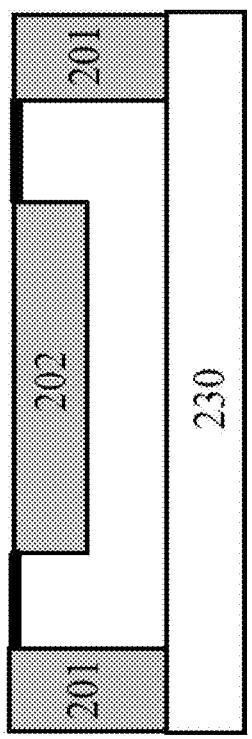
Figure 5B:
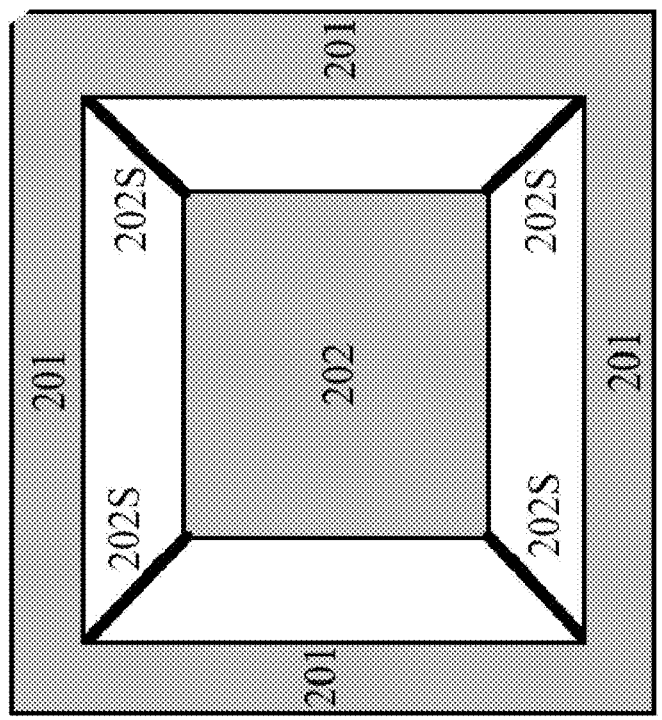

In an embodiment as shown in FIG. 5B, capacitive microphone 200 may include a common substrate 230 such as silicon, on which both working capacitive microphone 290 and motional sensor 300 are fabricated. Conductor 201/201r and conductor 202/202r may be constructed above the substrate 230 side-by-side. Alternatively, conductor 201/201r may be surrounding conductor 202/202r, as shown in FIG. 5B. In an exemplary embodiment, conductor 201/201r is fixed to the substrate 230. On the other hand, conductor 202/202r may include a membrane that is movable relative to substrate 230. The primary working/reference direction may be perpendicular to the membrane plane of 202/202r. Movable membrane 202/202r may be attached to the substrate 230 via three or more working suspensions 202S/202Sr such as four working suspensions 202S/202Sr extending from four corners of 202/202r. Each of the suspension 202S/202Sr may comprise folded and symmetrical cantilevers (not shown here). However, reference membrane 202r has air ventilation device(s) such as four square openings or holes 288, but working membrane 202 does not.

Figure 6:
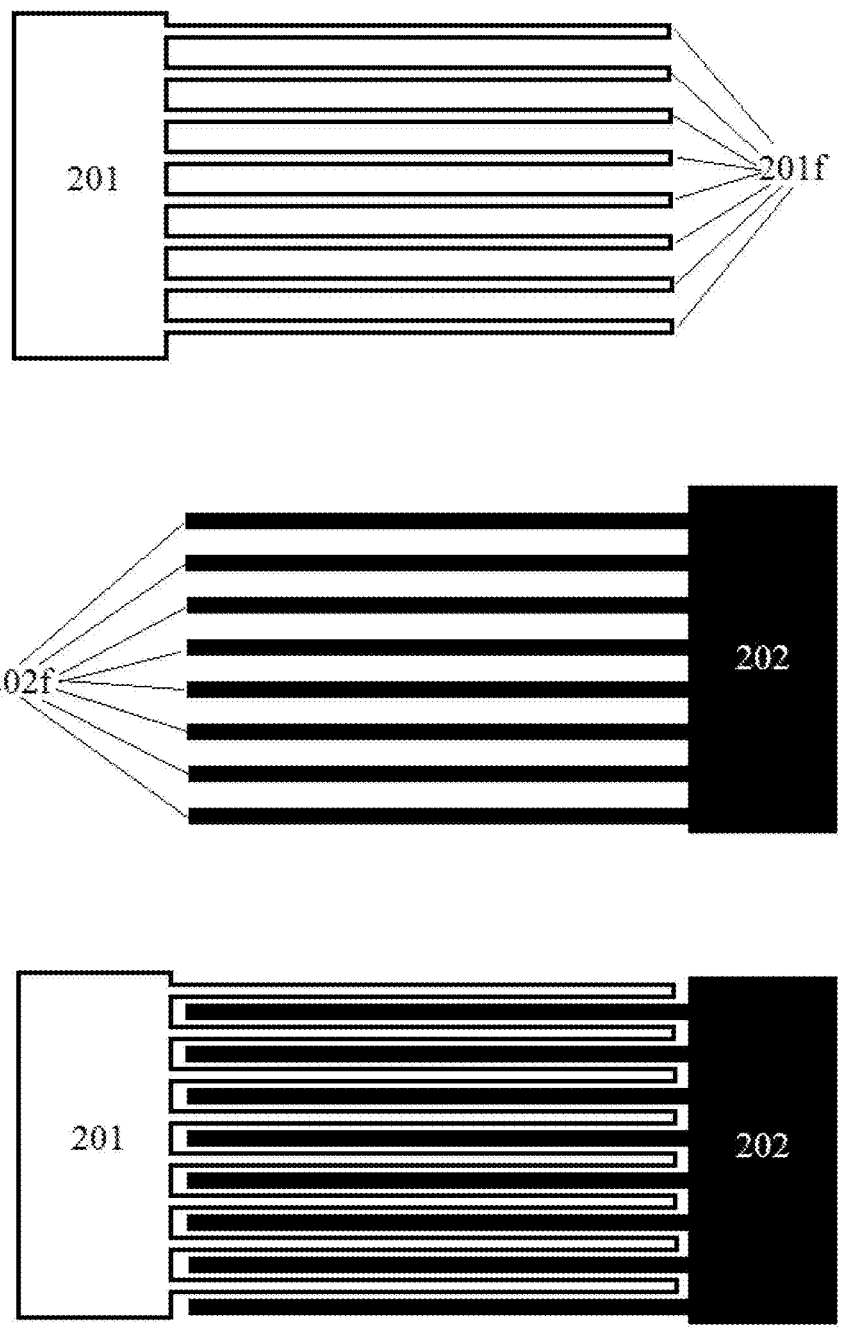
FIG. 6 illustrates the first/second working electrical conductors having a comb finger configuration in accordance with an exemplary embodiment of the present invention.

In working capacitive microphone 290, working conductor 201 comprises a first set of working comb fingers 201f as shown in FIG. 6 that is fixed to common substrate 230. The movable working membrane in second conductor 202 comprises a second set of working comb fingers 202*f* around the peripheral region of the membrane 202. The two sets of comb fingers 201*f* and 202*f* can be interleaved into each other. The second set of comb fingers 202*f* is movable along the primary direction, which is perpendicular to the membrane plane 202, relative to the first set of comb fingers 201*f*. As such, the resistance from air located within the gap between the membrane 202 and the substrate is lowered; for example, 25 times lower squeeze film damping. In a preferred embodiment, working comb fingers 201*f* and comb fingers 202*f* have identical shape and dimension. Motional device 300 may be fabricated in a similar way, mutatis mutandis.

Figure 7:
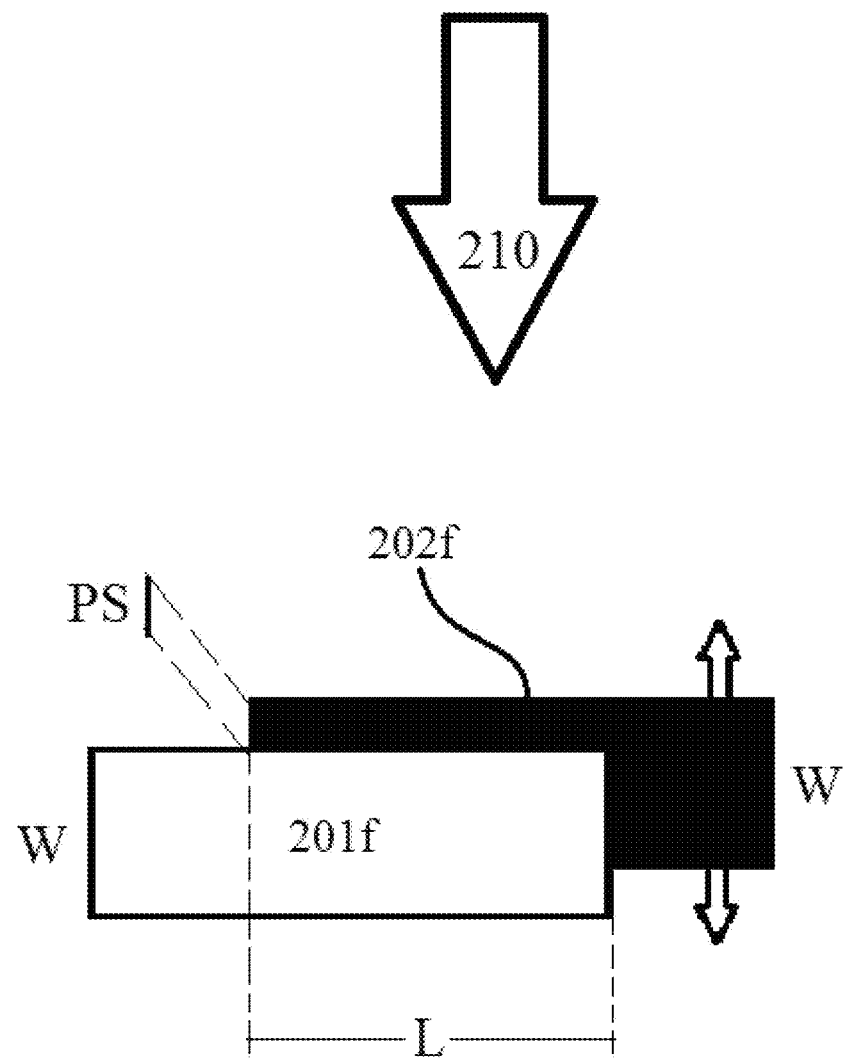
FIG. 7 depicts the spatial relationship between two working comb fingers of FIG. 6 in accordance with an exemplary embodiment of the present invention.

As shown in FIG. 7, each comb finger in working capacitive microphone 290 has a same width W measured along the primary working direction 210. However, comb fingers 201*f* and comb fingers 202*f* may have a positional shift PS along the primary working direction 210, in the absence of vibration caused by sound wave. For example, the vertical positional shift PS along direction 210 may be one third of the width W, PS=⅓ W. In other words, comb fingers 201*f* and comb fingers 202*f* have an overlap of ⅔W along direction 210, in the absence of vibration caused by sound wave. Motional device 300 may be fabricated in a similar way, mutatis mutandis.

Referring to FIGS. 6 and 7, working comb fingers 201*f* are fixed to the substrate, and working comb fingers 202*f* are integrated with membrane-shaped working membrane 202. When membrane 202 vibrates due to sound wave, fingers 202*f* move together with membrane 202. When the overlap area between two neighboring fingers 201*f* and 202*f*, or vertical positional shift PS, keeps changing along with this movement, the capacitance between them are changing according. Eventually, a capacitance change signal is detected. In contrast, reference membrane 202 (not shown) is designed to vibrate not in response to an impacting sound wave, but mainly or completely in response to acceleration, shaking, or vibration of the microphone 200.

Figure 8A:
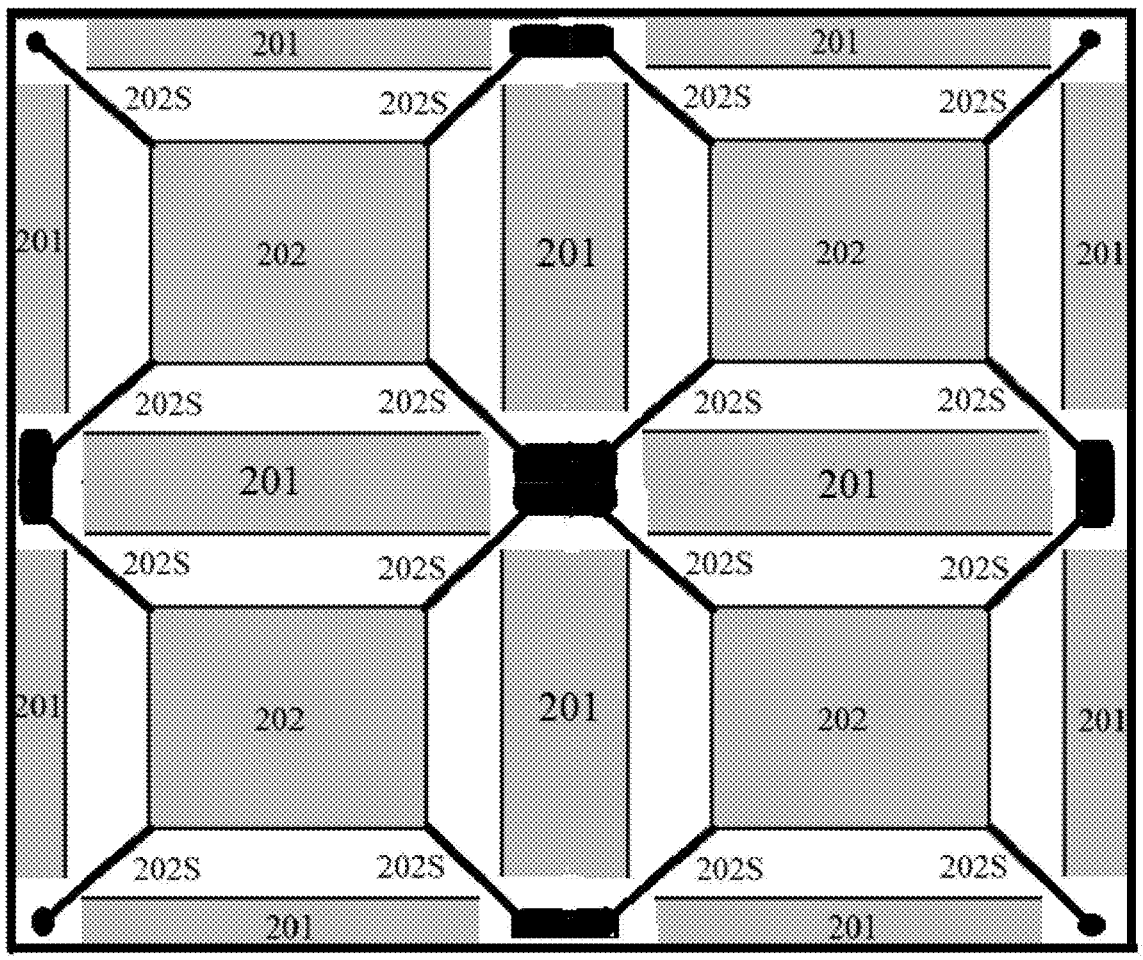
FIG. 8A illustrates a working capacitive microphone including four identical movable working membranes arranged in a 2×2 array configuration in a co-pending U.S. application filed by the same Applicants.
Figure 8B:
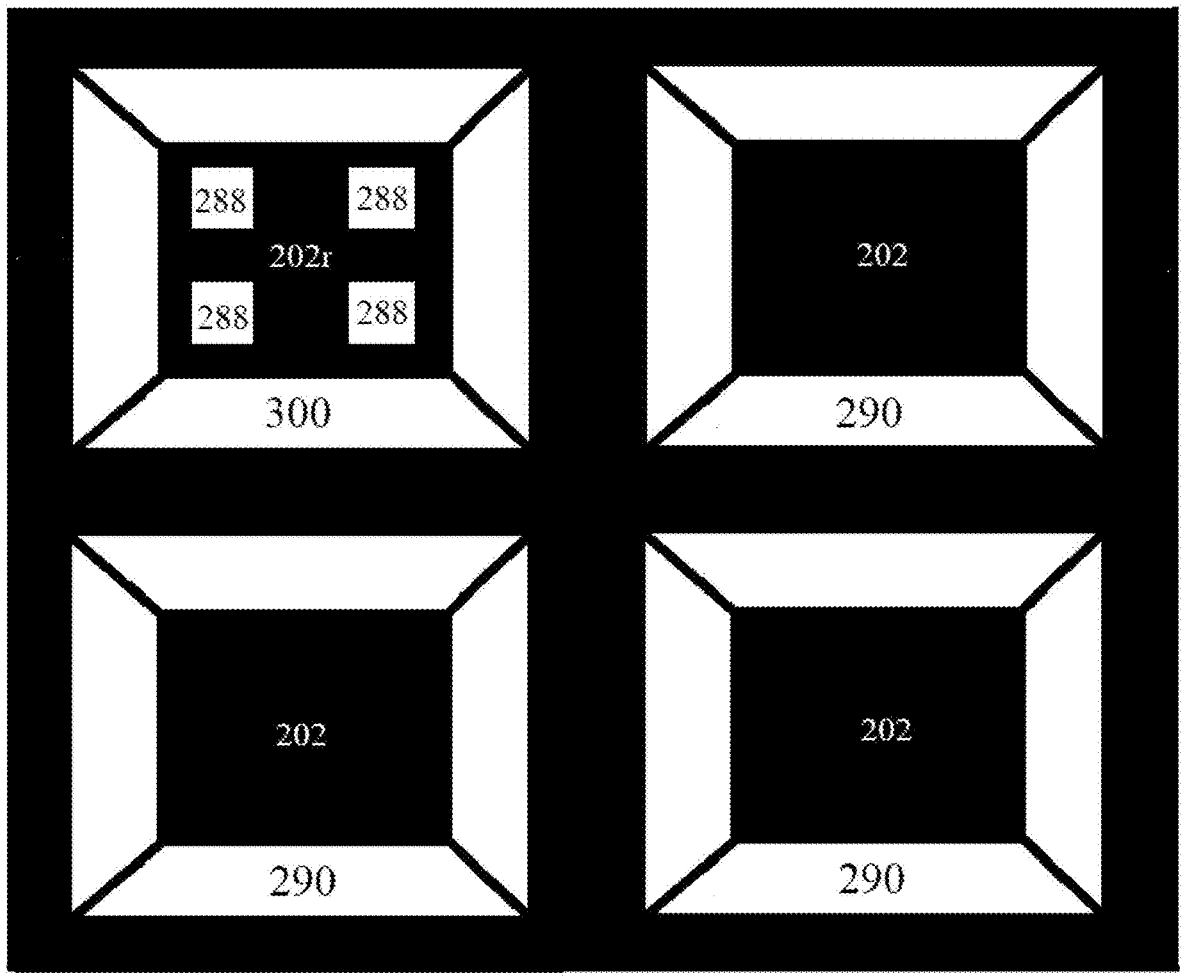
FIG. 8B shows a capacitive microphone including one movable reference membrane and three movable working membranes arranged in a 2×2 array configuration in accordance with an exemplary embodiment of the present invention.
Figure 8C:
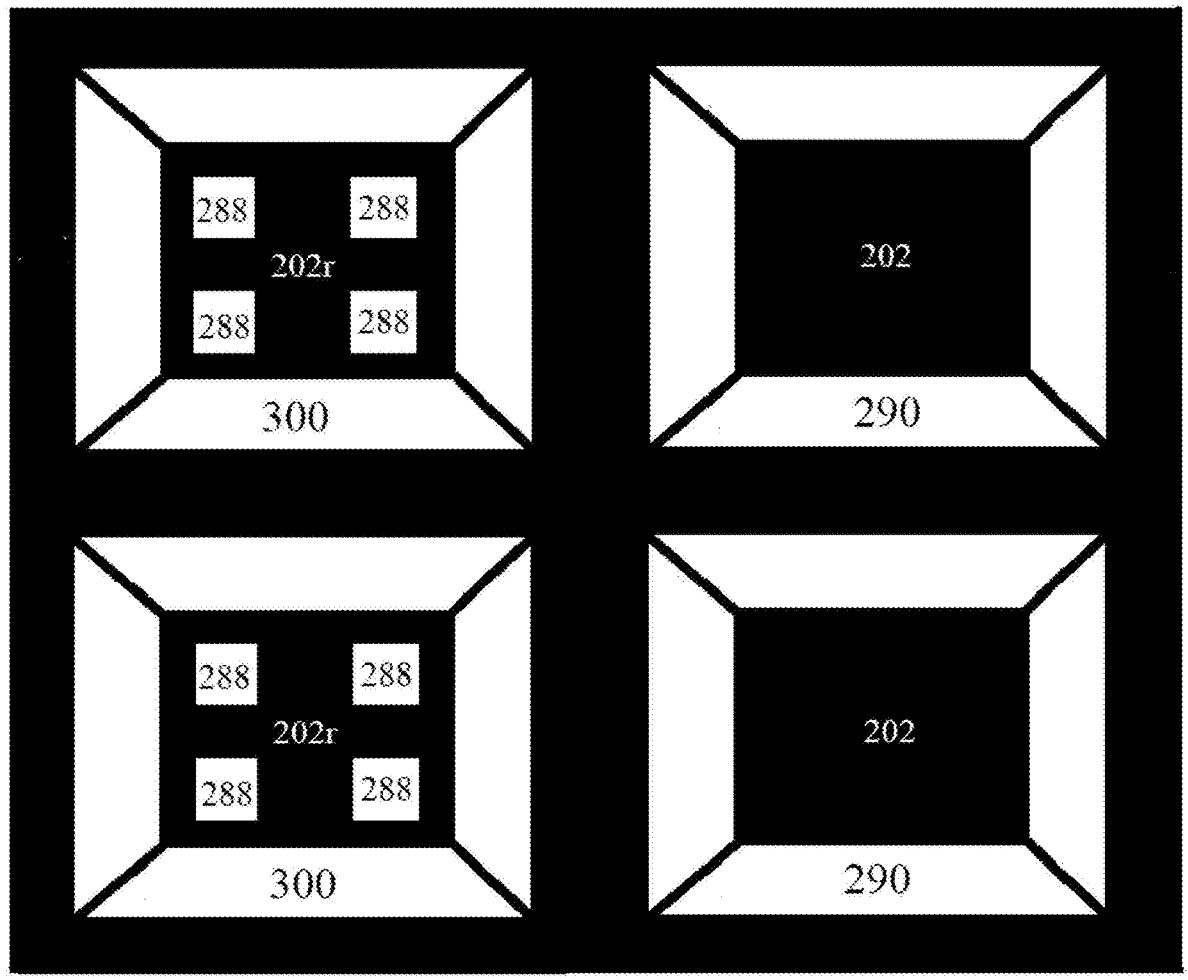
FIG. 8C shows a capacitive microphone including two movable reference membranes and two movable working membranes arranged in a 2×2 array configuration in accordance with an exemplary embodiment of the present invention.
Figure 8D:
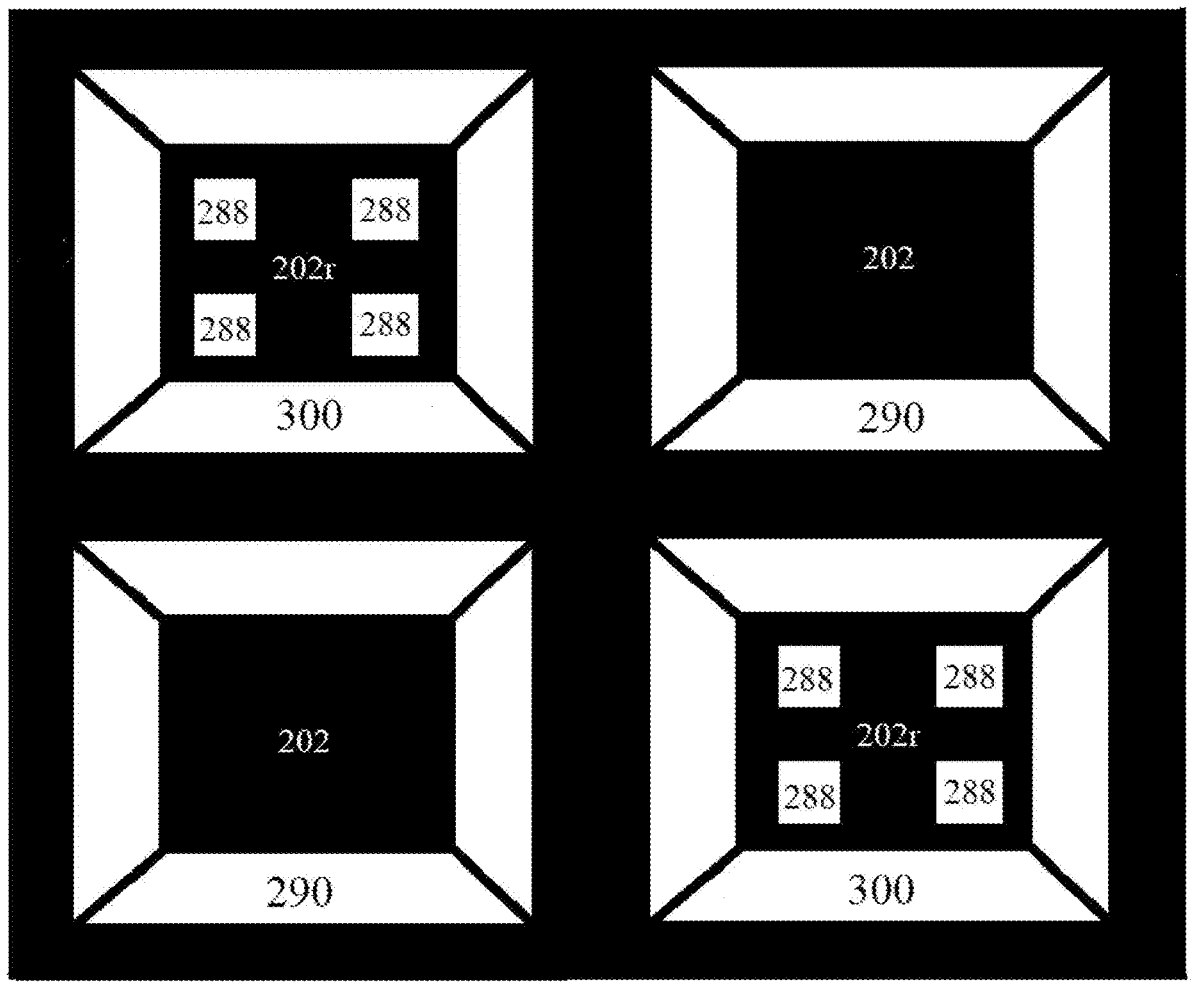
FIG. 8D shows another capacitive microphone including two movable reference membranes and two movable working membranes arranged in a 2×2 array configuration in accordance with an exemplary embodiment of the present invention.

As described in co-pending U.S. application Ser. No. 15/393,831, the movable working membrane 202 may have a shape of square. As shown in FIG. 8A, working capacitive microphone 290 may include one or more movable working membranes 202. For example, four identical membranes 202 can be arranged in a 2×2 array configuration. According to the present invention, one or two of the four working membranes 202 can be converted into reference membrane(s) 202*r* by fabricating or etching one or more opening(s) 288 thereon, e.g. four square leakage holes 288, for air ventilation. FIG. 8B shows a 2×2 array configuration that includes one reference membrane 202*r* and three working membranes 202. FIG. 8C and FIG. 8D show two 2×2 array configurations that each includes two reference membranes 202*r* and two working membranes 202.

Figure 9:
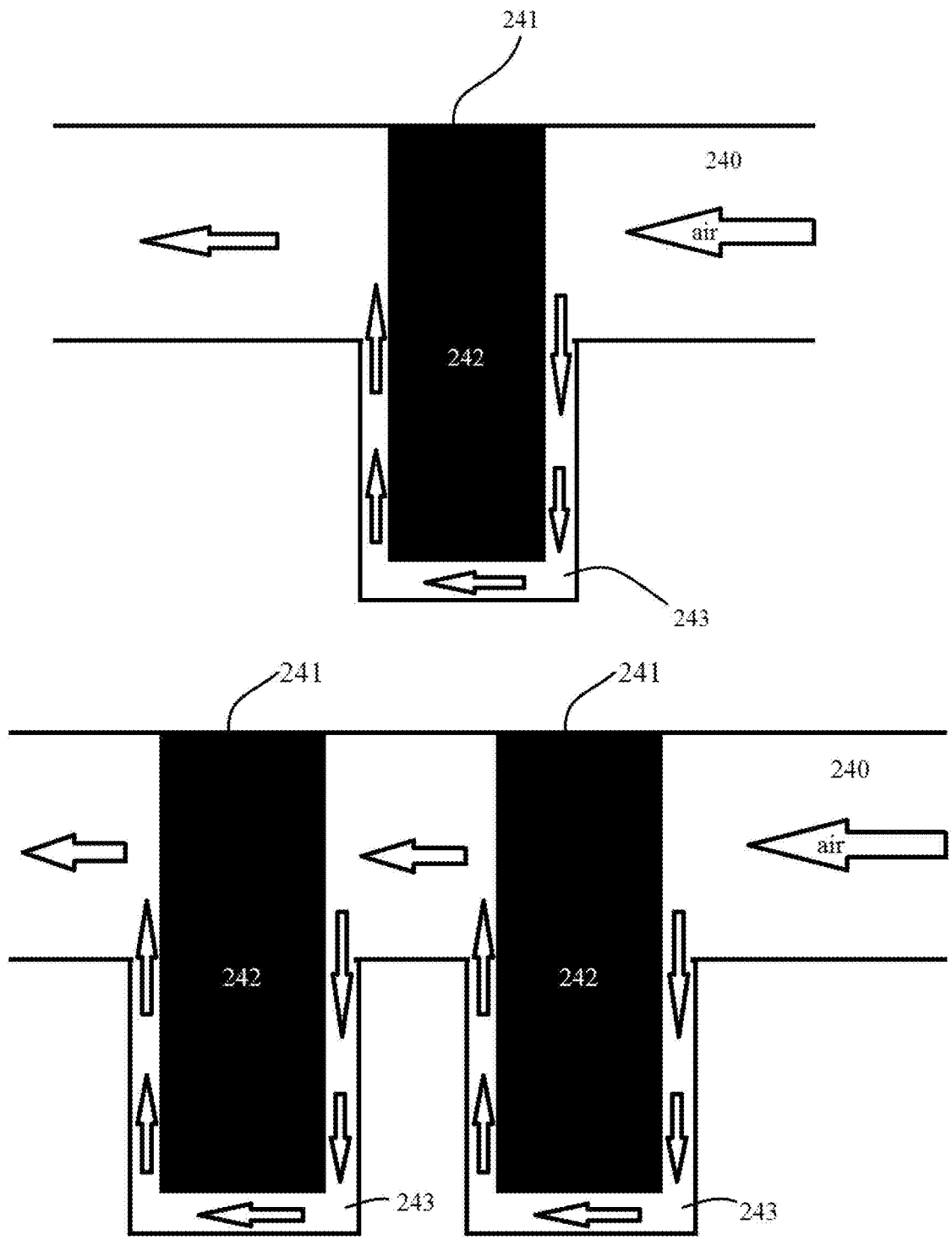
FIG. 9 demonstrates the design of one or more such as two air flow restrictors in accordance with an exemplary embodiment of the present invention.

In some embodiments as shown in FIG. 9, working capacitive microphone 290 of the invention comprises one or more such as two air flow working restrictors 241 that restrict the flow rate of air that flows in/out of the gap between the working membrane 202 and the substrate 230. Restrictors 241 may be designed to decrease the size of a working air channel 240 for the air to flow in/out of the gap. Alternatively or additionally, restrictors 241 may increase the length of the working air channel 240 for the air to flow in/out of the gap. For example, restrictors 241 may comprise a working insert 242 into a working trench 243, which not only decreases the size of air channel 240, but also increases the length of the air channel 240. Motional device 300 may be fabricated in a similar way, mutatis mutandis.

Figure 1A:
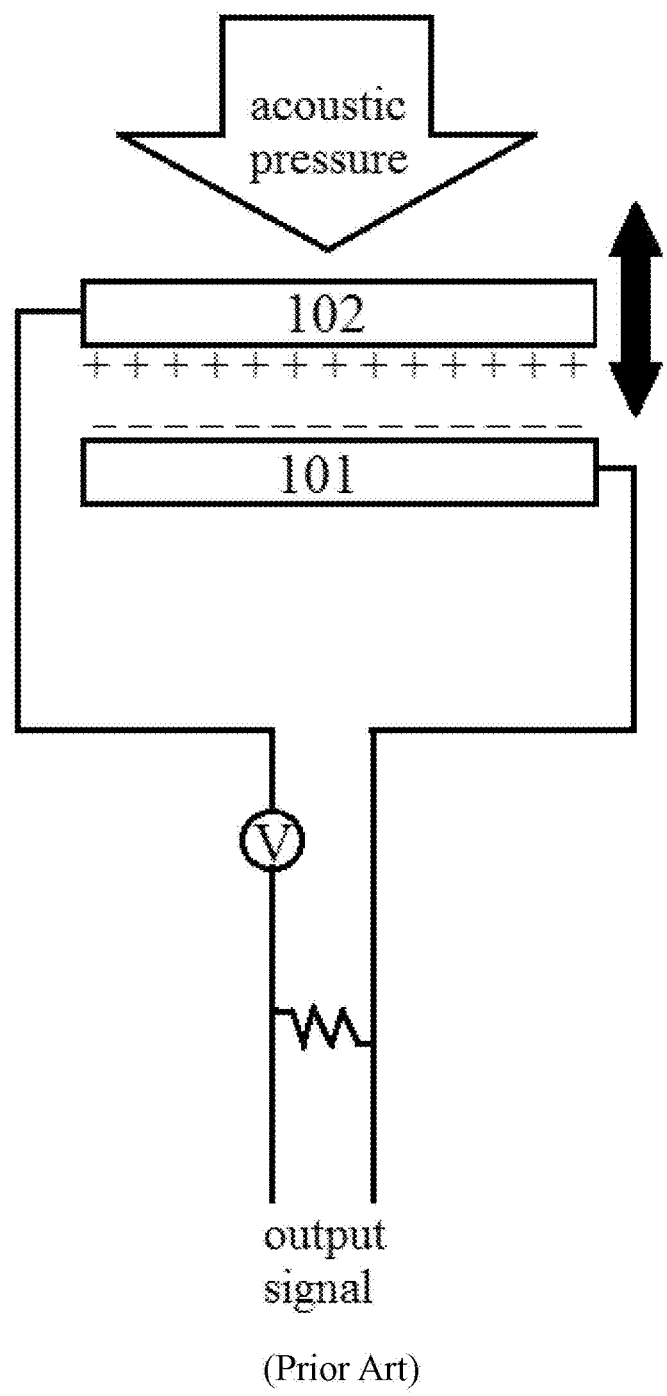
FIG. 1A shows a conventional capacitive microphone in the prior art.
Figure 1B:
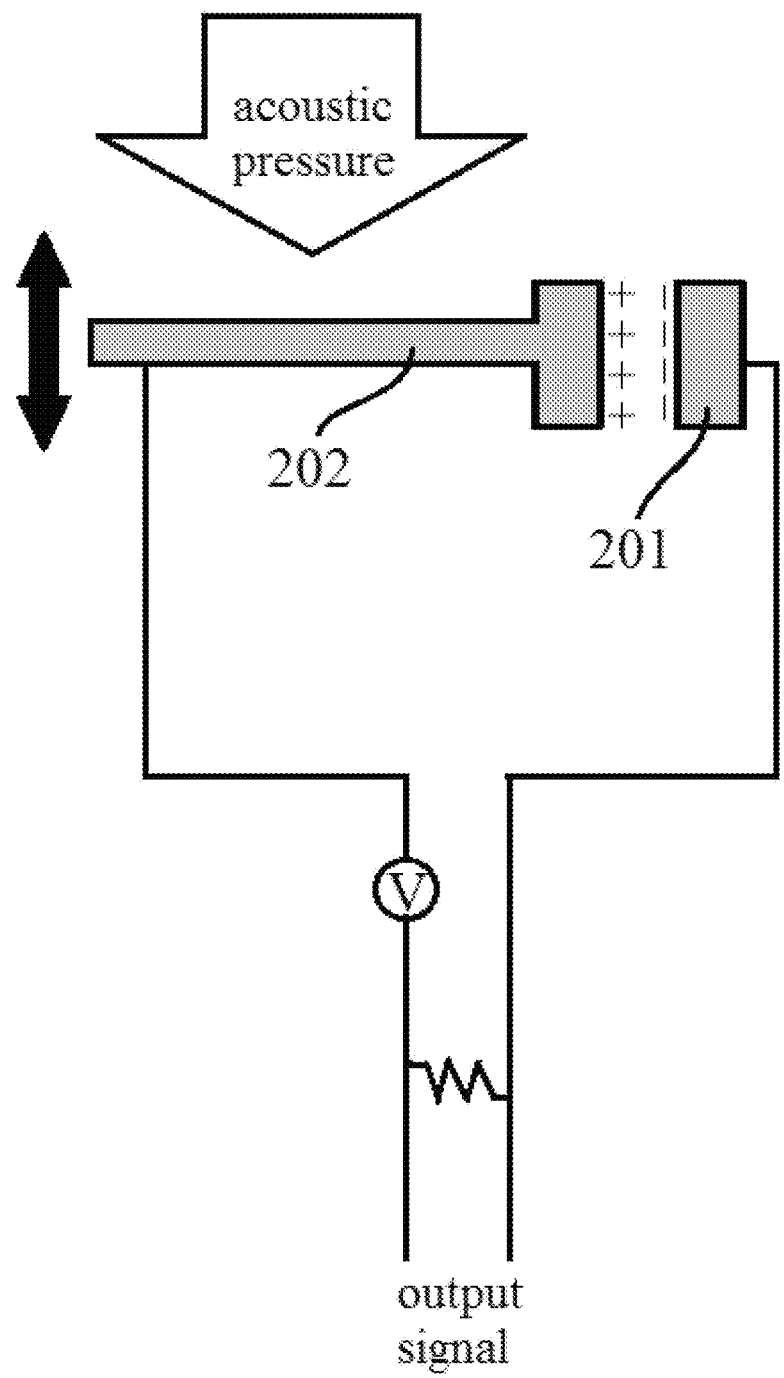
FIG. 1B illustrates a lateral mode capacitive microphone in a co-pending U.S. application filed by the same Applicants.
Figure 1C:
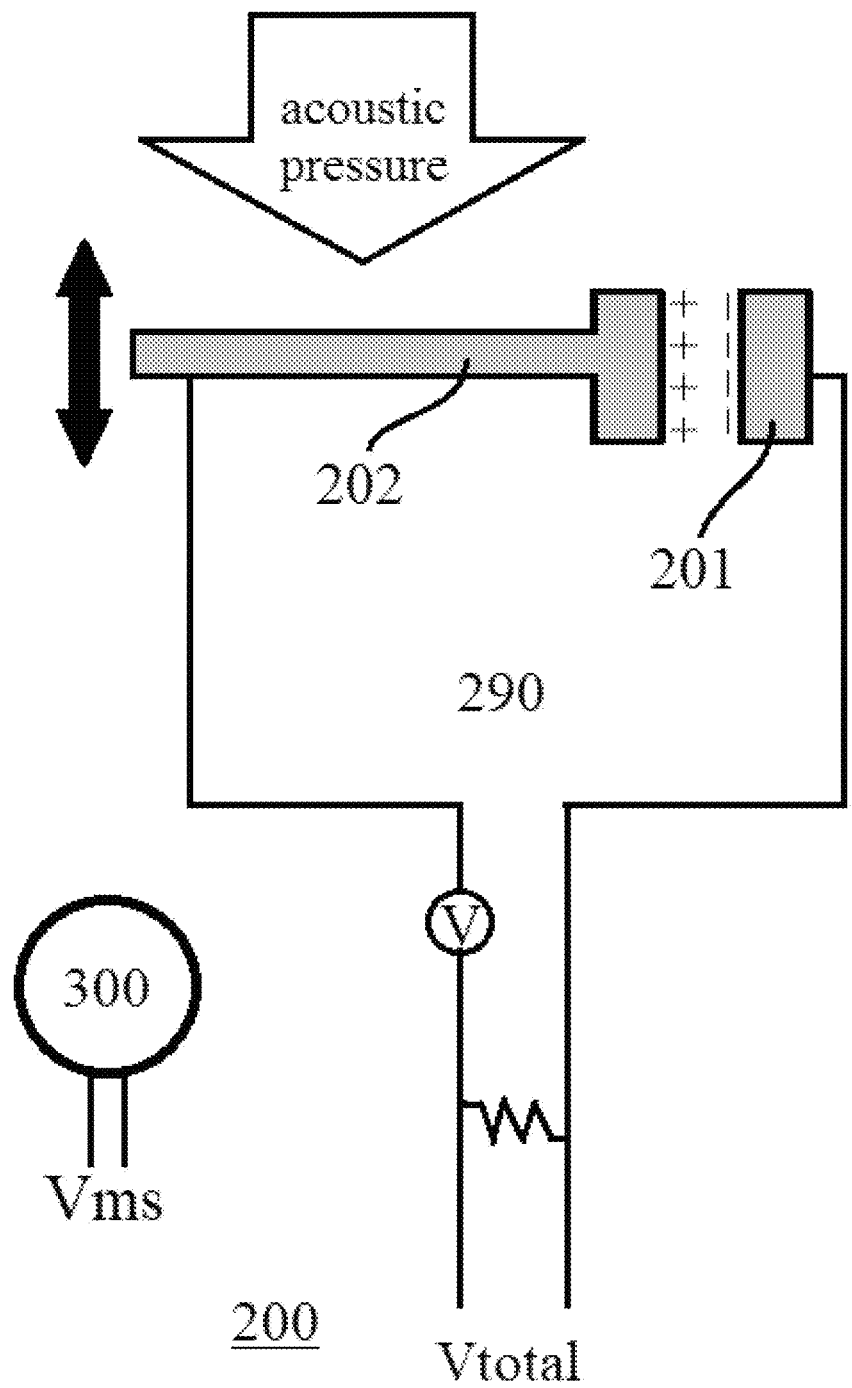
FIG. 1C illustrates another lateral mode capacitive microphone in a co-pending U.S. application filed by the same Applicants.
Figure 1D:
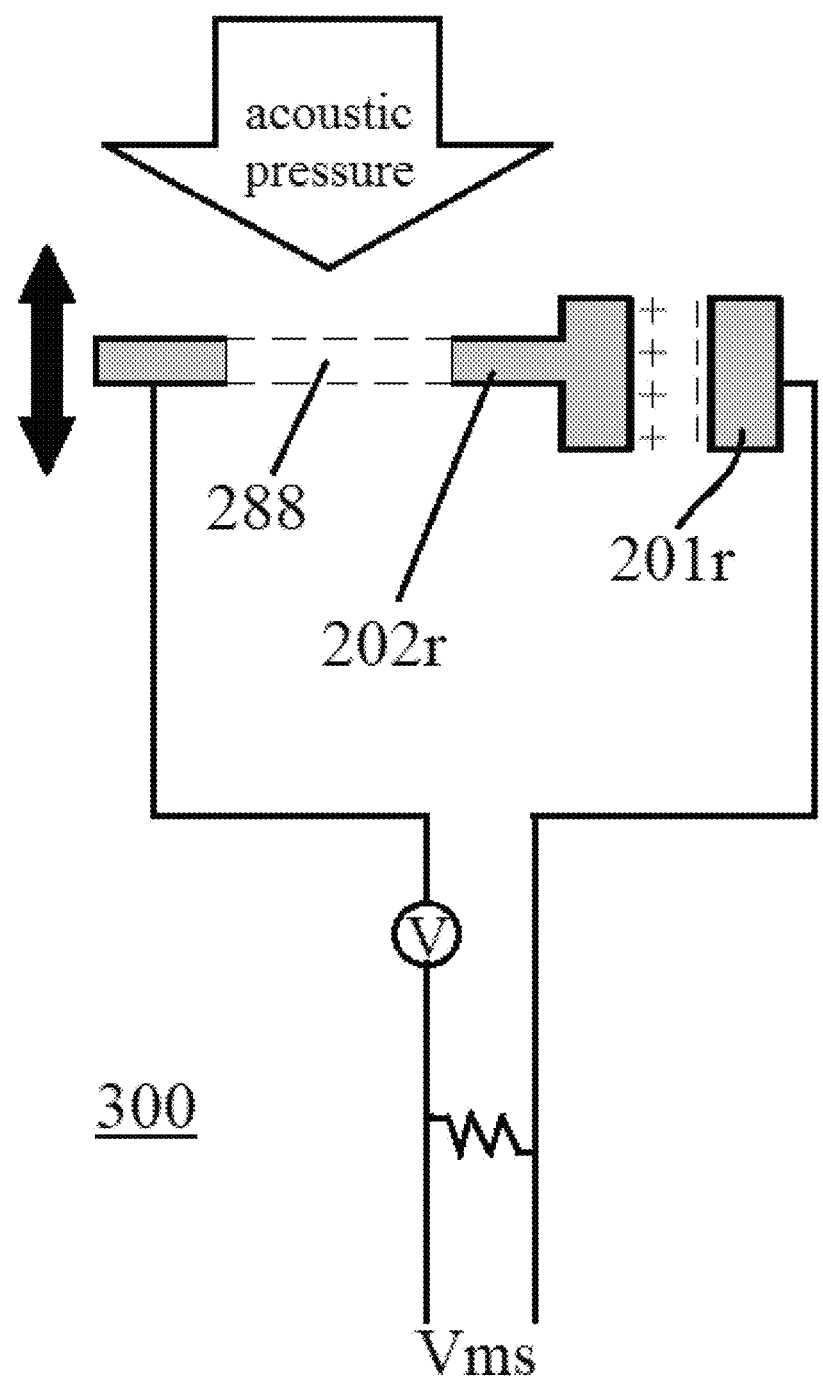
FIG. 1D illustrates an exemplary motional sensor in the lateral mode capacitive microphone of FIG. 1C.

Air flow working restrictors can help solve the leakage problem associated with microphone design. In conventional parallel plate design as shown in FIG. 1A, it typically has a couple of tiny holes around the edge in order to let air go through slowly, to keep air pressure balance on both sides of membrane 101 in low frequency. That is a desired leakage. However, a large leakage is undesired, because it will let some low frequency sound wave escape away from membrane vibration easily via the holes, and will result in a sensitivity drop in low frequency.

In order to prevent this large leakage, a structure is designed and shown in FIG. 9, which illustrates a leakage prevent trench/groove/slot/recess and an insert or a wall. Referring back to FIG. 9, working air flow restrictors 241 may function as a structure for preventing air leakage in the microphone 200 of the invention. Air flow restrictor 241 comprises an insert 242 into a groove 243, which not only decreases the size of an air channel 240, but also increases the length of the air channel 240. In MEMS microphones, a deep slot may be etched on substrate around the edge of square membrane 202 and then an inserting wall 242 connected to membrane 202 is deposited to form a long and narrow air tube 240, which gives a large acoustic resistance. The level of the air resistance may be controlled by the slot depth etched on the substrate. The deeper slot, the higher the resistance.

Figure 10:
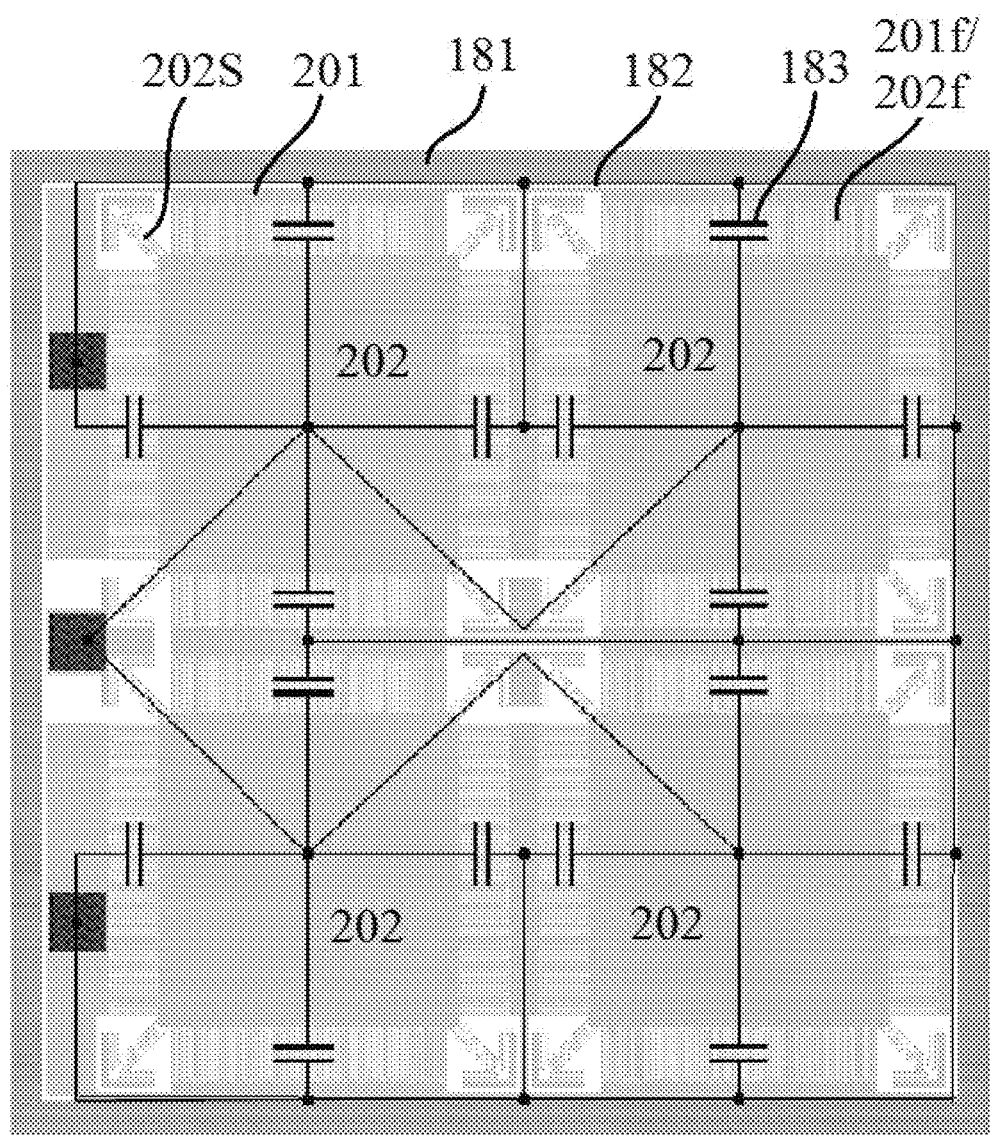
FIG. 10 illustrates that 4 single dies are arranged as an array device superimposed with the equivalent circuit thereof in accordance with an exemplary embodiment of the present invention.

An embodiment of FIG. 8A is shown in FIG. 10, in which 4 single dies are arranged as an array device superimposed with the equivalent circuit thereof. The chip space is more efficiently used and the performance is further improved. This array die may have a dimension of 1238×1178 μm, including dicing street 181, and equivalent circuit 182 including equivalent capacitors 183. Similar embodiments of FIGS. 8B, 8C and 8D can be fabricated mutatis mutandis.

Figure 11:
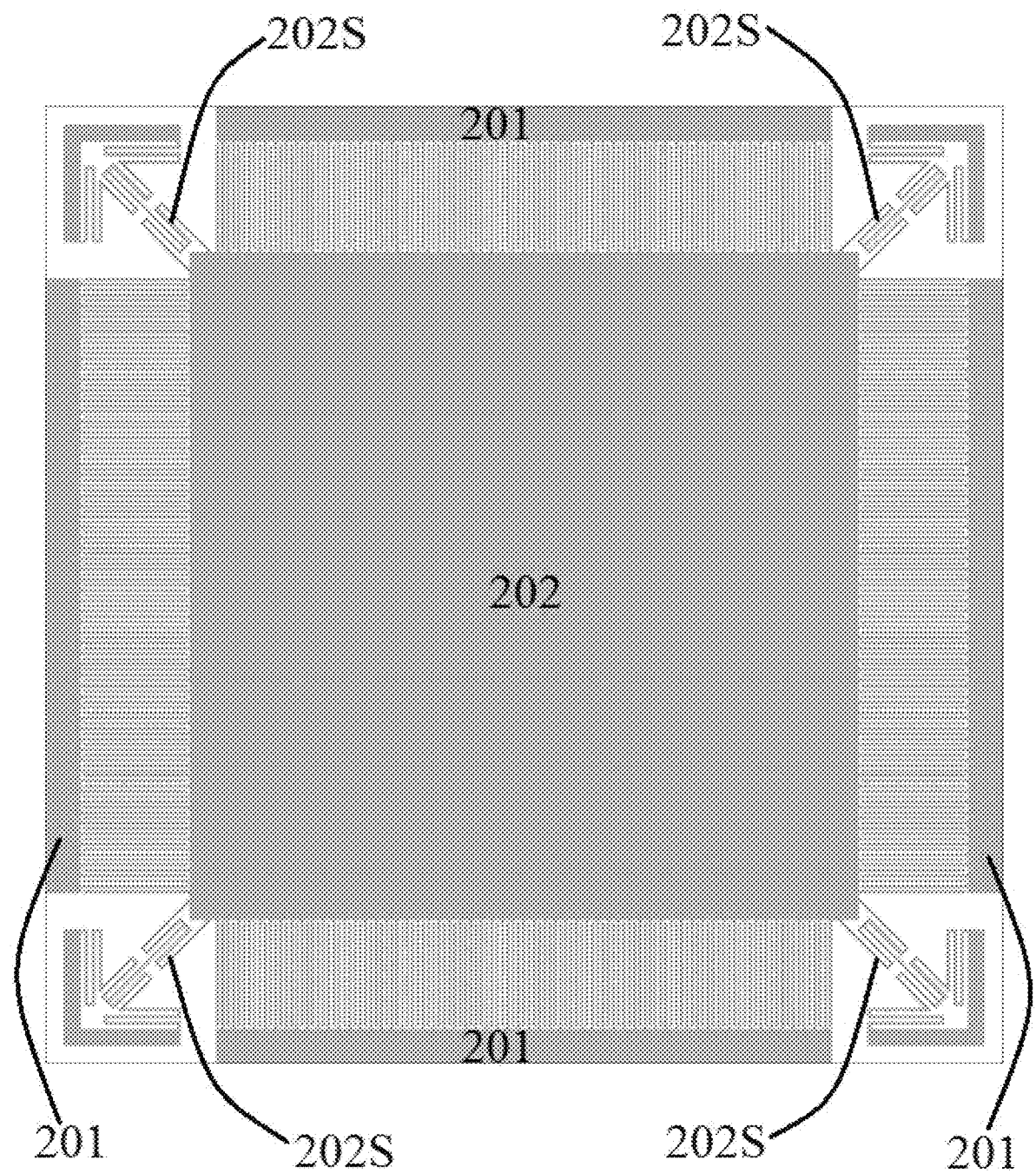
FIG. 11 illustrates the configuration of comb fingers, membrane and suspensions in accordance with an exemplary embodiment of the present invention.

FIG. 11 illustrates the configuration of working comb fingers, working membrane and working suspensions in accordance with an exemplary embodiment of the present invention. FIG. 11 shows the basic layout of a single die, top view of working comb fingers 201*f* and 202*f*, membrane 202 and suspensions 202S. Each side of a square membrane 202 has 60 pairs of comb fingers 202*f* connected thereto. With 2 μm width of a working comb finger and 1 μm space between fingers, square membrane 202 may need a 380 μm side length. Motional device 300 may be fabricated in a similar way, mutatis mutandis.

Figure 12:
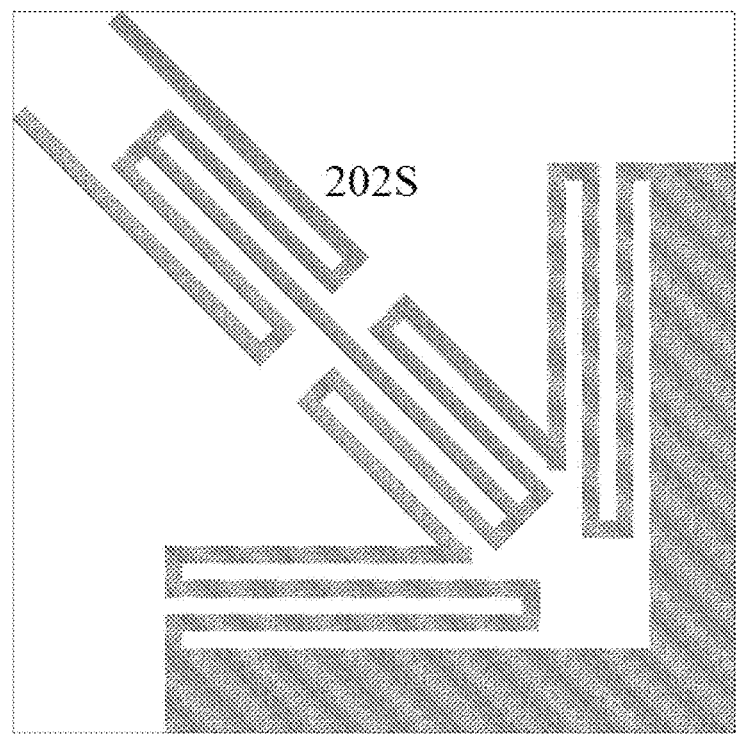
FIG. 12 schematically illustrates a suspension spring with folded and symmetrical cantilevers in accordance with an exemplary embodiment of the present invention.
Figure 12:
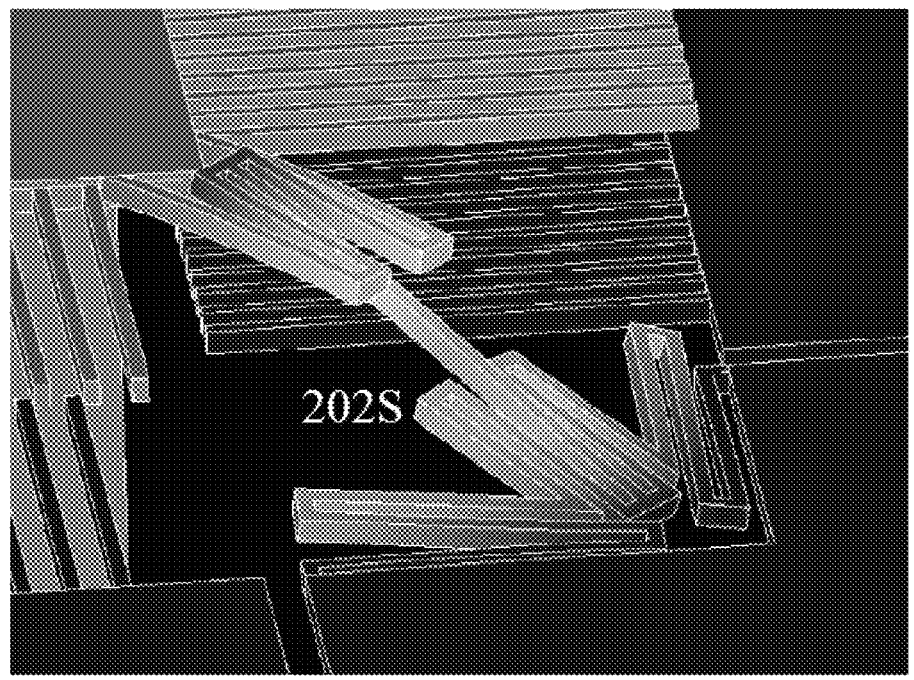

Working suspensions 202S may be designed to support working membrane 202 so that it can vibrate vertically, i.e. along primary working direction 210. It needs to have a suitable spring constant and keeps membrane 202 as flat as possible when moving. FIG. 12 (upper panel) shows a suspension spring 202S with folded and symmetrical cantilevers. The spring 202S contains two folded parts as rotation axis. FIG. 12 (lower panel) shows a suspension spring when bending. When the spring 202S becomes bending, it looks like "frog legs", making membrane 202 move vertically and keep flat in a very small corner area. Motional device 300 may be fabricated in a similar way, mutatis mutandis.

The process of the invention can be accomplished using surface micromachining techniques, bulk micromachining techniques, high aspect ratio (HAR) silicon micromachining, and semiconductor processing techniques etc.

Surface micromachining creates structures on top of a substrate using a succession of thin film deposition and selective etching. Generally, polysilicon is used as one of the layers and silicon dioxide is used as a sacrificial layer which is removed or etched out to create the necessary void in the thickness direction. Added layers are generally very thin with their size varying from 2-5 micrometers. A main advantage is realizing monolithic microsystems in which the electronic and the mechanical components (functions) are built in on the same substrate. As the structures are built on top of the substrate and not inside it, the substrate's properties are not as important as in bulk micromachining, and the expensive silicon wafers can be replaced by cheaper substrates, such as glass, plastic, PET substrate, or other non-rigid materials. The size of the substrates can also be much larger than a silicon wafer.

Complicated components, such as movable parts, are built using a sacrificial layer. For example, a suspended cantilever can be built by depositing and structuring a sacrificial layer, which is then selectively removed at the locations where the future beams must be attached to the substrate (i.e. the anchor points). The structural layer is then deposited on top of the polymer and structured to define the beams. Finally, the sacrificial layer is removed to release the beams, using a selective etch process that will not damage the structural layer. There are many possible combinations of structural/sacrificial layer. The combination chosen depends on the process. For example it is important for the structural layer not to be damaged by the process used to remove the sacrificial layer.

Bulk micromachining produces structures inside a substrate by selectively etching inside the substrate. Bulk micromachining starts with a silicon wafer or other substrates which is selectively etched, using photolithography to transfer a pattern from a mask to the surface. Bulk micromachining can be performed with wet or dry etches, although the most common etch in silicon is the anisotropic wet etch. This etch takes advantage of the fact that silicon has a crystal structure, which means its atoms are all arranged periodically in lines and planes. Certain planes have weaker bonds and are more susceptible to etching. The etch results in pits that have angled walls, with the angle being a function of the crystal orientation of the substrate.

Silicon wafer can be anisotropically wet etched, forming highly regular structures. Wet etching typically uses alkaline liquid solvents, such as potassium hydroxide (KOH) or tetramethylammonium hydroxide (TMAH) to dissolve silicon which has been left exposed by the photolithography masking step. These alkali solvents dissolve the silicon in a highly anisotropic way, with some crystallographic orientations dissolving up to 1000 times faster than others. Such an approach is often used with very specific crystallographic orientations in the raw silicon to produce V-shaped grooves. The surface of these grooves can be atomically smooth if the etch is carried out correctly, and the dimensions and angles can be precisely defined.

In various embodiments of the invention, the microphone is made using a MEMS manufacturing process. Materials for the process include silicon, polymers, metals, and ceramics etc. Deposition processes can be carried out using physical deposition and chemical deposition. Patterning can be carried out using lithography, electron beam lithography, ion beam lithography, ion track technology, X-ray lithography, and diamond patterning. Wet etching can be carried out using isotropic etching, anisotropic etching, HF etching, and electrochemical etching. Dry etching can be carried out using vapor etching (e.g. xenon difluoride) and plasma etching (e.g. sputtering and reactive ion etching (RIE)).

Figure 13:
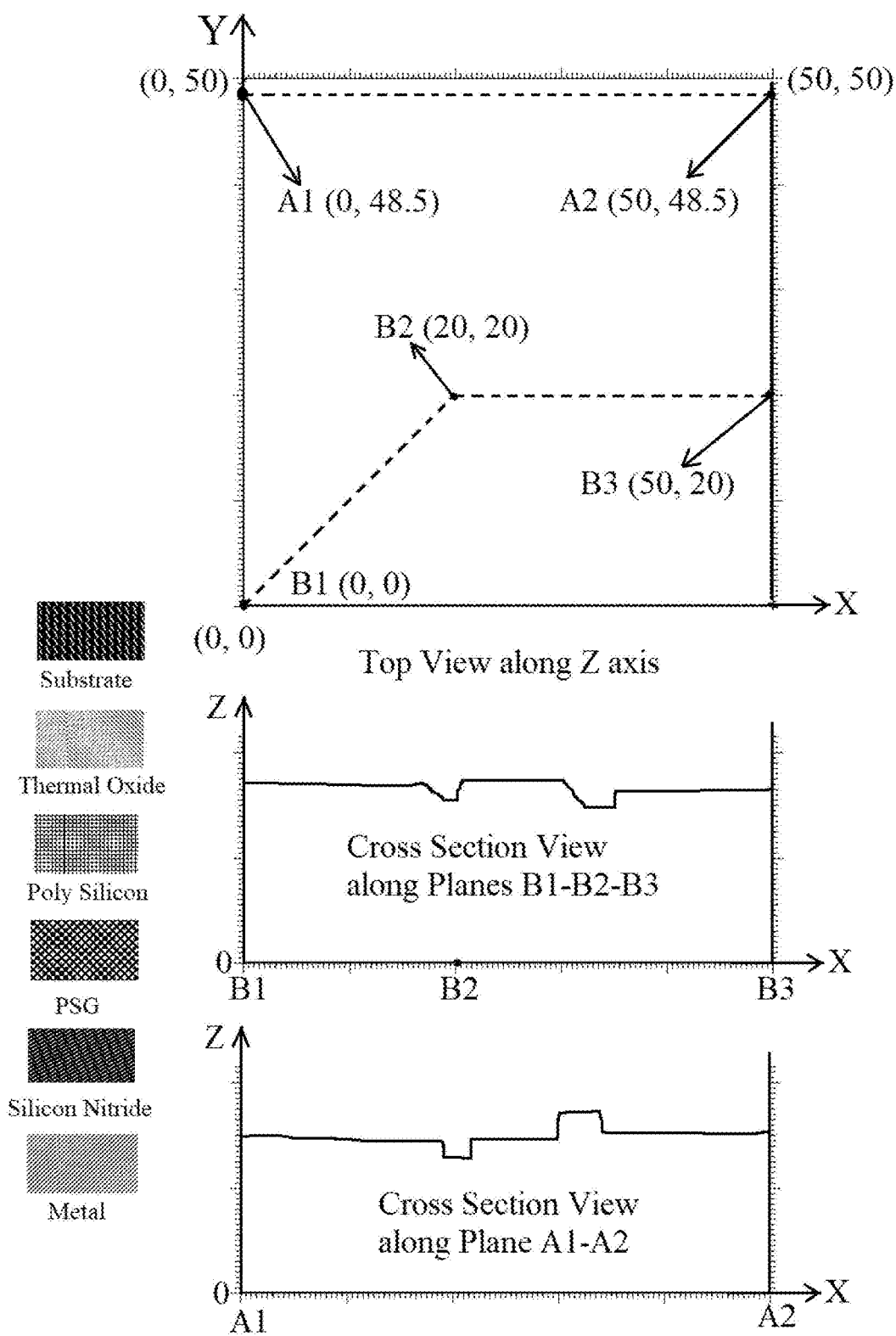
FIG. 13 illustrates the texture representation of six materials and diagram of several views appeared in the processes of FIGS. 14-36C2 in accordance with an exemplary embodiment of the present invention.
Figure 14:
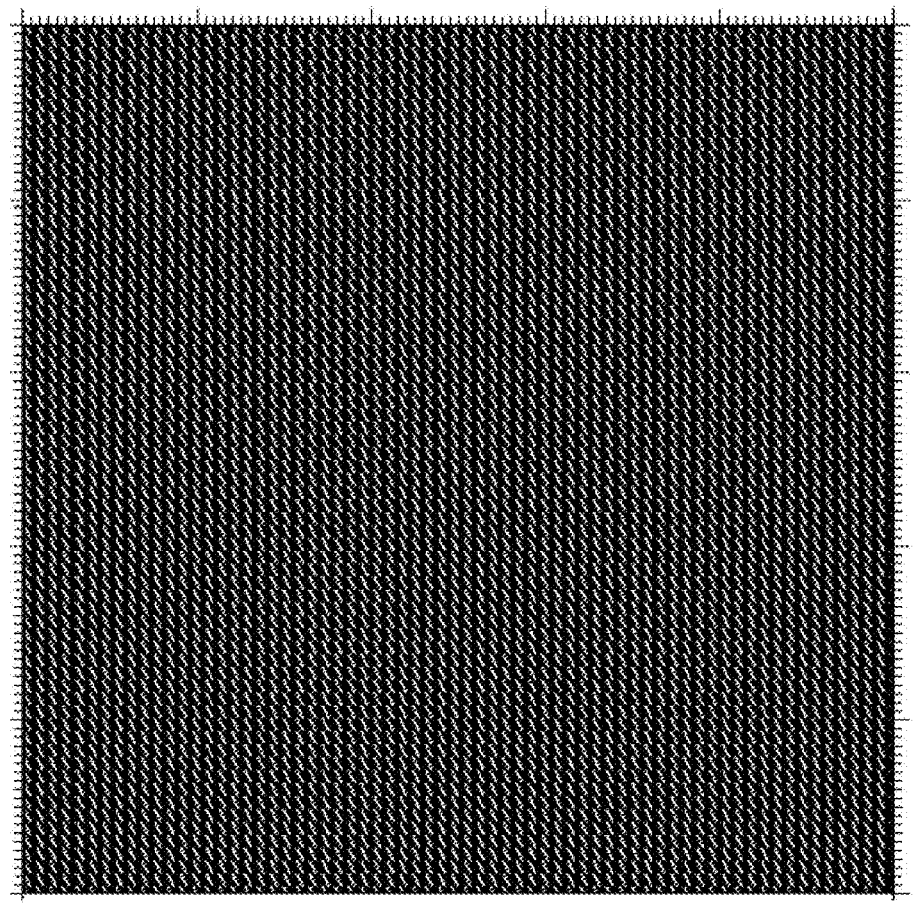
FIG. 14 shows a step of providing a working/reference substrate.
Figure 14:
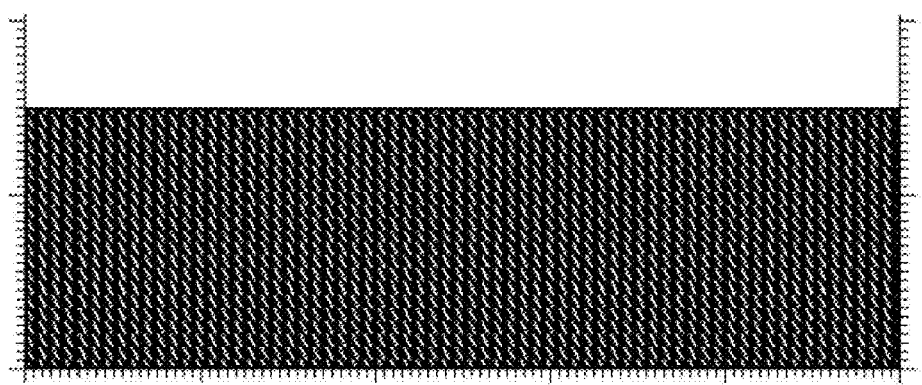

In the following FIGS. 13-36C2, an exemplary process for making the capacitive microphone of the invention will be illustrated and described in more details. Six different materials are used in the process: substrate (silicon), thermal oxide (e.g. silicon dioxide), poly silicon, phosphosilicate glass (PSG), silicon nitride, and metal. FIG. 13 illustrates the texture representation of these six materials and diagram of several views appeared in FIGS. 14-36C2. Referring to FIG. 13, the working/reference/common substrate such as Silicon has a planar working/reference surface represented as (X, Y) plane in a 3D coordinate system with arbitrary unit (AU). For example, the major tick may be 10 UM, and minor tick may be 0.5 UM. Z axis is therefore extending along the primary working/reference direction that is perpendicular to the (X, Y) plane. "Top Views along Z axis" in all FIGS. 14-36C2 represent a square area on (X, Y) plane with a dimension of 50 AU times 50 AU. The four corners of the square have coordinates (0, 0), (0, 50), (50, 50) and (50, 0). All top views along Z axis in FIGS. 14-36C2 represent the square with four corners (0, 0), (0, 50), (50, 50) and (50, 0). Therefore, all top views have the same size and orientation, despite that a top view may appear bigger or smaller than another. Plane A1-A2 contains two points (0, 48.5, 0) and (48.5, 50, 0), and is in parallel to Z-axis. Plane B1-B2 contains two points (0, 0, 0) and (20, 20, 0), and is in parallel to Z-axis. Plane B2-B3 contains two points (20, 20, 0) and (50, 20, 0), and is in parallel to Z-axis. Planes B1-B2-B3 is defined as a bended plane that starts as plane B1-B2, stops at (20, 20) line, and extends into plane B2-B3. Therefore, cross section view along planes B1-B2-B3 in FIG. 13 should be appreciated as cross section view along plane B1-B2 as projected on X-Z plane, combined with normal section view along plane B2-B3. In FIGS. 14-36C2, all cross section views along plane A1-A2 and planes B1-B2-B3 have the same length of 50 AU (from X=0 to X=50 AU) along X axis, despite that one cross section view may appear bigger or smaller than another.

Figure 15:
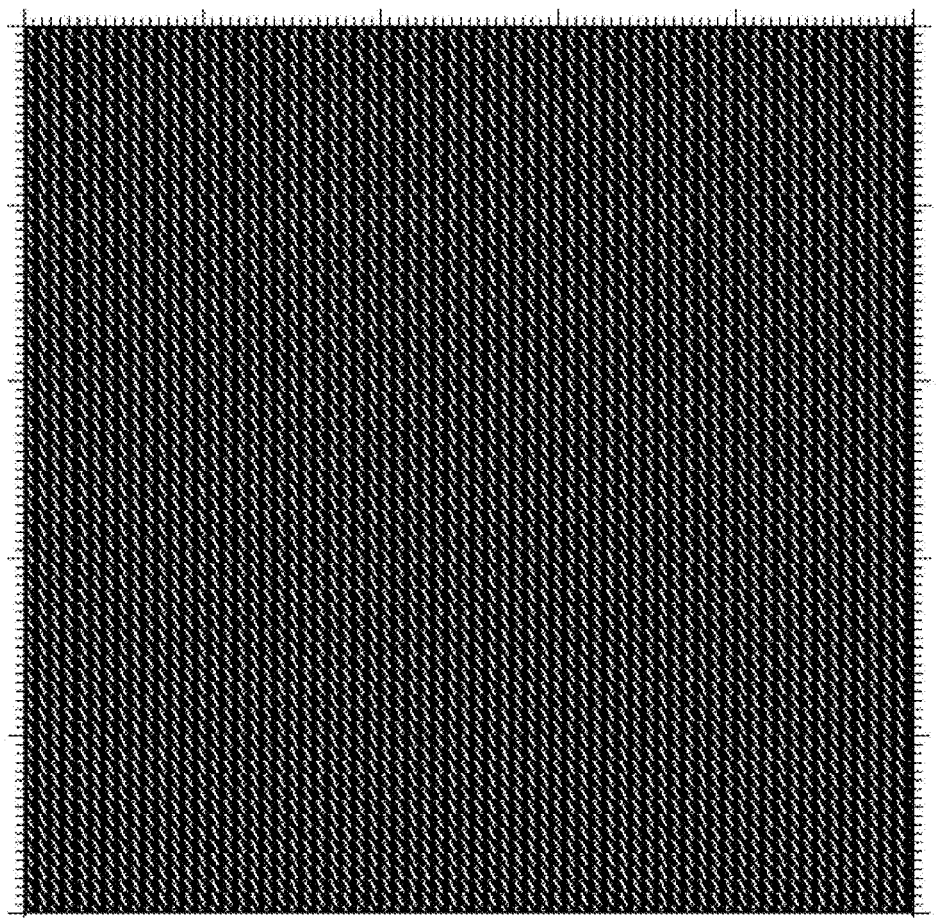
FIG. 15 illustrates deep reactive ion etching (DRIE) on the substrate.
Figure 15:
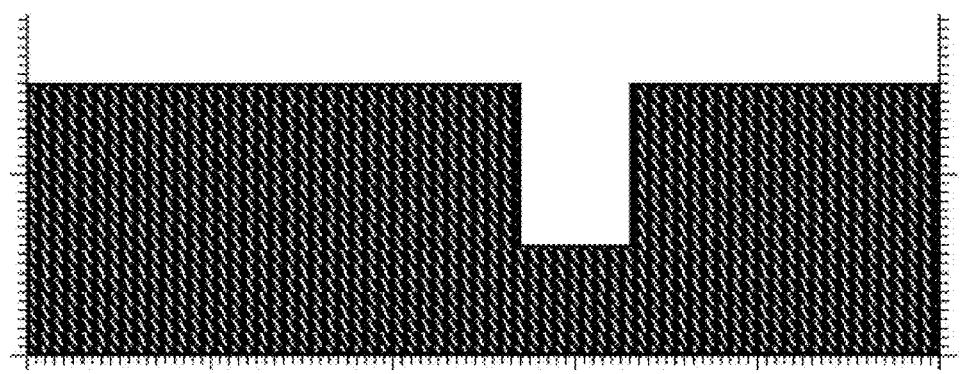
Figure 16:
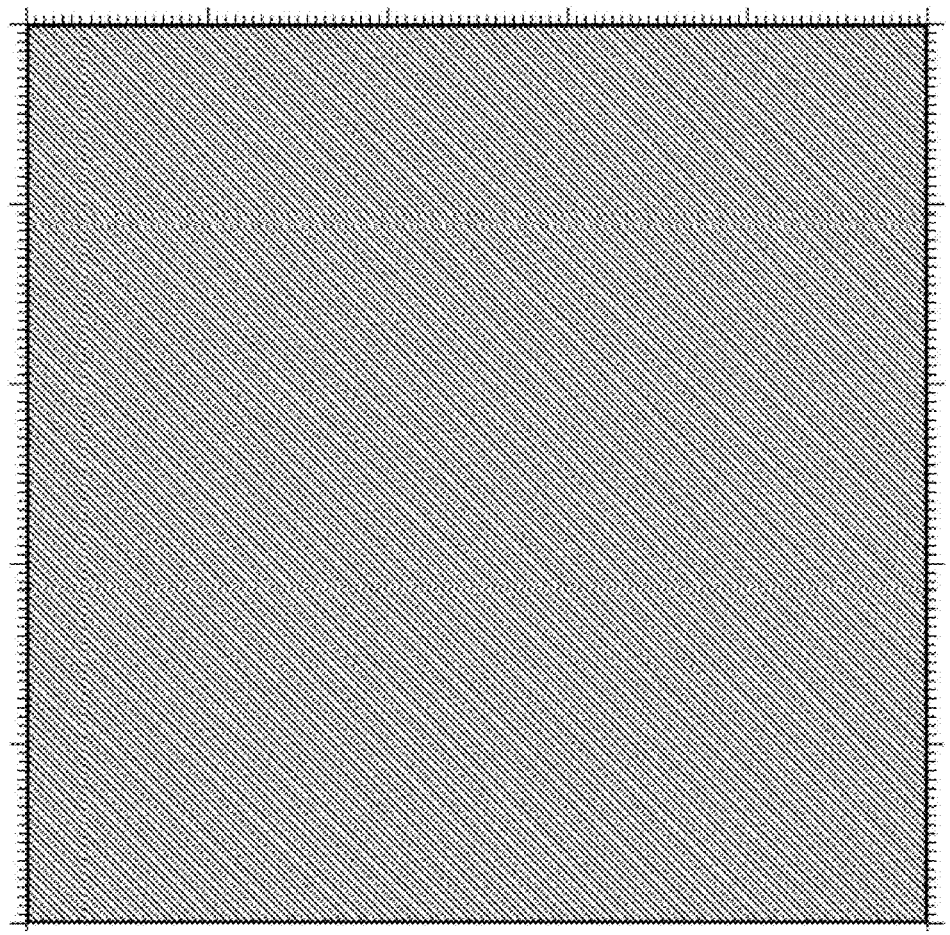
FIG. 16 illustrates the step of depositing at least one removable layer (such as silicon dioxide) on the substrate.
Figure 16:
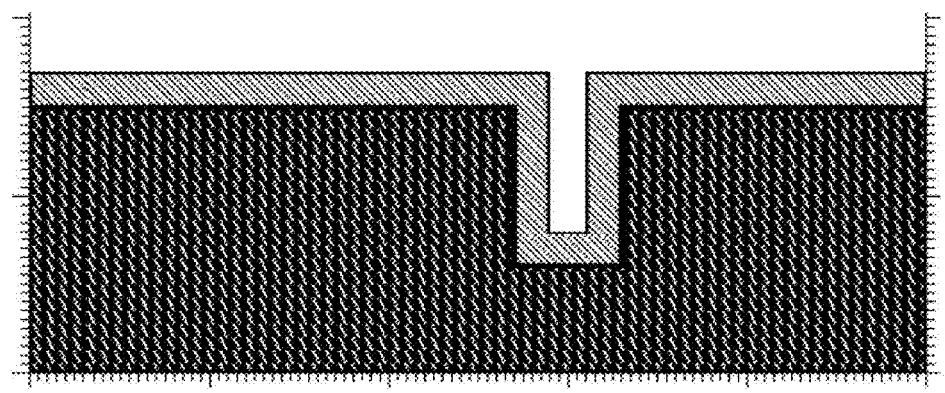
Figure 17:
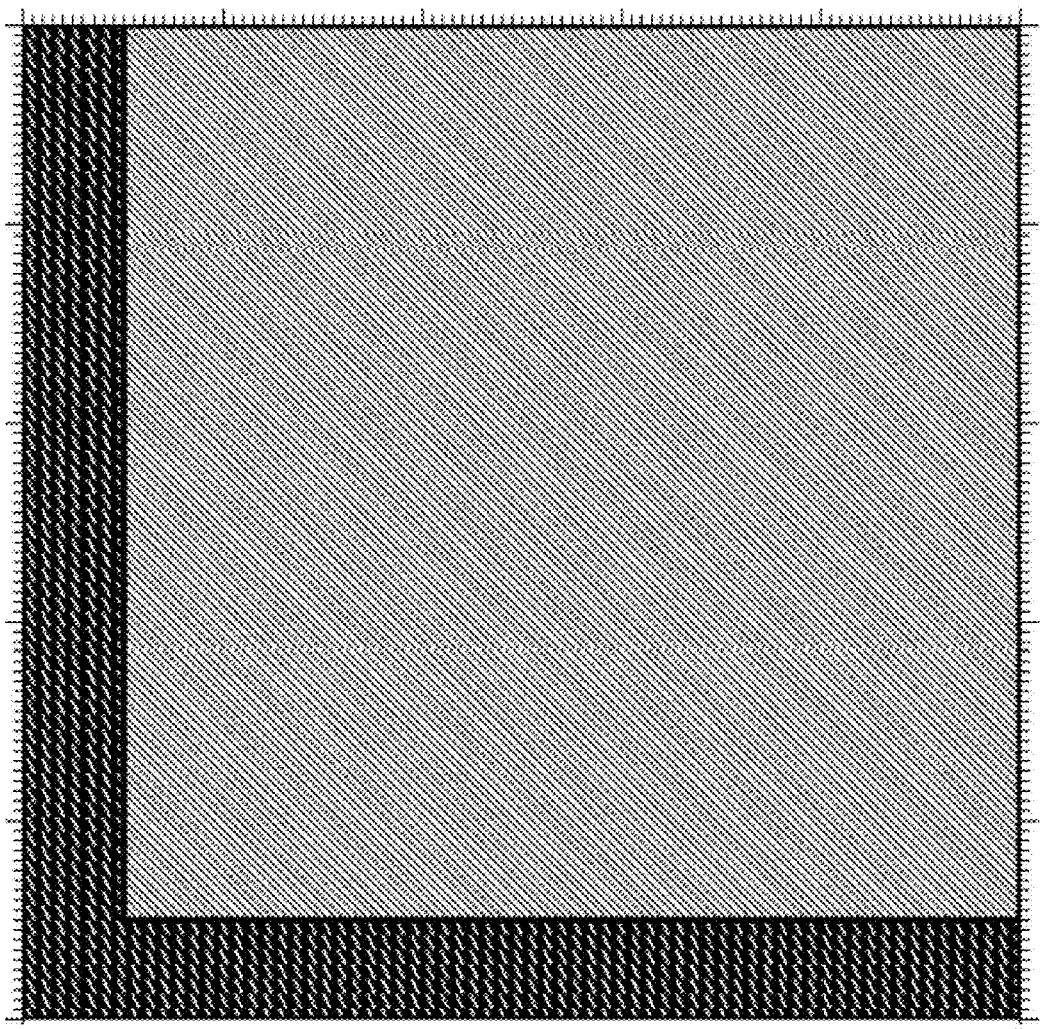
FIG. 17 illustrates the step of etching a silicon dioxide layer.
Figure 17:
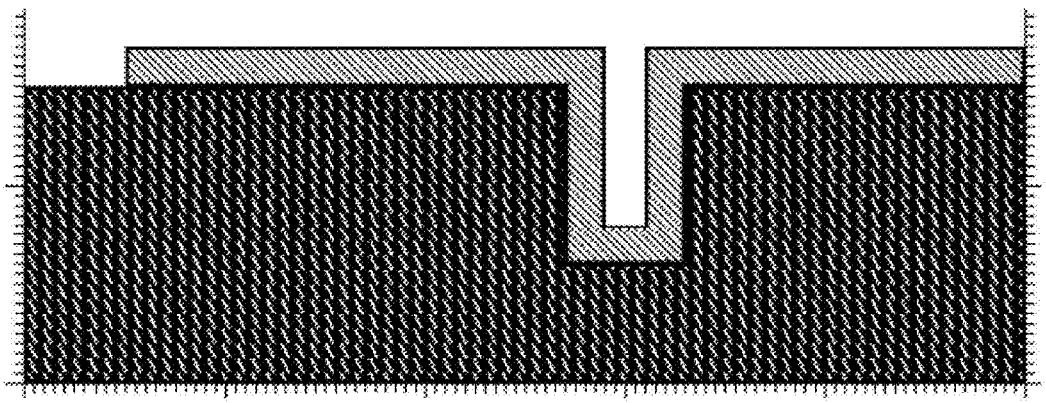
Figure 18:
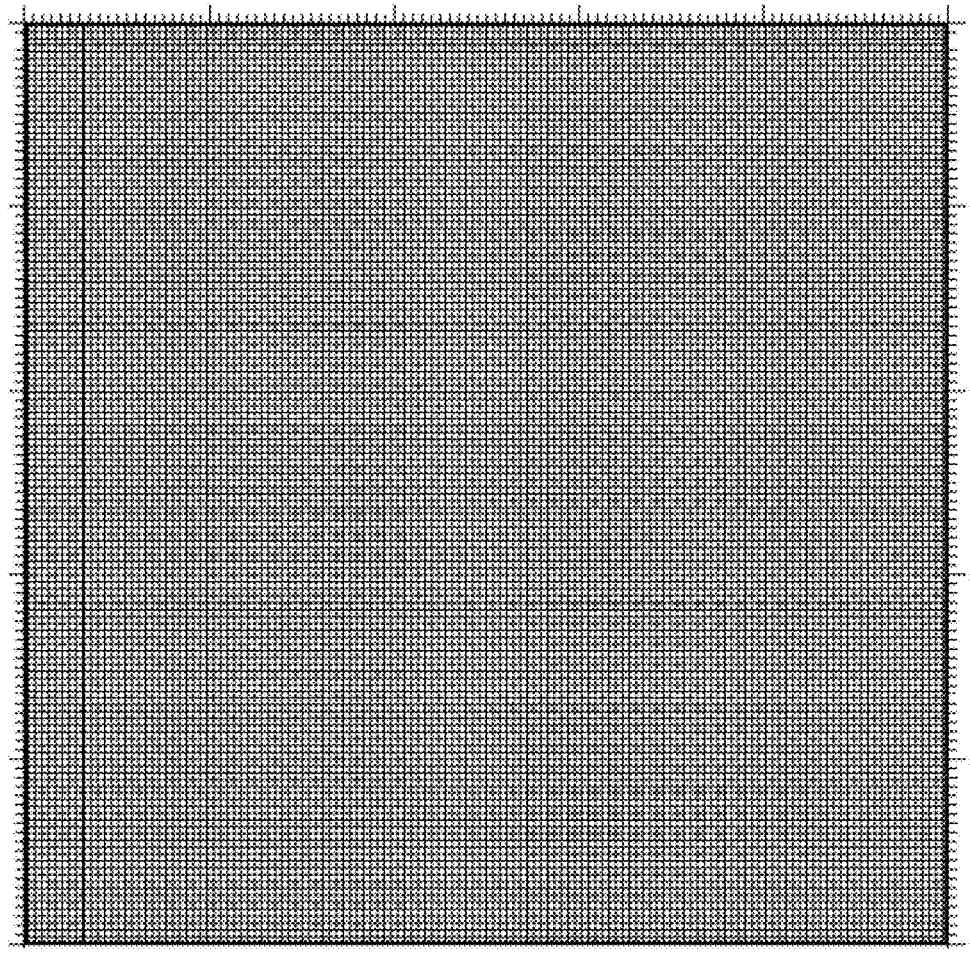
FIG. 18 illustrates a step of polysilicon deposition.
Figure 18:
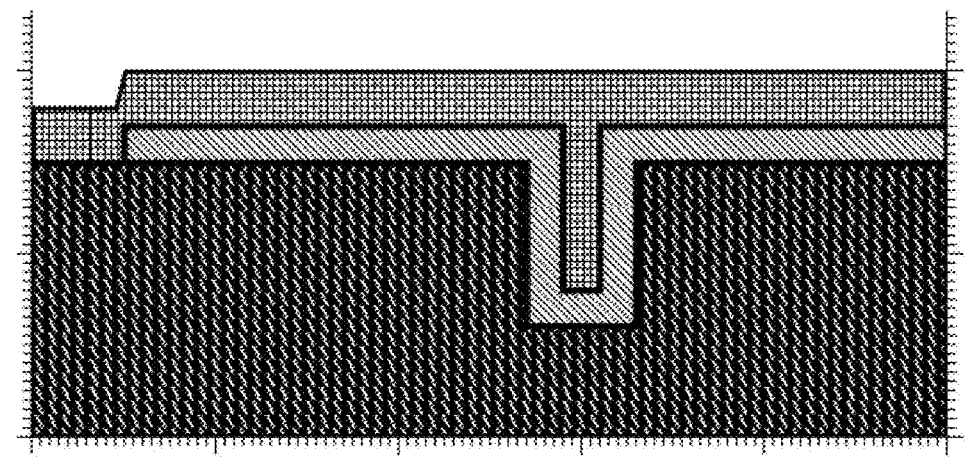
Figure 19:
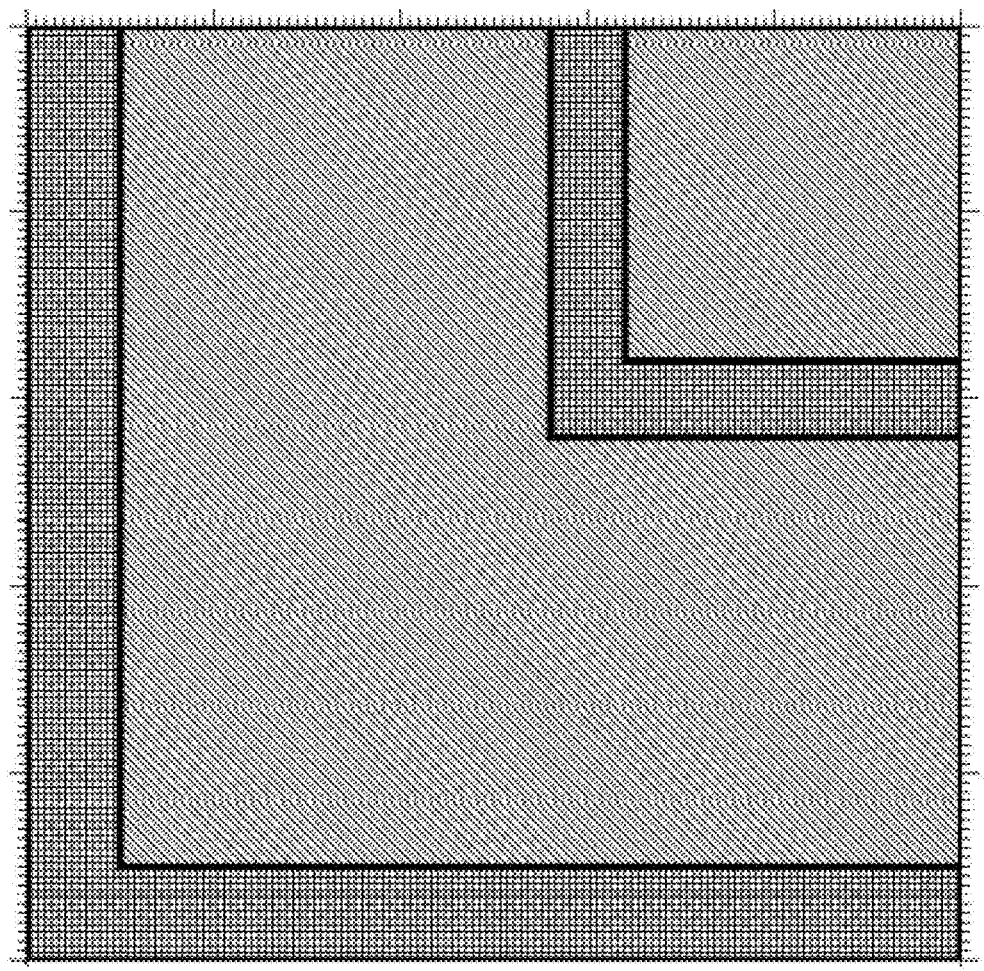
FIG. 19 illustrates a step of etching and patterning a polysilicon layer.
Figure 19:
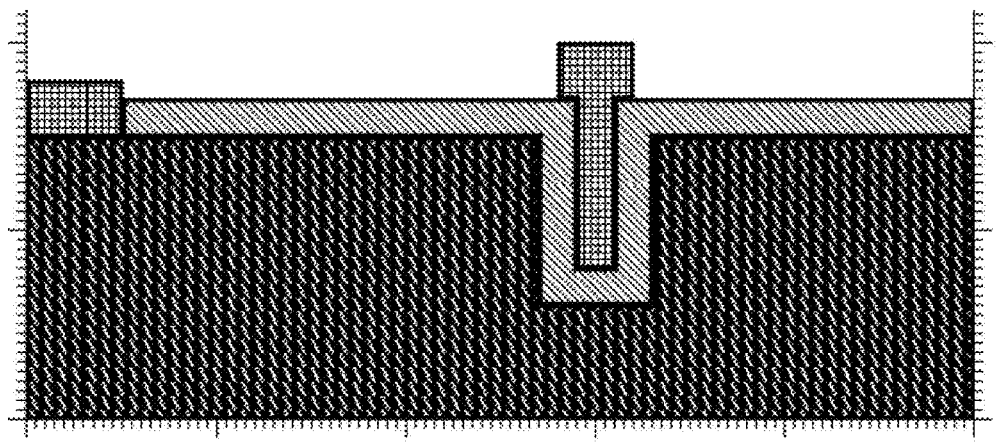
Figure 20:
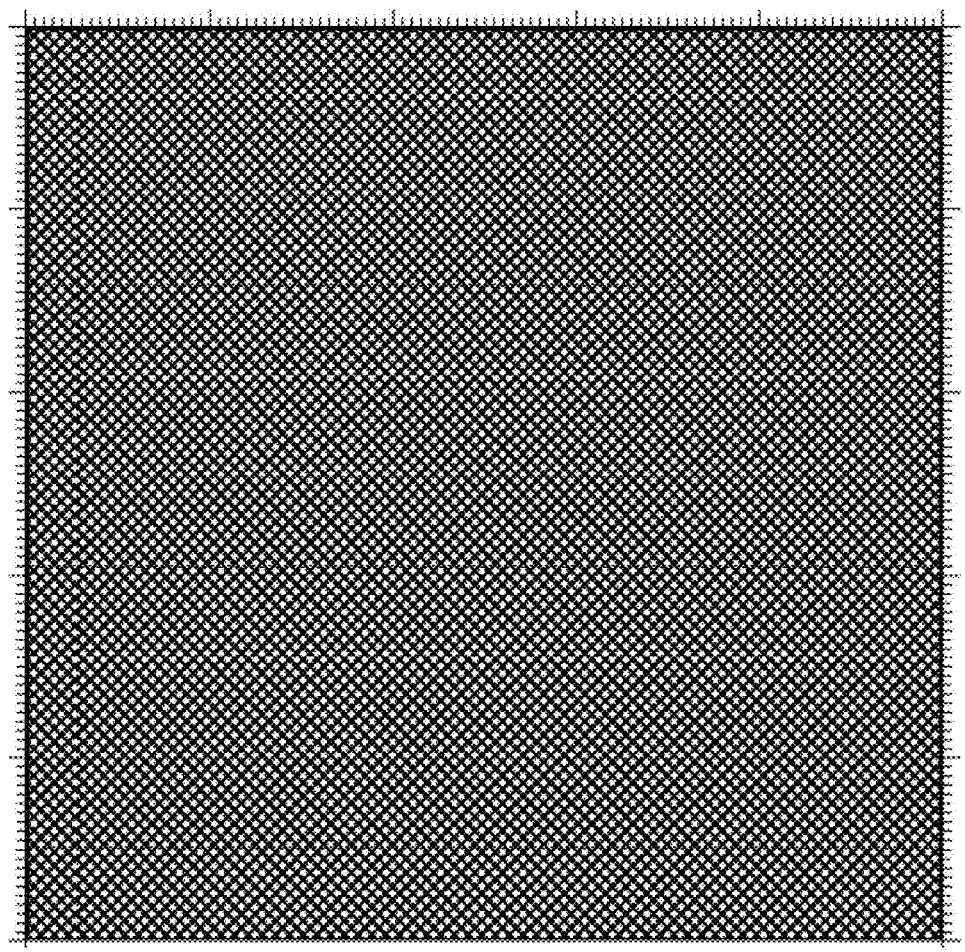
FIG. 20 illustrates a step of 3 μm PSG deposition.
Figure 20:
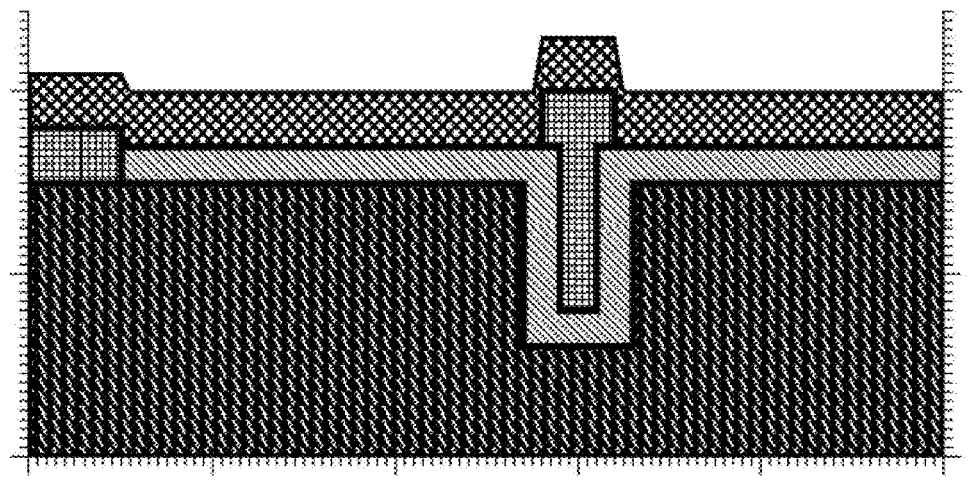
Figure 21:
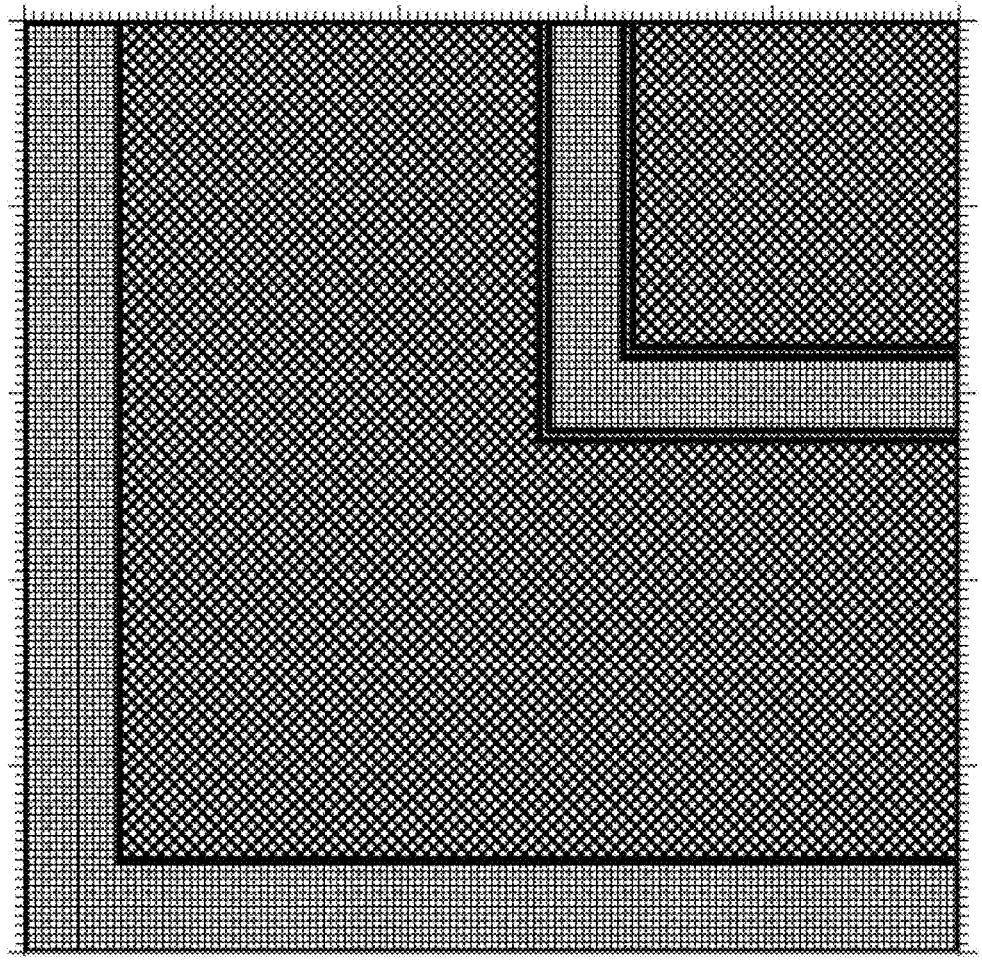
FIG. 21 illustrates a step of etching PSG, and patterning PSG.
Figure 21:
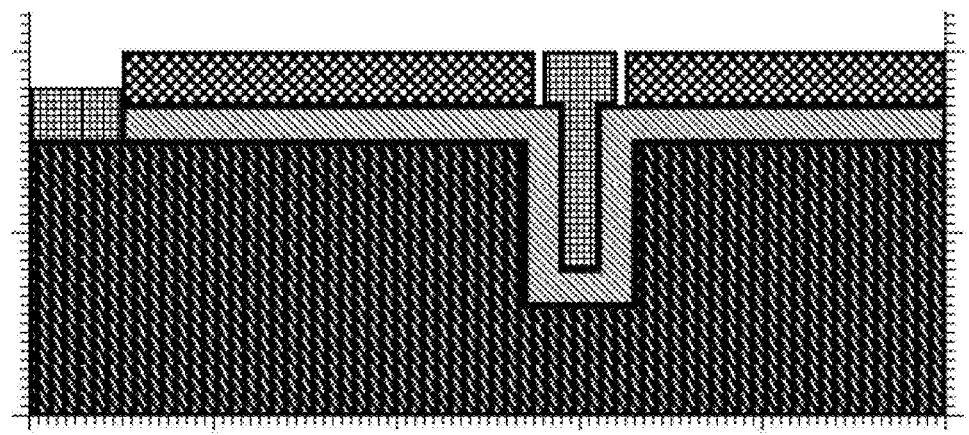
Figure 22:
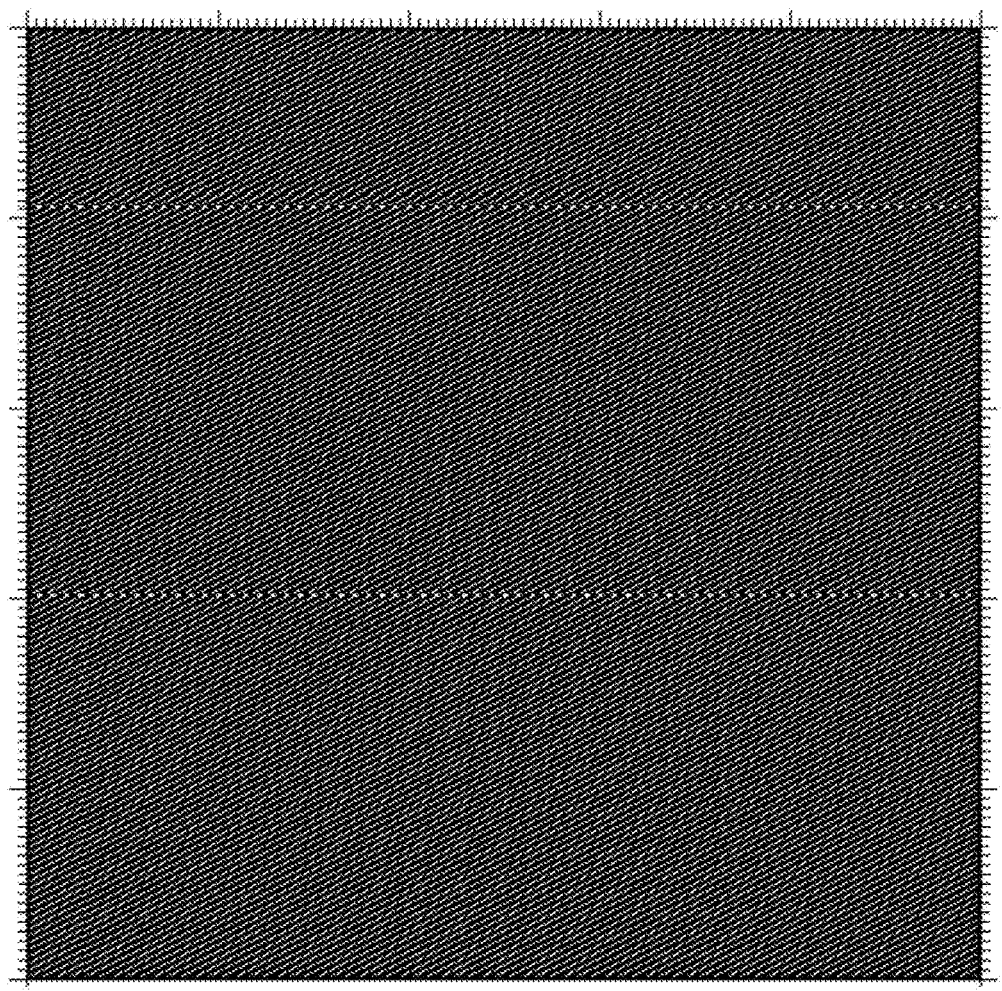
FIG. 22 illustrates a step of siliconnitride deposition.
Figure 22:
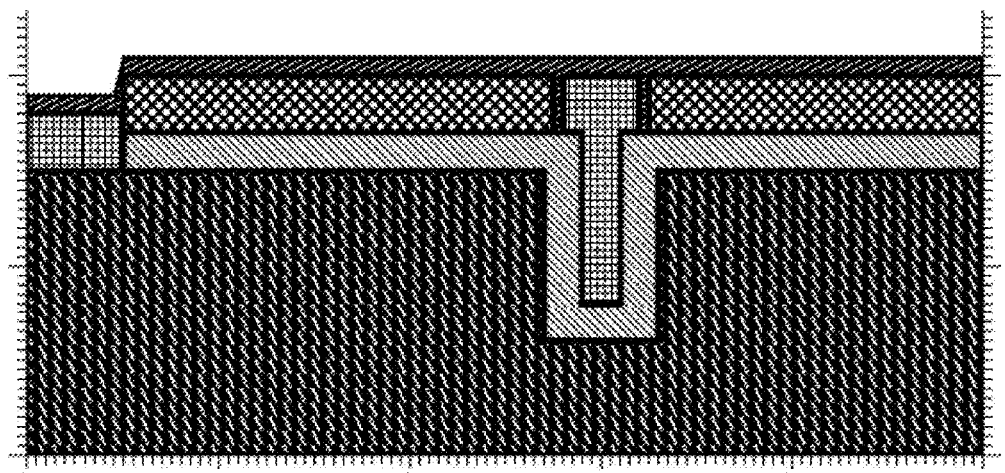
Figure 23:
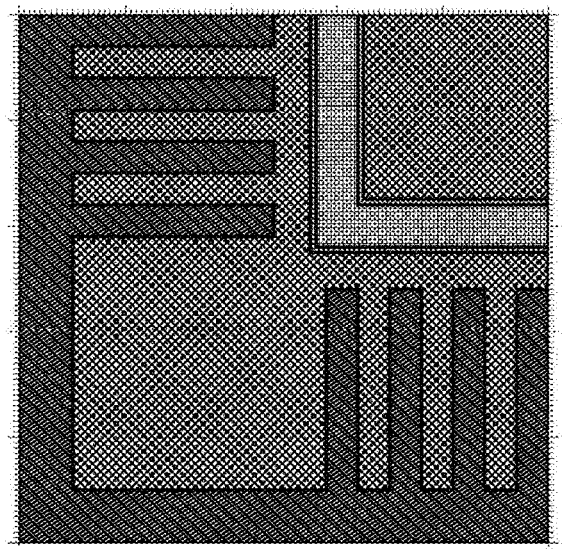
FIG. 23 illustrates a step of patterning the siliconnitride layer.
Figure 23:
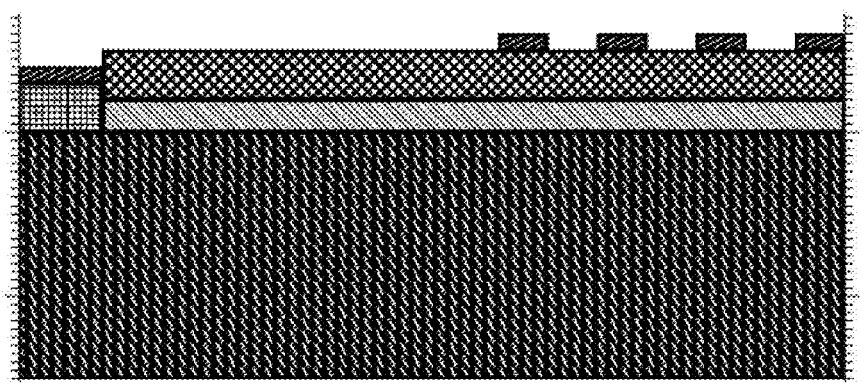
Figure 23:
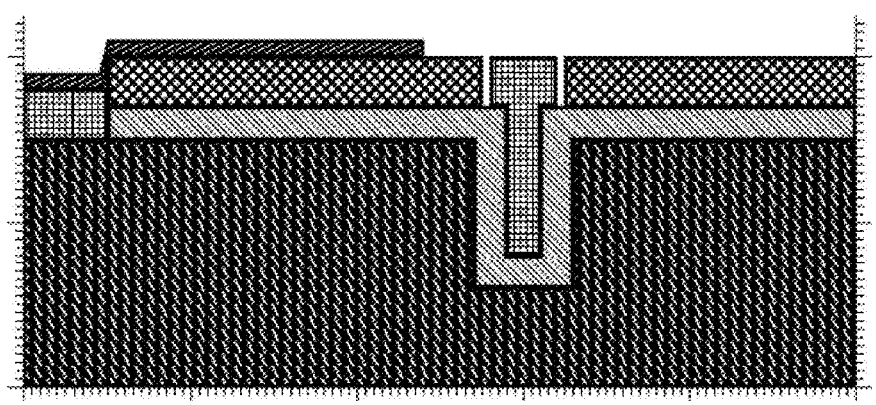
Figure 24:
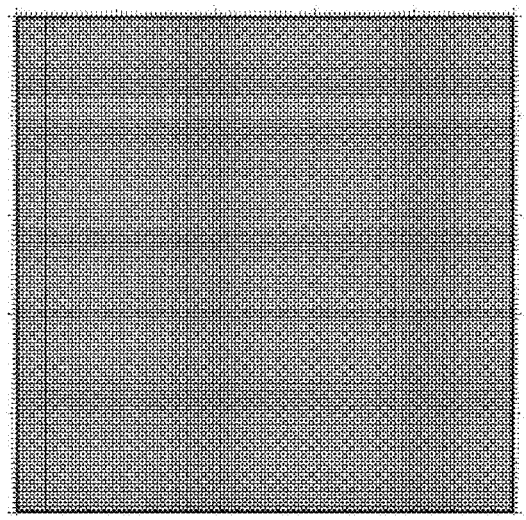
FIG. 24 illustrates a step of 3 μm polysilicon deposition.
Figure 24:
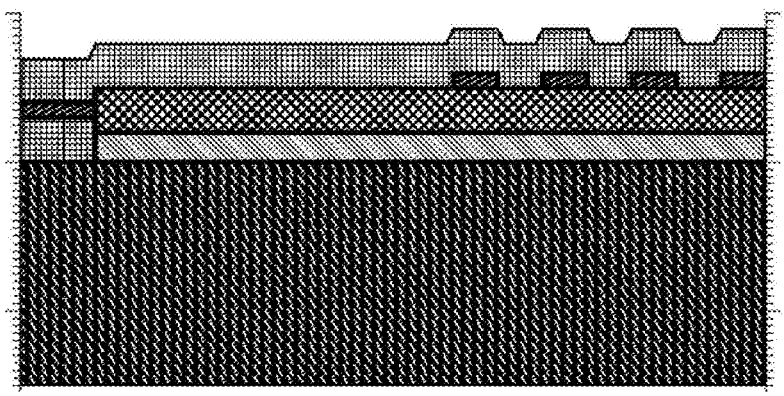
Figure 24:
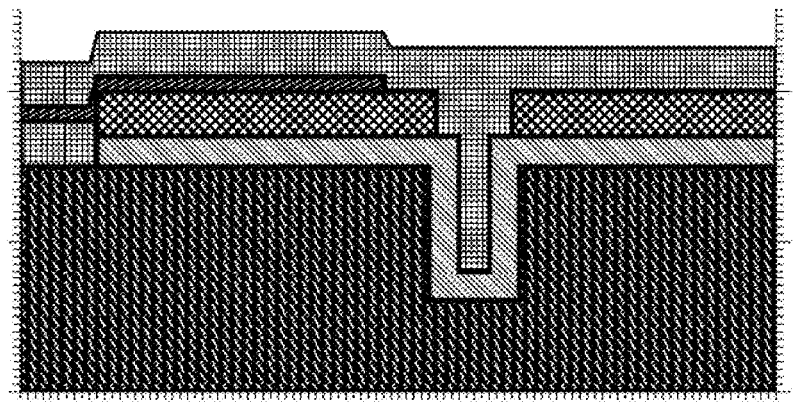
Figure 25:
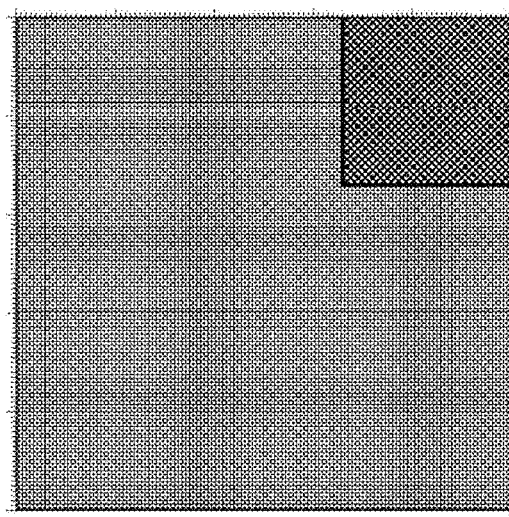
FIG. 25 illustrates a step of etching polysilicon, and patterning polysilicon.
Figure 25:
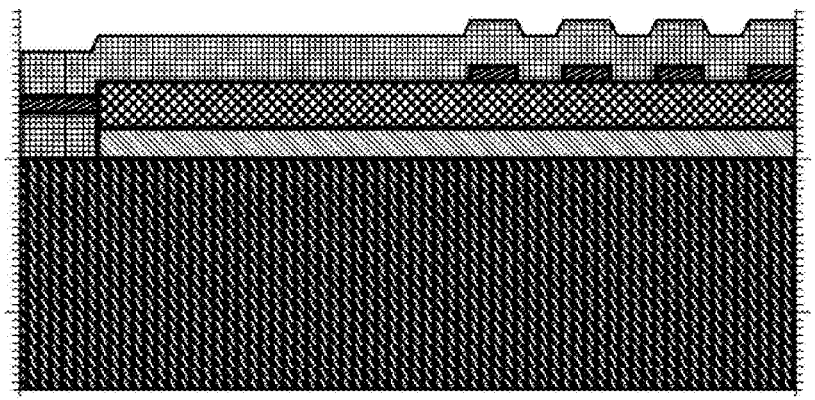
Figure 25:
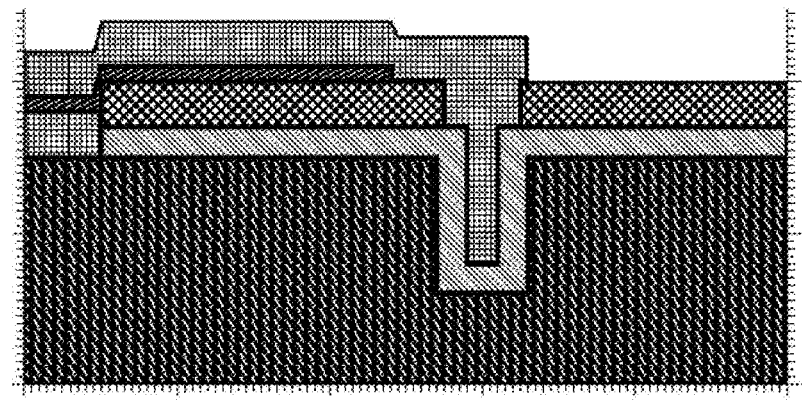
Figure 26:
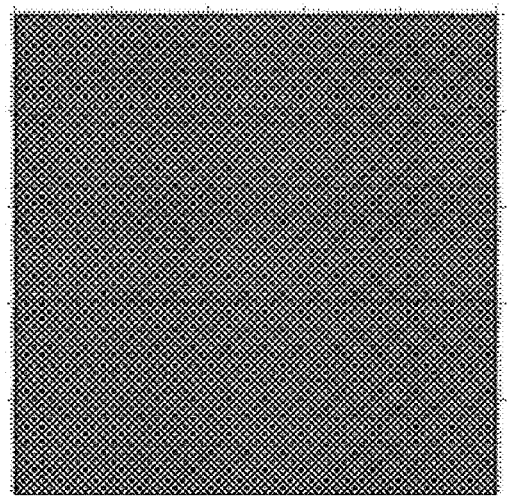
FIG. 26 illustrates a step of 3 μm PSG deposition.
Figure 26:
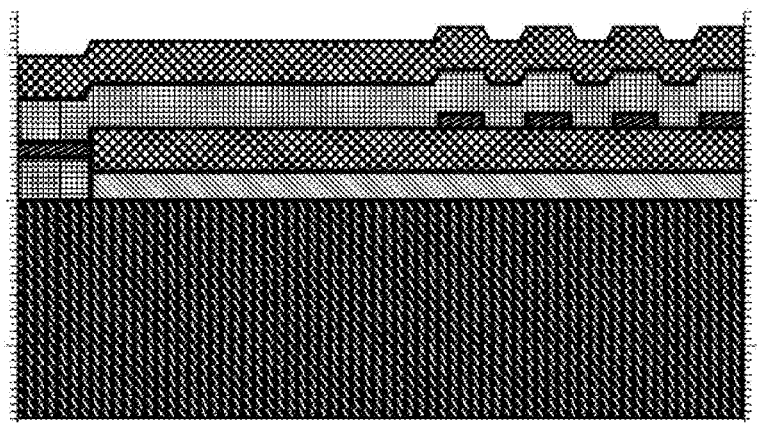
Figure 26:
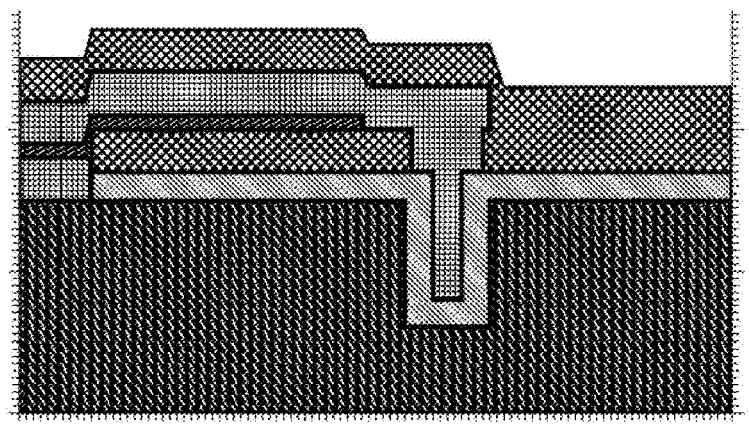
Figure 27:
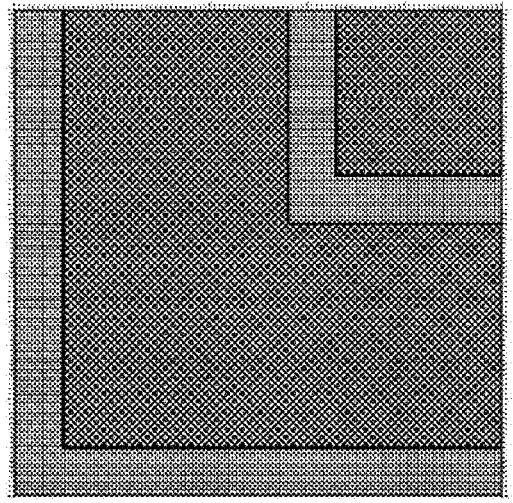
FIG. 27 illustrates a step of etching/patterning PSG.
Figure 27:
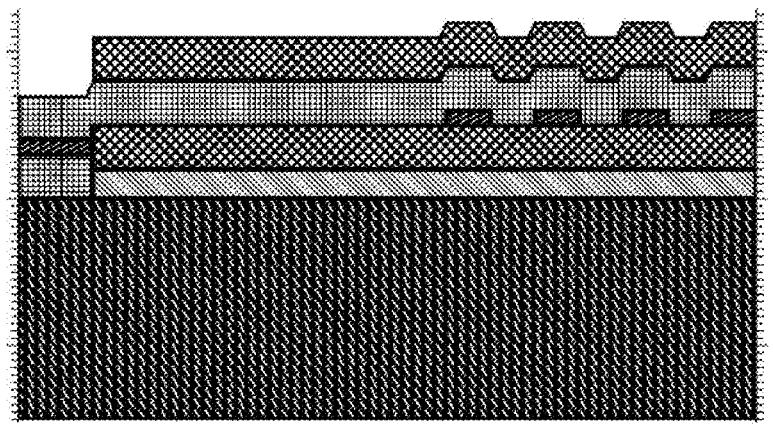
Figure 27:
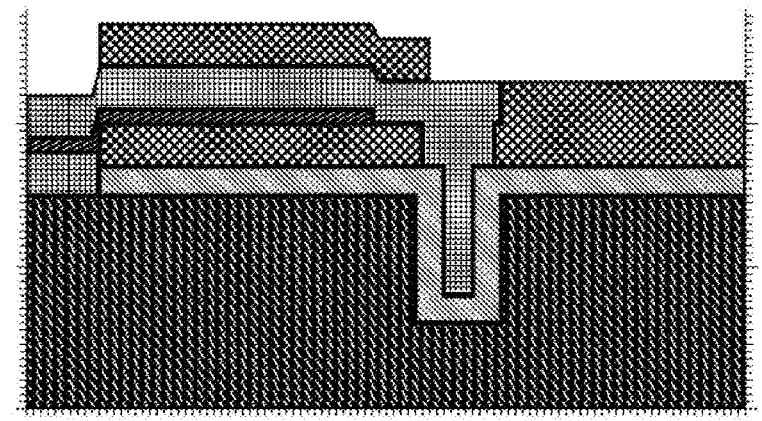
Figure 28:
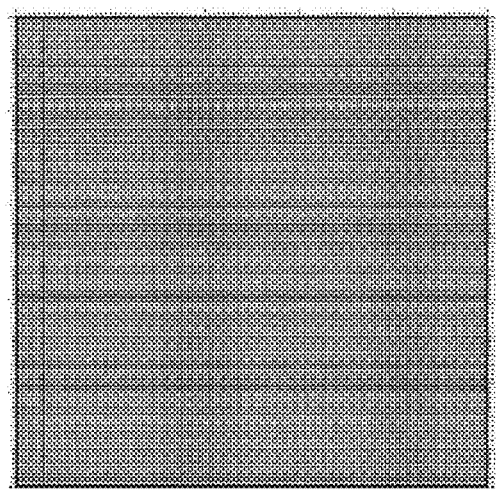
FIG. 28 illustrates a step of 1 μm polysilicon deposition as membrane material.
Figure 28:
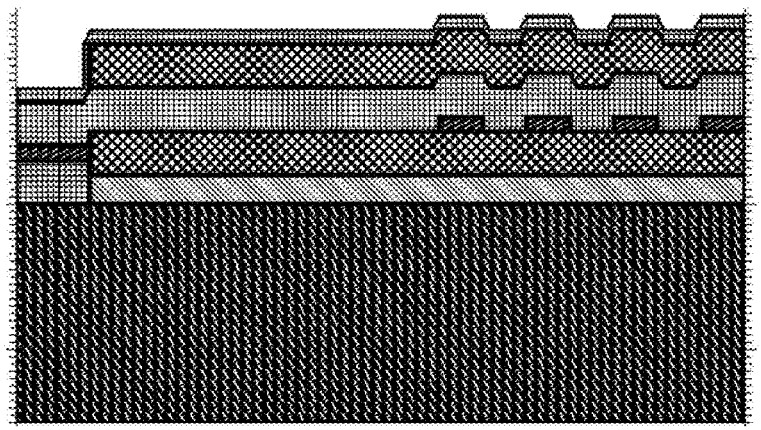
Figure 28:
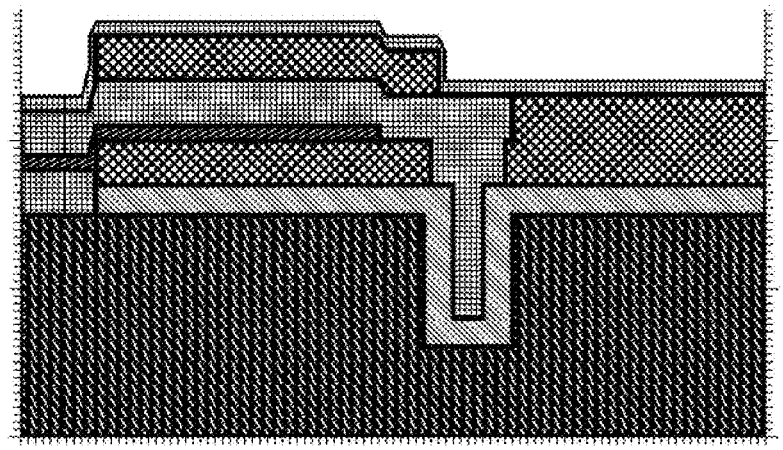

FIG. 14 shows step (A10)/(a10) of providing a working/reference substrate having a planar surface, for fabricating the quarter single die of the 4-die array as described above. As an embodiment of step (A15)/(a15), FIG. 15 illustrates the first step, deep reactive ion etching (DRIE) on the substrate, whereby a working/reference trench may be formed. FIG. 16 illustrates the step of (B10)/(b10), depositing at least one removable layer on the planar surface, e.g. thermal oxidation, in which thermal oxide of 2 μm thickness is deposited on the substrate. FIG. 17 illustrates the step of etching the thermal oxide in FIG. 16, i.e. patterning the thermal oxide layer. FIG. 18 illustrates the step of poly silicon deposition, in which a 3 μm, for example, polysilicon layer is deposited. A working/reference insert may be formed and extended in the trench. FIG. 19 illustrates the step of etching the polysilicon, i.e. patterning the polysilicon layer. FIG. 20 illustrates the step of sacrificial layer (such as 3 μm PSG) deposition. FIG. 21 illustrates the step of etching sacrificial layer e.g. PSG as described in FIG. 20, and patterning PSG to expose the working/reference insert for further processing. FIG. 22 illustrates the step of isolation layer e.g. 1 μm silicon nitride deposition, which will isolate functional structure from the substrate, and will help in defining comb fingers. FIG. 23 illustrates the step of patterning the isolation layer e.g. silicon nitride layer. FIG. 24 illustrates the step of polysilicon e.g. 3 μm deposition. FIG. 25 illustrates the step of etching polysilicon, and patterning polysilicon to leave a cavity for membrane support. FIG. 26 illustrates the step of sacrificial layer (such as 3 μm PSG) deposition in order to support membrane deposition. FIG. 27 illustrates the step of etching/patterning PSG, so as to leave area for membrane deposition and pads deposition, and keep the PSG above comb finger to protect comb finger structure. FIG. 28 illustrates the step of polysilicon deposition e.g. 1 μm as membrane material.

After the step of FIG. 28, the process can be split into three different routes A, B and C. Rout A is shown in FIGS. 29A, 30A, 31A, 32A, 33A1, 33A2, 34 A1, 34A2, 35 A1, 35A2, 36 A1 and 36A2. Rout B is shown in FIGS. 29B, 30B, 31B, 32B, 33B1, 33B2, 34 B1, 34B2, 35 B1, 35B2, 36 B1 and 36B2. Rout C is shown in FIGS. 29A, 30A, 31A, 32A, 33C1, 33C2, 34 C1, 34C2, 35 C1, 35C2, 36 C1 and 36C2.

Figure 29A:
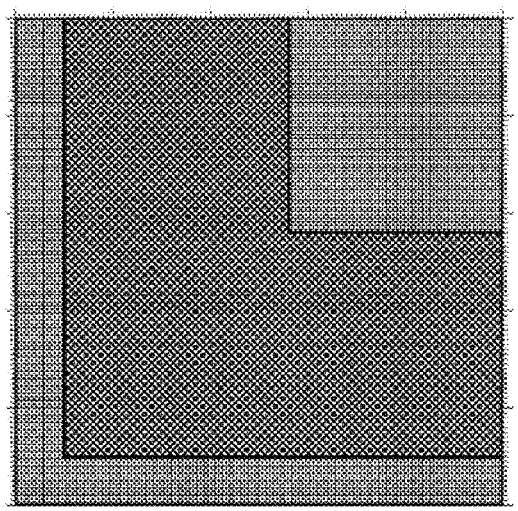
FIG. 29A illustrates a step of etching additional polysilicon without an opening (or membrane hole) formation.
Figure 29A:
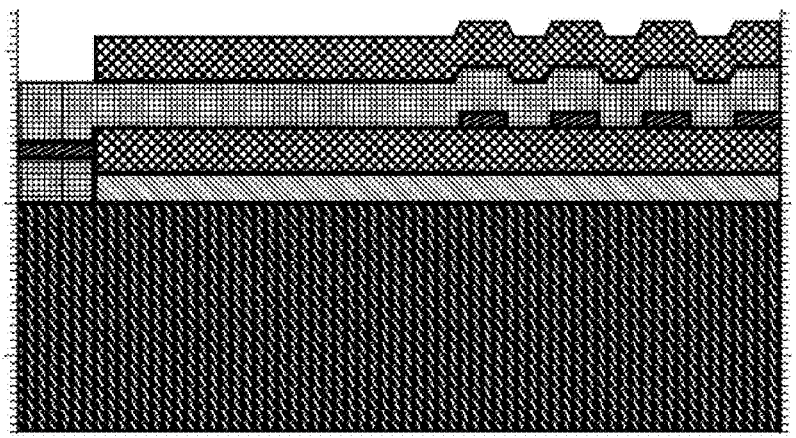
Figure 29A:
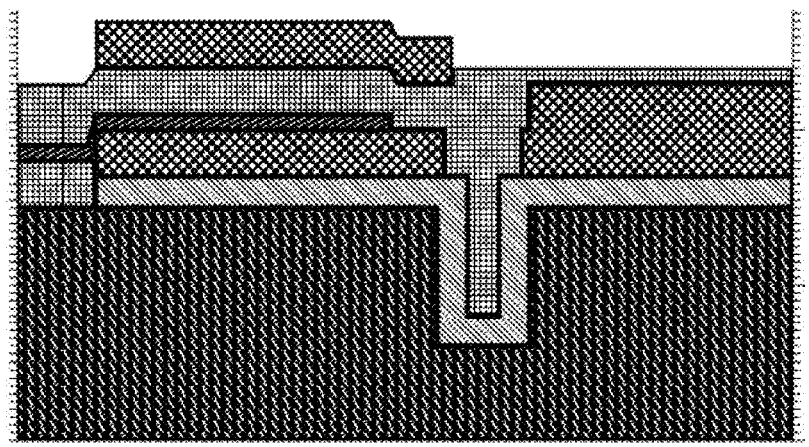
Figure 29B:
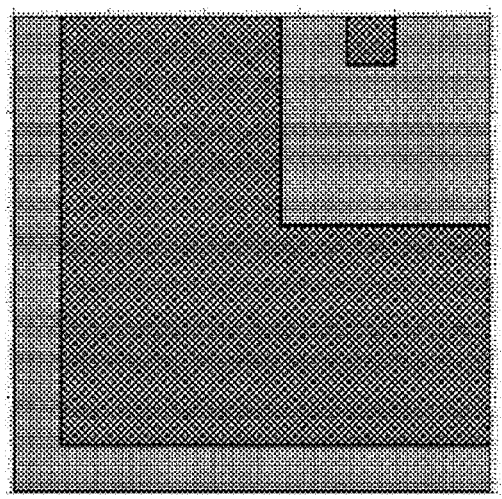
FIG. 29B illustrates a step of etching additional polysilicon with an opening formation.
Figure 29B:
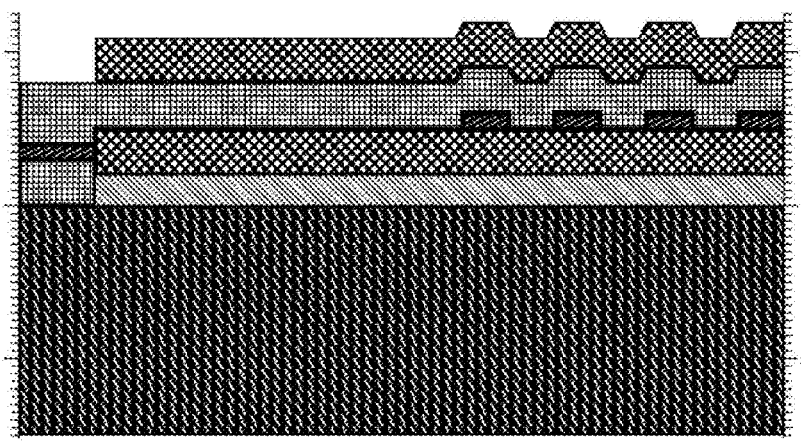
Figure 29B:
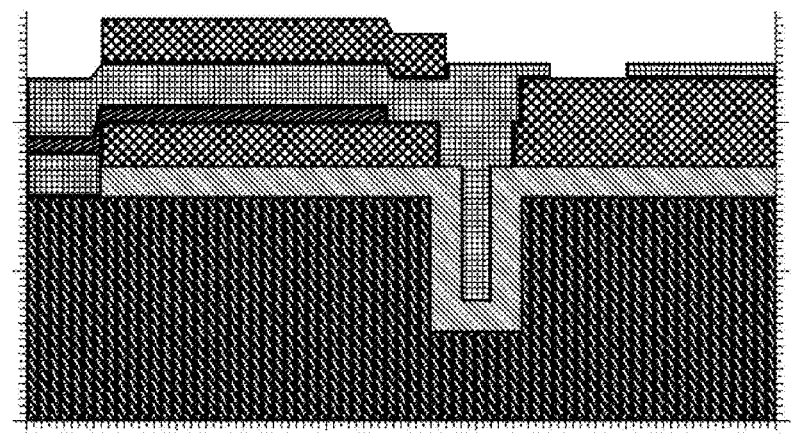
Figure 30A:
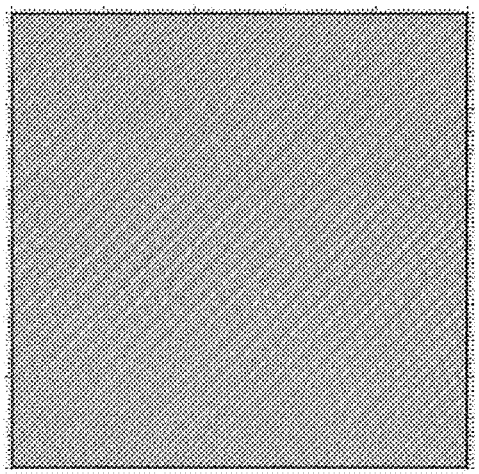
FIG. 30A illustrates a step of depositing metal for pad material.
Figure 30A:
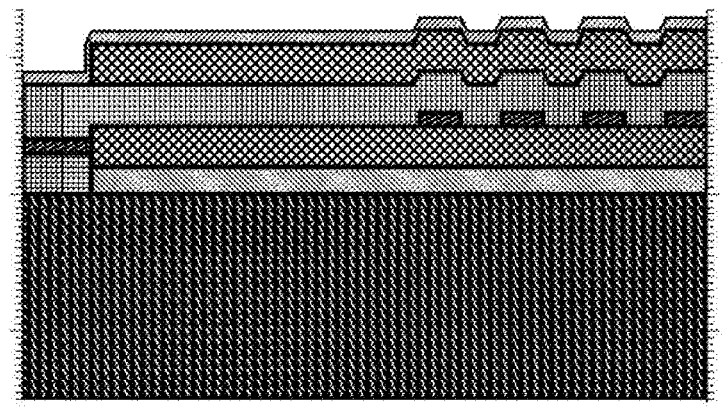
Figure 30A:
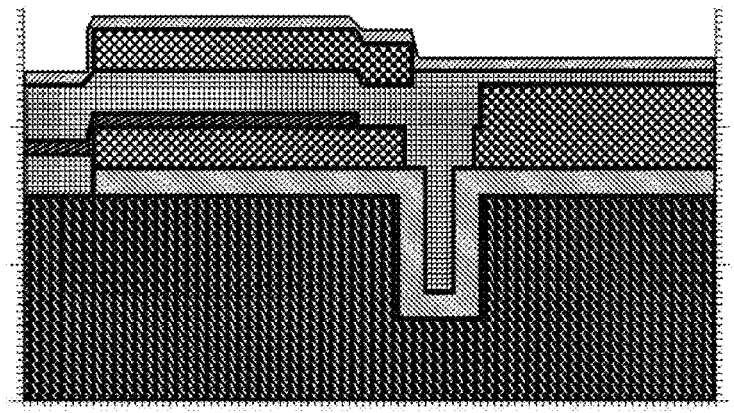
Figure 30B:
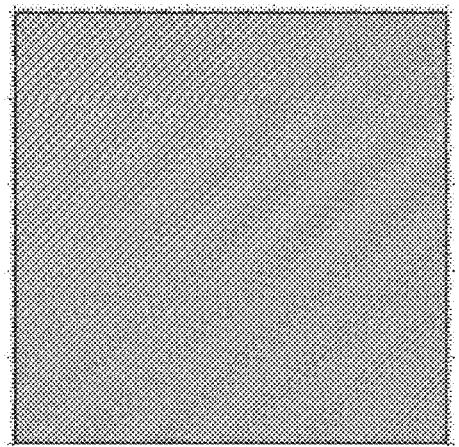
FIG. 30B illustrates a step of depositing metal for pad material.
Figure 30B:
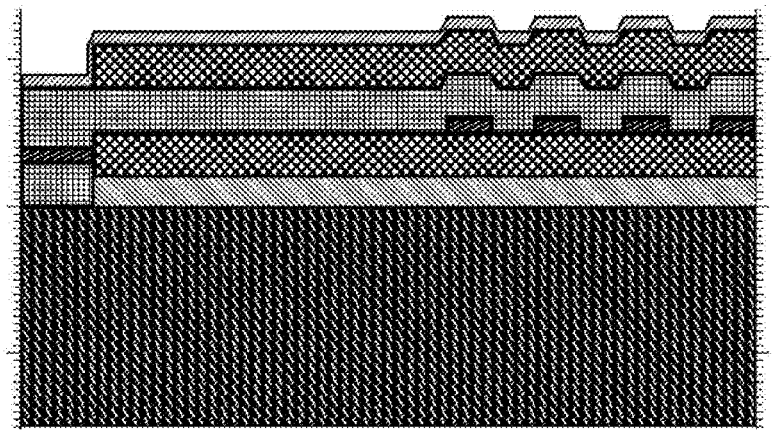
Figure 30B:
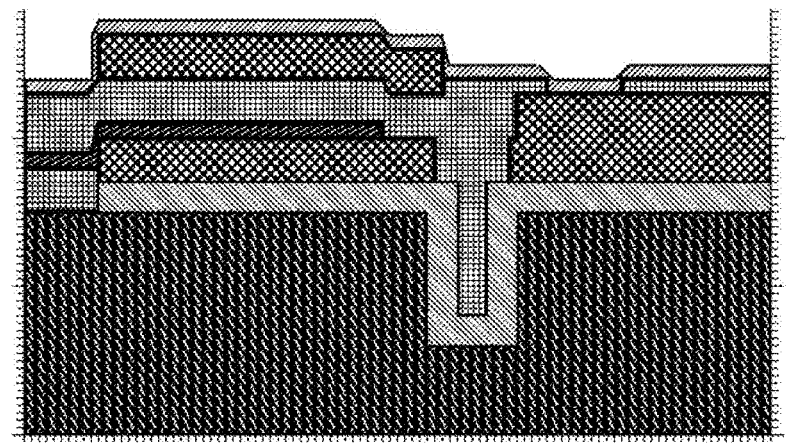
Figure 31A:
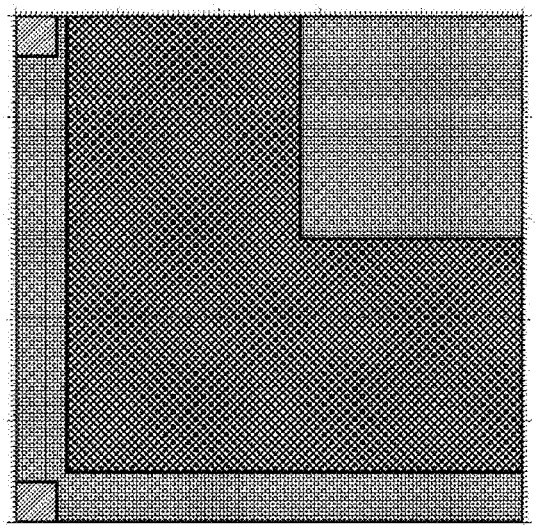
FIG. 31A illustrates a step of patterning pads.
Figure 31A:
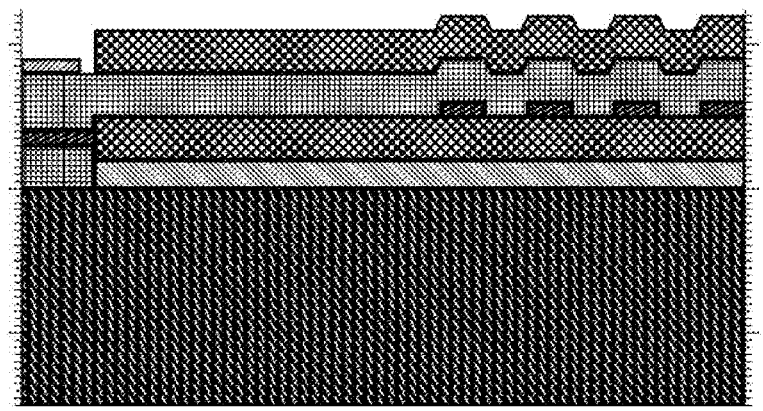
Figure 31A:
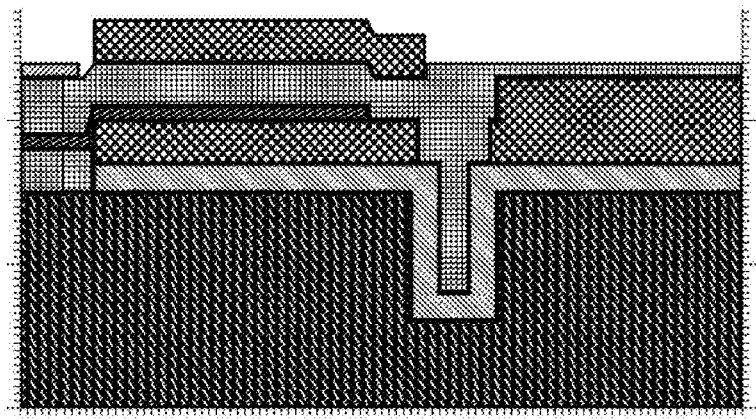
Figure 31B:
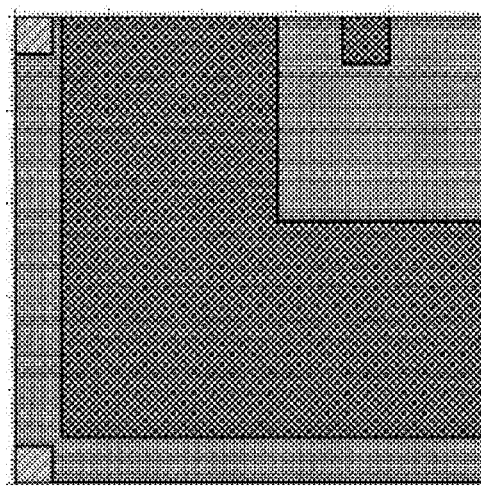
FIG. 31B illustrate a step of patterning pads.
Figure 31B:
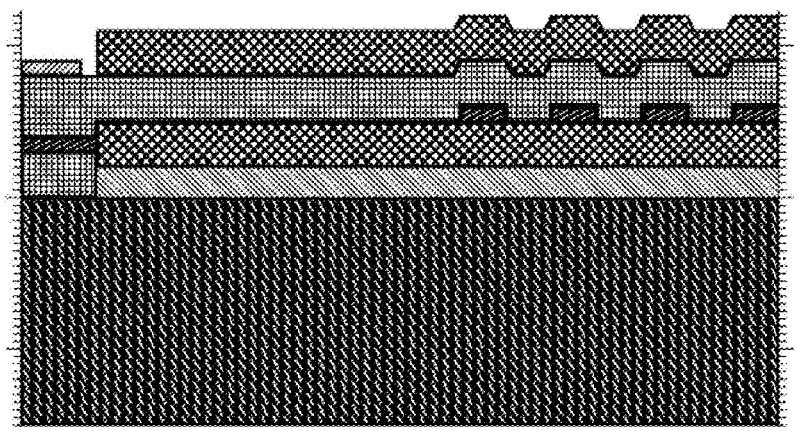
Figure 31B:
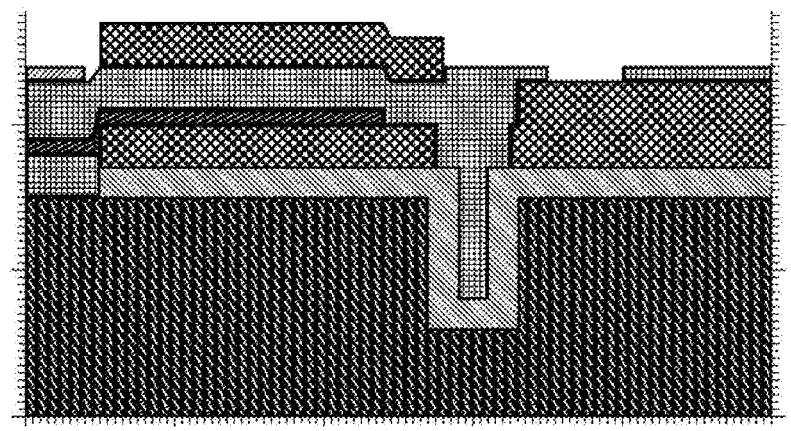
Figure 32A:
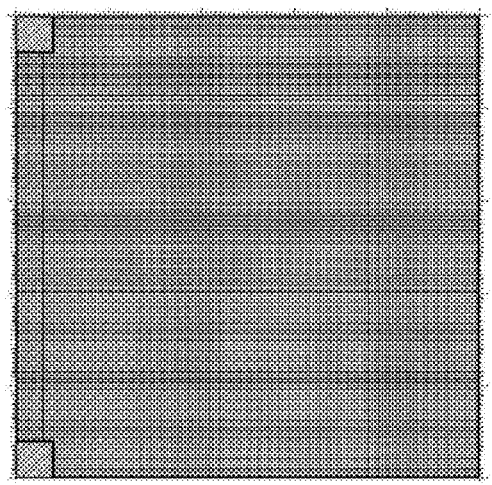
FIG. 32A illustrates a step of removing remaining PSG above polysilicon and preparing comb fingers fabrication.
Figure 32A:
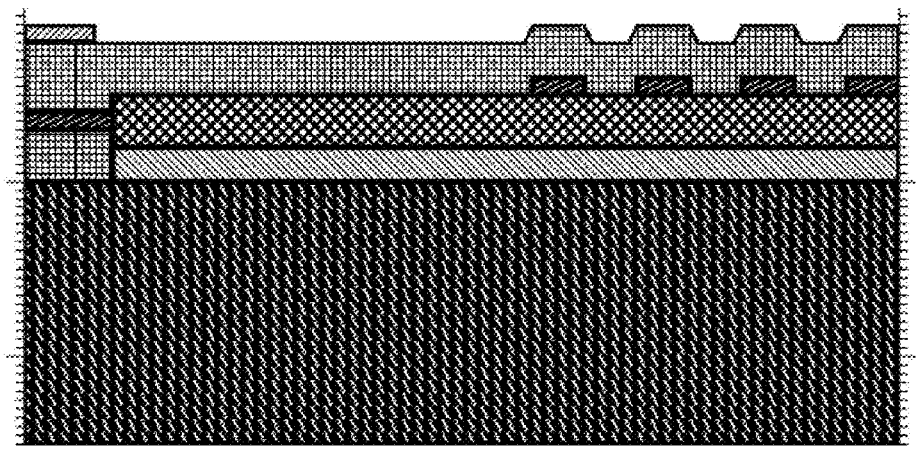
Figure 32A:
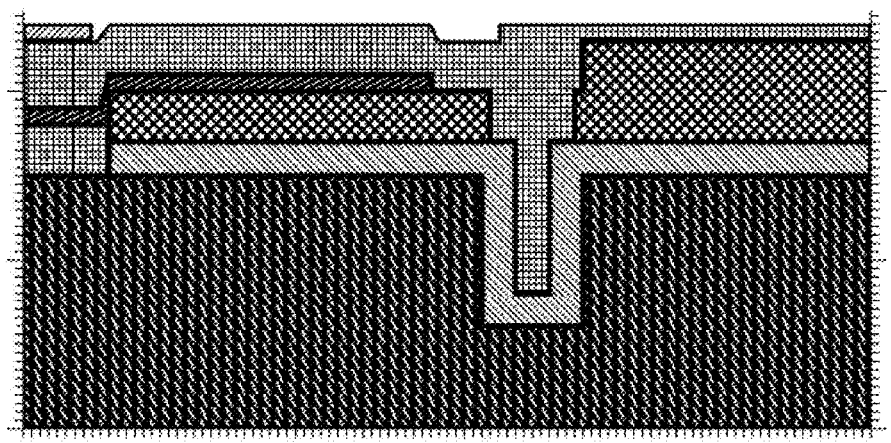
Figure 32B:
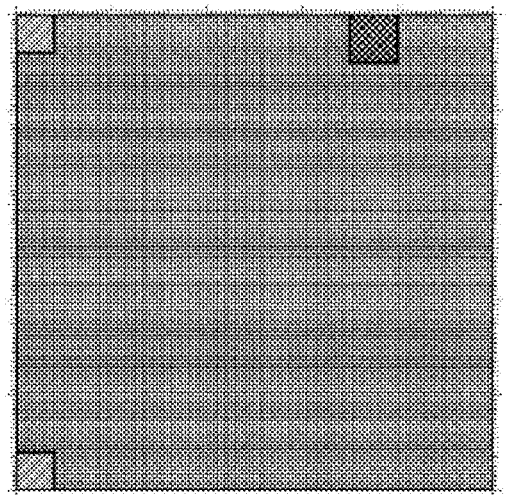
FIG. 32B illustrates a step of removing remaining PSG above polysilicon and preparing comb fingers fabrication.
Figure 32B:
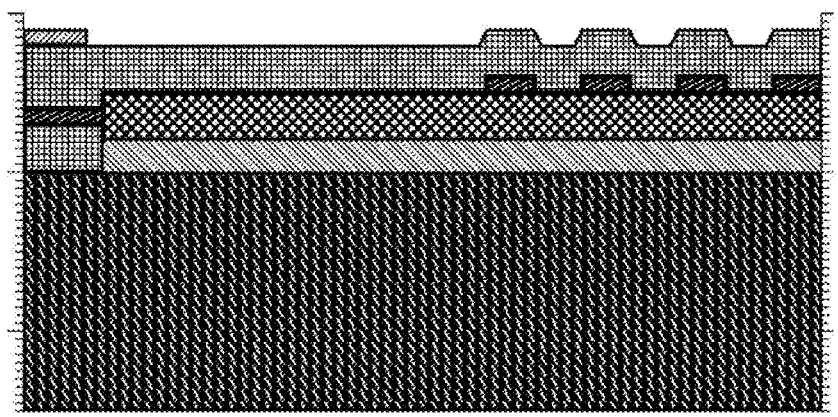
Figure 32B:
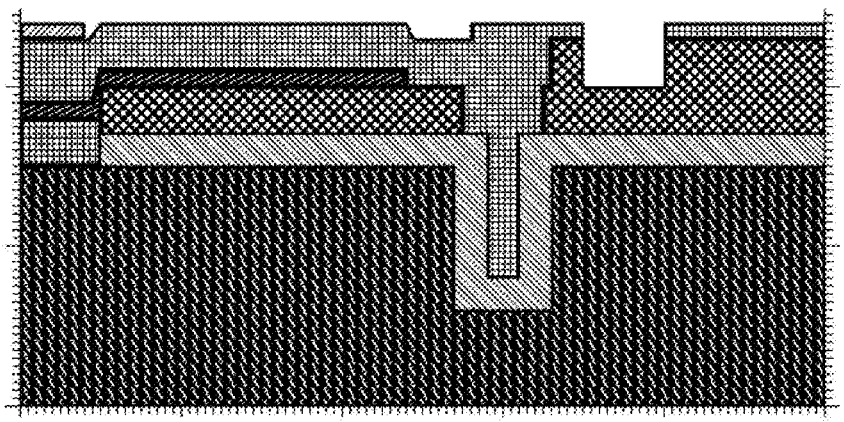

FIG. 29A illustrates the step of etching additional polysilicon without an opening (or membrane hole) formation. FIG. 29B illustrates the step of etching additional polysilicon with an opening formation. FIG. 30A and FIG. 30B illustrate the step of depositing metal for pad material, following FIGS. 29A and 29B respectively. FIG. 31A and FIG. 31B illustrate the steps of patterning pads, following FIGS. 30A and 30B respectively. FIG. 32A and FIG. 32B illustrate the steps of removing remaining sacrificial layer e.g. PSG above polysilicon and preparing comb fingers fabrication, following FIGS. 31A and 31B respectively.

FIG. 33A1/A2/B1/B2/C1/C2 illustrates the step of patterning/etching polysilicon (with no membrane hole for FIG. 33A1/A2, and with a membrane hole for FIG. 33B1/B2/C1/C2) to get comb fingers on different heights, i.e. with a vertical positional shift. FIG. 34A1/A2/B1/B2/C1/C2 illustrates the step of etching silicon nitride with a same mask (with no membrane hole for FIG. 34A1/A2, and with a membrane hole for FIG. 34B1/B2/C1/C2). Keep etching silicon nitride with self-alignment to cancel the effect of tolerance. FIG. 35A1/A2/B1/B2/C1/C2 illustrates the step of etching back hole or cavity using bulk fabrication (with no membrane hole for FIG. 35A1/A2, and with a membrane hole for FIG. 35B1/B2/C1/C2). FIG. 36A1/A2/B1/B2/C1/C2 illustrates the step of releasing: Use wet etching to remove all sacrificial materials or removable materials to release the microphone product (with no membrane hole for FIG. 36A1/A2, and with a membrane hole for FIG. 36B1/B2/C1/C2).

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A process of fabricating a capacitive microphone including a MEMS microphone comprising:
    (A10) providing a working substrate having a planar working surface, wherein a primary working direction is defined as a direction perpendicular to the planar working surface;
    (B10) depositing at least one removable layer on the planar working surface;
    (C10) depositing one electrically conductive working layer on said at least one removable layer;
    (D10) dividing or cutting the one electrically conductive working layer into two divided working layers, both of which remain in contact with said at least one removable layer and are parallel with the planar working surface; and
    (E10) etching away said at least one removable layer to form a working capacitive microphone;
    wherein steps (D10) dividing and (E10) etching are carried out so that, in the formed working capacitive microphone, a first electrical working conductor is fixed relative to the working substrate, and a second electrical working conductor comprises a working membrane perpendicular to said primary working direction that is movable relative to the working substrate;
    wherein step (D10) includes cutting a first set of working comb fingers in the first electrical working conductor, and cutting a second set of working comb fingers around a peripheral region of the movable working membrane, wherein the two sets of working comb fingers are interleaved into each other, and the second set of working comb fingers are laterally movable relative to the first set of working comb fingers;
    wherein step (C10) is depositing one electrically conductive working layer having an elevated working area, and step (D10) is dividing or cutting the electrically conductive working layer along an edge or a borderline of the elevated area to form two divided layers, so that each working comb finger has a same working width measured along the primary working direction, and the first set of working comb fingers and the second set of working comb fingers have a positional shift along the primary working direction.

2. The process according to claim 1, wherein a mutual capacitance exists between said two working conductors; wherein the first electrical working conductor has a first working projection along said primary working direction on the planar working surface, and the second electrical working conductor has a second working projection along said primary working direction on the planar working surface; and wherein the first working projection and the second working projection have a shortest working distance Dwmin therebetween, and Dwmin remains greater than zero regardless of that one or two of said two working conductors is (are) impacted by an acoustic pressure along said primary working direction or not.

3. The process according to claim 1, wherein the working substrate comprises silicon, the removable layer comprises PSG or thermal oxide such as oxides of Si, and said two working conductors independently of each other comprise polysilicon, silicon, gold, silver, nickel, aluminum, copper, chromium, titanium, tungsten, or platinum.

4. The process according to claim 1 wherein step (D10) dividing is carried out so that the movable working membrane is attached to the substrate via three or more working suspensions including four working suspensions.

5. The process according to claim 4, wherein step (D10) is dividing carried out so that each of the working suspensions comprises folded and symmetrical working cantilevers.

6. The process according to claim 1, wherein step (D10) cutting is carried out so that the first set of working comb fingers and the second set of working comb fingers have identical shape and dimension.

7. The process according to claim 1, wherein the positional shift along the primary working direction is one third of said width.

8. The process according to claim 1, wherein step (D10) comprises cutting the movable working membrane in square shape.

9. The process according to claim 1, wherein step (D10) comprises cutting two or more movable working membranes including four identical movable working membranes arranged in a 2×2 array configuration above the substrate.

10. The process according to claim 1, further comprising a step of (A15) etching the planar working surface of the substrate to form a working trench, wherein step (C10) depositing comprises forming a working insert that is protruded from the working membrane downward into the working trench; wherein the working insert and the working trench function as a working air flow restrictor that restricts the flow rate of air flowing in/out of the gap between the working membrane and the substrate in the microphone.

11. The process according to claim 1, further comprising forming a motional sensor having zero or a minimal response to an acoustic pressure impacting the capacitive microphone.

12. The process according to claim 11, wherein steps (D10) dividing and (E10) etching are carried out so that, in the formed working capacitive microphone, the first electrical working conductor is fixed relative to the working substrate, and the second electrical working conductor comprises a working membrane perpendicular to said primary working direction that is movable relative to the working substrate, further comprising:
   (a10) providing a reference substrate having a planar reference surface, wherein a primary reference direction is defined as a direction perpendicular to the planar reference surface;
   (b10) depositing at least one removable layer on the planar reference surface;
   (c10) depositing one electrically conductive reference layer on said at least one removable layer;
   (d10) dividing the electrically conductive reference layer into two divided reference layers, both of which remain in contact with said at least one removable layer and are parallel with the planar reference surface; and
   (e10) etching away said at least one removable layer to form a motional sensor;
   wherein steps (d10) dividing and (e10) etching are carried out so that, in the formed motional sensor, the first electrical reference conductor is fixed relative to the reference substrate, and the second electrical reference conductor comprises a reference membrane perpendicular to said primary reference direction that is movable relative to the reference substrate; and wherein one or more openings are cut on the reference membrane for air ventilation.

13. The process according to claim 12, wherein
step (A10) and Step (a10) are combined as providing a common substrate for both the working capacitive microphone and the motional sensor;
step (B10) and Step (b10) are combined as depositing at least one common removable layer for both the working capacitive microphone and the motional sensor;
step (C10) and Step (c10) are combined as depositing a common electrically conductive layer on said at least one common removable layer for both the working capacitive microphone and the motional sensor;
step (D10) and Step (d10) are combined as dividing the common electrically conductive layer into said first electrical working conductor, said second electrical working conductor, said first electrical reference conductor, and said second electrical reference conductor; and
step (E10) and Step (e10) are combined as etching away said at least one common removable layer for both the working capacitive microphone and the motional sensor.

14. The process according to claim 13, wherein steps (D10) and (d10) as combined comprise cutting m working membrane(s) on said second electrical working conductor, and cutting n reference membrane(s) on said second electrical reference conductor, wherein m≥1, n≥1.

15. The process according to claim 14, wherein the motional sensor has a structure identical to the working capacitive microphone, except that one or more openings are cut on the reference membrane for air ventilation.

16. The process according to claim 15, wherein m=n=2, and the two working membranes and the two reference membranes are arranged in a 2×2 array configuration above the common substrate.

17. The process according to claim 12, further comprising electrically connecting the first electrical working conductor and the first electrical reference conductor to form a common ground.

* * * * *